(12) United States Patent
Miura

(10) Patent No.: US 8,904,140 B2
(45) Date of Patent: Dec. 2, 2014

(54) SEMICONDUCTOR DEVICE

(75) Inventor: Seiji Miura, Hachioji (JP)

(73) Assignee: Hitachi, Ltd., Tokyo (JP)

( * ) Notice: Subject to any disclaimer, the term of this patent is extended or adjusted under 35 U.S.C. 154(b) by 599 days.

(21) Appl. No.: 13/321,333

(22) PCT Filed: May 22, 2009

(86) PCT No.: PCT/JP2009/059458
§ 371 (c)(1),
(2), (4) Date: Nov. 18, 2011

(87) PCT Pub. No.: WO2010/134201
PCT Pub. Date: Nov. 25, 2010

(65) Prior Publication Data
US 2012/0066432 A1   Mar. 15, 2012

(51) Int. Cl.
*G06F 13/00*   (2006.01)
*G11C 7/00*   (2006.01)
*G06F 13/16*   (2006.01)
*G11C 7/22*   (2006.01)

(52) U.S. Cl.
CPC ............... *G06F 13/161* (2013.01); *G11C 7/22* (2013.01)
USPC ........................................................ 711/167

(58) Field of Classification Search
None
See application file for complete search history.

(56) References Cited

U.S. PATENT DOCUMENTS

| | | | |
|---|---|---|---|
| 6,453,370 | B1 | 9/2002 | Stracovsky et al. |
| 2005/0144409 | A1 | 6/2005 | Nodomi et al. |
| 2006/0179193 | A1 | 8/2006 | Miura |
| 2007/0005877 | A1 | 1/2007 | Tetrick |
| 2007/0271409 | A1 | 11/2007 | Miura et al. |
| 2008/0115137 | A1 | 5/2008 | Gower et al. |
| 2010/0131724 | A1 | 5/2010 | Miura et al. |

FOREIGN PATENT DOCUMENTS

| | | |
|---|---|---|
| JP | 2002-530731 A | 9/2002 |
| JP | 2006-163711 A | 6/2006 |
| JP | 2007-310430 A | 11/2007 |
| JP | 2008-276351 A | 11/2008 |
| JP | 2008-544424 A | 12/2008 |
| WO | WO 2004/025478 A1 | 3/2004 |

OTHER PUBLICATIONS

International Search Report dated Nov. 24, 2009 with English translation.

*Primary Examiner* — Matthew Bradley
*Assistant Examiner* — Craig Goldschmidt
(74) *Attorney, Agent, or Firm* — Crowell & Moring LLP

(57) ABSTRACT

Provided is a user-friendly information processing system which is capable of maintaining latency within a fixed range and ensuring the expandability of a memory capacity at high speed and low cost. The information processing system, including an information processing device, a volatile memory, and nonvolatile memories, is configured. The information processing device, the volatile memory, and the nonvolatile memories are connected in series with one another to reduce the number of connection signals, thereby realizing speeding-up while maintaining the expandability of the memory capacity. The information processing device manages response time zones and time zones where responses overlap one another, and performs a correction operation on the latency, thereby realizing fast data transfer while maintaining the latency within the fixed range. The information processing device performs an error correction to improve the reliability when transferring the data of the nonvolatile memories to the volatile memory. The information processing system composed of a plurality of chips is configured as an information processing system/module in which the respective chips are arranged in layers, and wired together by a through via.

15 Claims, 45 Drawing Sheets

FIG. 10

CNNTREG

| Item<br>CNCT NO | VALID | ID | BOOT DEV | END FLAG |
|---|---|---|---|---|
| 0 | 1 | 0 | 0 | 0 |
| 1 | 1 | 1 | 0 | 0 |
| 2 | 1 | 2 | 1 | 0 |
| 3 | 1 | 3 | 0 | 1 |
| 4 | 0 | 0 | 0 | 0 |
| 5 | 0 | 0 | 0 | 0 |
| 6 | 0 | 0 | 0 | 0 |
| 7 | 0 | 0 | 0 | 0 |
| 8 | 0 | 0 | 0 | 0 |

FIG. 11

LCREG

| LCFLG | DOVLP |
|---|---|
| 1 | 4 |

FIG. 12

LTDREG

| Item<br>ID | VALID | MFLAG | LAT DMN |
|---|---|---|---|
| 0 | 1 | 1 | 0 |
| 1 | 1 | 0 | 0 |
| 2 | 1 | 0 | 0 |
| 3 | 1 | 0 | 0 |
| 4 | 0 | 0 | 0 |
| 5 | 0 | 0 | 0 |
| 6 | 0 | 0 | 0 |
| 7 | 0 | 0 | 0 |
| 8 | 0 | 0 | 0 |

FIG. 13

| LTREG | | | | |
|---|---|---|---|---|
| Item \ ID | Valid | LatQue | LatBank | LatTimeOut |
| 0 | 1 | 0 | 0 | 0 |
| 1 | 1 | 8 | 12 | 60 |
| 2 | 1 | 20 | 24 | 100 |
| 3 | 1 | 32 | 36 | 140 |
| 4 | 0 | 0 | 0 | 0 |
| 5 | 0 | 0 | 0 | 0 |
| 6 | 0 | 0 | 0 | 0 |
| 7 | 0 | 0 | 0 | 0 |
| 8 | 0 | 0 | 0 | 0 |

FIG. 14

M0TREG

| TIMING / Item | Valid | CYCLES |
|---|---|---|
| tm0RCD | 1 | 8 |
| tm0RC | 1 | 30 |
| tm0RRD | 1 | 4 |
| tm0RAS | 1 | 22 |
| tm0RP | 1 | 8 |
| tm0RFC | 1 | 60 |

FIG. 15

M1TREG

| TIMING / Item | Valid | CYCLES |
|---|---|---|
| tm1RCD | 1 | 8 |
| tm1RC | 1 | 60 |
| tm1RRD | 1 | 8 |
| tm1RAS | 1 | 44 |
| tm1RP | 1 | 16 |

FIG. 16

M2TREG

| TIMING / Item | Valid | CYCLES |
|---|---|---|
| tm2RCD | 1 | 10000 |
| tm2RC | 1 | 10062 |
| tm2RRD | 1 | 16 |
| tm2RAS | 1 | 10046 |
| tm2RP | 1 | 32 |

FIG. 17

OMDREG

| ID / Item | Valid | OPMODE |
|---|---|---|
| 0 | 1 | 3 |
| 1 | 1 | 3 |
| 2 | 1 | 3 |
| 3 | 1 | 3 |
| 4 | 0 | 0 |
| 5 | 0 | 0 |
| 6 | 0 | 0 |
| 7 | 0 | 0 |
| 8 | 0 | 0 |

| CHANNEL HIT/MISS | CHANNEL HIT | CHANNEL MISS (Clean) | | | |
|---|---|---|---|---|---|
| BANK HIT/MISS | Don't Care | PAGE HIT | | PAGE MISS (Clean) | |
| BANK STATE | Don't Care | OPEN | CLOSE | OPEN | CLOSE |
| CMD FLOW | RD1 | RD2 | AC ↓ RD2 | PRE ↓ AC ↓ RD2 | AC ↓ RD2 |

(B)

| CHANNEL HIT/MISS | CHANNEL HIT | CHANNEL MISS (Clean) | | | |
|---|---|---|---|---|---|
| BANK HIT/MISS | Don't Care | PAGE HIT | | PAGE MISS (Clean) | |
| BANK STATE | Don't Care | OPEN | CLOSE | OPEN | CLOSE |
| CMD FLOW | WT1 | WT2 | AC ↓ WT2 | PRE ↓ AC ↓ WT2 | AC ↓ WT2 |

(A)

(B)

(C)

SEMICONDUCTOR DEVICE

TECHNICAL FIELD

The present invention relates to semiconductor device technology and relates in particular to technology effective in information processing systems including nonvolatile memories and information processing devices, and also in control methods for memory modules.

BACKGROUND ART

In recent years, information processing systems with the information processing device and a plurality of memories coupled in series have been proposed to cope with ever higher data transfer speeds at higher operating frequencies, as well as to reduce the number of signals between the information processing device and the memory as shown in patent document 1. More specifically, each of the memories contains a request queue to retain requests sent from the information processing device, and a response queue to retain responses to the information processing device. The response queue includes response queues for retaining responses from its own memory and response queues for retaining responses from post-stage memories. An internal arbiter circuit functions to mediate the responses retained in these response queues, and sends the responses to the first stage of the memory and the information processing device.

CITATION LIST

Patent Literature

Patent document 1: Japanese Unexamined Patent Application Publication No. 2007-310430

SUMMARY OF THE INVENTION

Technical Problem

Prior to submitting the present application, the present inventors made a study of cellular telephones, information processing devices and flash memories, and information processing systems comprised from random access memories.

Cellular telephones are comprised of information processing devices and of memories such as NOR type flash memories, SRAM, DRAM, and NAND type flash memories NAND. NOR type flash memories mainly store operating system OS, communication control programs, and programs for playing music or videos. NAND type flash memories mainly store music data and video data.

In order to execute a communication control program, the information processing device loads (reads out) communication control command stored in the NOR type flash memory and then manages communications. In other words, one can see that the loading of random commands from NOR type flash memories occurs frequently. Latency is essential for the time taken to complete one data loading (or readout) in order to operate communication control program at high speed. Moreover, to play music or video, the information processing device loads the program for playing the music or video from the NOR type flash memory, and also transfers the music data or video data from the NAND type flash memory to the DRAM to play the music or video. One can see that the playing of this music or video involves frequent loading of sequential data from the NAND type flash memory, and alternately loading and writing the data from the DRAM. Data transfer capability is essential for playing this music or video.

Therefore, shortening the latency (delay) and raising the data transfer speed is essential in order to execute these programs efficiently on cellular telephones.

A study was made for the case of applying this type of series-connected memory to the information processing system as shown in patent document 1. More specifically, an information processing system was evaluated in which the information processing device and a memory 1, a memory 2, and a memory 3 are serially connected in sequence. In this type of information processing system coupling to the memories in series, a response from the post-stage memory 3 is input to the memory 2. The memory 2 therefore arbitrates its own response (memory 2) versus the response from the post-stage memory 3, requiring transmission to the memory 1 which causes a latency (delay) offset. Further, a response from the post-stage memory 2 and the memory 3 is input to the memory 1. The memory 1 therefore arbitrates its own response (memory 1) versus the responses from the post-stage memory 2 and memory 3, requiring transmission of a response to the information processing device, causing the problem of a greater latency (delay) offset, and revealing that the information processing system cannot cope with the high performance provided in cellular telephones.

In view of the above circumstances, one objective of the present invention is to provide a highly reliable information processing system having high-speed and a low-cost that is convenient to use and having expandable memory capacity, while also reducing the number of signal wires between the information processing device and memory, and between the memory and memory, and maintaining the loading (read-out) latency within a fixed value or a fixed range in each memory.

Solution to Problem

Typical aspects of the present invention are described as follows.

An aspect of the invention is an information processing device comprised of a request transmitter circuit to issue read access requests to external units and to also manage the response time zone that includes the response to the read access request; and a response receiver circuit to receive responses for the access request issued from external sections via the request transmitter circuit; and in which when issuing a second read access request after issuing a first read access request, the request transmitter circuit then issues that second read access request if the time width in which the first response time zone for the first read access request and the second response time zone for the second read access request overlap each other is within a pre-established maximum allowable overlap time width.

Another aspect of the invention is an information processing device with the first and the second memory device connected in series, that issues a request to the memory modules and receives memory module responses for the request, and is further comprised of a request transmitter circuit to output requests to the memory modules, and a response receiver circuit to receive responses for the request from the memory modules, and a latency register that is set with a first latency for the request to the first memory device, and a second latency for the request to the second memory device; and a latency control register that is set with a maximum allowable overlap time width to allow the issue of a second request when the first response time zone for the first request and the second response time zone for the second request issued after the first request, have overlapping time widths.

Advantageous Effects of the Invention

The present invention is capable of rendering an information processing system possessing high-speed and a low-cost, that is convenient to use and has expandable memory capacity, while also maintaining the data loading (read-out) latency within a fixed value or a fixed range.

BRIEF DESCRIPTION OF DRAWINGS

FIG. 10 is a table that shows one example of the values set in the connection register CNNREG;

FIG. 11 is a table that shows one example of the values set in the latency control register LCREG;

FIG. 12 is a table that shows one example of the values set in the latency domain register LTDREG:

FIG. 13 is a table that shows one example of the values set in the latency register LTREG;

FIG. 14 is a table that shows one example of the values set in the timing register M0TREG;

FIG. 15 is a table that shows one example of the values set in the timing register M1TREG;

FIG. 16 is a table that shows one example of the values set in the timing register M2TREG;

FIG. 17 is a table that shows one example of the values set in the memory control mode register OMDREG;

FIG. 18 is tables showing one example of a request that the memory control circuit DCMC outputting to each memory device;

REFERENCE SIGNS LIST

Figure 1:
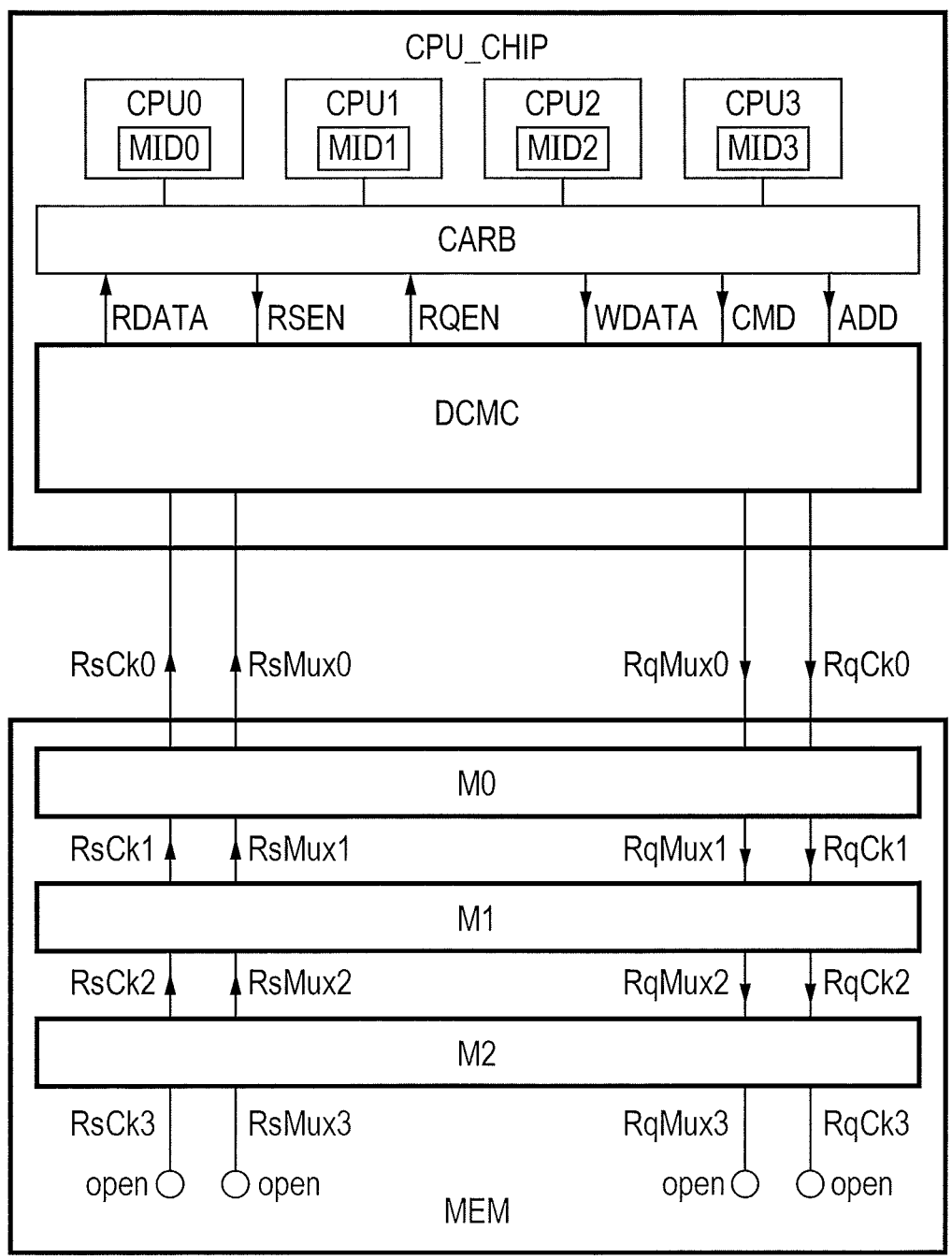
FIG. 1 is a block diagram showing one example of the structure of the information processing system of the present invention.

CPU_CHIP . . . information processing device, CPU0, CPU1, CPU2, CPU3 . . . information processing circuit, CARB ... arbiter circuit, DCMC ... memory control circuit, MEM ... memory module, M0, M1, M2 ... memory device, MID0, MID1, MID2, MID3 ... master number register, CONFIG ... configuration circuit, REQQ1, REQQ2 ... request queue, IDHT ... hit decision circuit, COMGEN ... command generator circuit, RQOUT ... request output circuit, REF ... refresh request circuit, QMGT ... queue management circuit, LCHCK ... latency adjuster circuit, RSIN ... response input circuit, RESQ1 ... response queue, ReqIF ... request interface circuit, ResIF ... response interface circuit, INIT0, INIT1, INIT2 ... initializing setter circuit, Mem0, Mem1, Mem2 ... memory circuit, RqCkC ... request clock control circuit, Drv1 ... clock driver, Div1 ... clock divider circuit, RqCT ... request queue control circuit, RqQI, RqQXI, RqQXO ... request queue circuit, IDR ... ID register circuit, CPQ ... ID comparator circuit, RsQo, RsQp ... response queue circuit, RRG ... response priority sequence setter register circuit, RQQM ... request queue check circuit, IDV ... ID valid bit, BR ... boot device flag register, ER ... terminal device flag register, RsCkC ... response clock control circuit, Drv2 ... clock driver, Div2 ... clock divider circuit, RsCT ... response queue control circuit, RSQM ... response queue check circuit, SCH ... response scheduler circuit, LC ... latency code register, DC ... device code register, Bsig ... boot device recognition signal, RqCk0, RqCk1, RqCk2 ... request clock, RsCk0, RsCk1, RsCk2 ... response clock, RqMux0, RqMux1, RqMux2 ... request signal, RsMux0, RsMux1, RsMux2 ... response signal, ck1, ck2, ck3, ck4 ... clock signal, CmdDec ... command decoder, ContLogic ... control circuit, RaddLat ... row address buffer, CaddLat ... column address buffer, RefC ... refresh counter, Thmo ... thermometer, WDataLat ... write data buffer, RDataLat ... read data buffer, RowDec ... row decoder, COLDec ... column decoder, SenseAmp ... sense amplifier, DataCont ... data control circuit, BANK0, BANK1, BANK2, BANK3, BANK4, BANK5, BANK6, BANK7 ... memory bank, MBank0, MBank1, MBank2, Mbank3, MBank4, MBank5, MBank6, MBank7 ... memory circuit, BotID ... boot device ID value, NV1BANK0, NV1BANK1, NV1BANK2, NV1BANK3, NV1BANK4, NV1BANK5, NV1BANK6, NV1BANK7 memory bank, PadLat ... page address buffer, PageDec ... page decoder, NV1Bk0, NV1Bk1, NV1Bk2, NV1Bk3, NV1Bk4, NV1Bk5, NV1Bk6, NV1Bk7 ... memory circuit, ECC ... error detection and correction circuit, NV2BANK0, NV2BANK1, NV2BANK2, NV2BANK3, NV2BANK4, NV2BANK5, NV2BANK6, NV2BANK7 ... memory bank, NV2Bk0, NV2Bk1, NV2Bk2, NV2Bk3, NV2Bk4, NV2Bk5, NV2Bk6, NV2Bk7 ... memory circuit, CFRG-AREA ... configuration area, IO-AREA ... IO area, BotID-AREA ... boot device ID storage area, InitPR-AREA ... initializing program area, OSAP-AREA ... program storage area, COPY-AREA ... copy area, WORK-AREA ... work area, DATA-AREA ... data area, REP-AREA ... substitute area, CPU_CHIP1 ... information processing device, DCMC1 ... memory control circuit, MEM1 ... memory module, M10, M11, M12 ... memory device, RQOUT1 ... request output circuit, OUTBLK ... output circuit, SDBLK ... serial data circuit, RSIN1 ... response input circuit, INBLK ... input circuit, PDBLK ... parallel data circuit, RqC ... request signal conversion circuit, RQPD, RSPD ... parallel data circuit, RQSD, RSSD ... serial data circuit, DRAM, DRAM00, DRAM01, DRAM10, DRAM11 ... dynamic random access memory, NOR, NOR0, NOR1 ... NOR type flash memory, NAND, NAND0, NAND1 ... NAND type flash memory, HDD0, HDD1 ... hard disk, MRAM0, MRAM1 ... magnetic random access memory, NVM20, NVM21, NVM30, NVM31 ... nonvolatile memory, CHIPM1, CHIPM2, CHIPM3, CHIPM4 ... semiconductor chip, PCB ... printed circuit board, COVER ... sealing cover for module, TSV ... through-silicon via, ANT ... antenna, RF ... radio block, SP ... voice codec block, SK ... speaker, MK ... microphone, CPU ... processor, DRAM ... dynamic random access memory, LCD ... liquid crystal display unit, KEY ... keyboard, MSM ... memory module, CPU_MAIN ... information processing device, SLP ... information processing system.

DESCRIPTION OF EMBODIMENTS

The embodiments of the present invention are described next in detail while referring to the accompanying drawings. Though there are no particular restrictions on the circuit elements in each block of the embodiment, the block circuit elements are rendered by CMOS (complementary MOS transistors) integrated circuit technology of the related art formed over a single semiconductor circuit board such as of single crystalline silicon. Moreover, the invention is not strictly limited in particular to a specific figure, and there are no particular restrictions on the numerical values utilized in the description of this invention.

First Embodiment

The information processing system of the first embodiment of the present invention is described next while referring to FIG. 1 through FIG. 28

Figure 2:
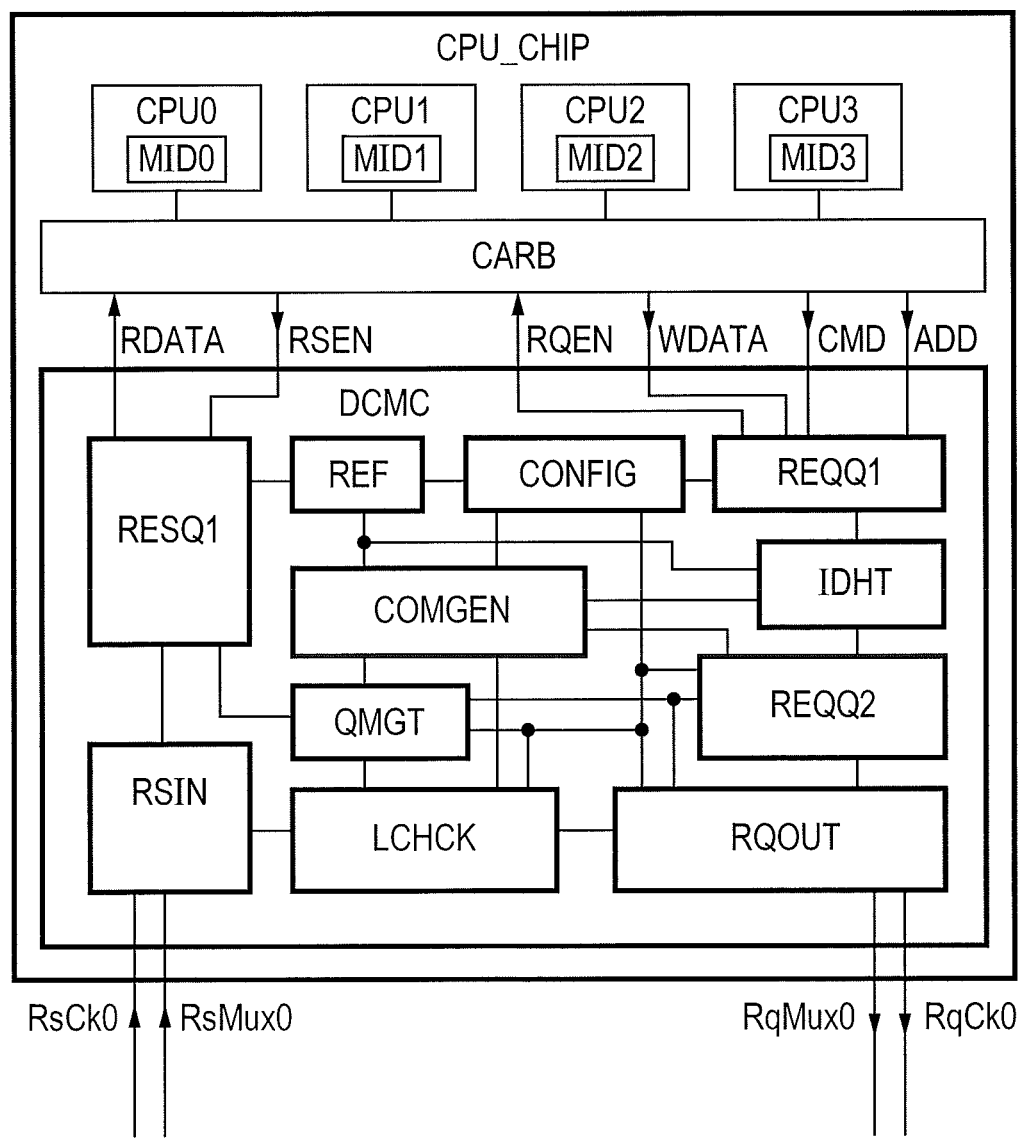
FIG. 2 is a block diagram showing one example of the structure of the information processing device that configures the information processing system of the present invention.

FIG. 1 is a block diagram showing one example of the structure of the information processing system comprised of a memory module MEM and an information processing device CPU_CHIP as the first embodiment of the present invention. FIG. 2 is a block diagram showing one example of the structure of the information processing device CPU_CHIP. These embodiments are hereafter described in detail.

The information processing device CPU_CHIP is comprised of the information processing circuit CPU0, CPU1, CPU2, CPU3, an arbiter circuit CARB, and memory control circuit DCMC as shown in FIG. 1. The memory module MEM is comprised of the memory devices M0, M1, and M2. The information processing device CPU_CHIP is serially coupled to the memory devices M0, M1, and M2. The information processing circuit CPU0 contains a master No. register MID0, the information processing circuit CPU1 contains a master No. register MID1, the information processing circuit CPU2 contains a master No. register MID2, and the information processing circuit CPU3 contains a master No. register MID3.

Moreover, the memory control circuit DCMC as shown in FIG. 2, contains a configuration circuit CONFIG, a request queue REQQ1, a hit decision circuit IDHT, a request queue REQQ2, a command generator circuit COMGEN, a request output circuit RQOUT, a refresh request circuit REF, a queue management circuit QMGT, a latency adjuster circuit LCHCK, a response input circuit RSIN, and a response queue RESQ1. Further, though not shown in the drawing, the configuration circuit CONFIG contains a queue register QREG, a latency register LTREG, a latency domain register LTDREG, a plurality of timing registers MnTREG relating to a memory device Mn (n=0, 1, 2, 3 ... ) (For example, MOTREG indicates a register relating to the memory device M0.), an operation mode register OMDREG, a connection register CNNREG, and a latency control register LCREG.

The information processing circuits CPU0, CPU1, CPU2, and CPU3, load (read-out) and execute the OS or application programs, or data for processing by the OS or application programs, from the memory module MEM by way of the arbiter circuit CARB and the memory control circuit DCMC.

The request queue REQQ1 and the request queue REQQ2 store the read requests and the write requests and so on issued from the information processing circuits CPU0 through 3. The response queue RESQ1 stores the OS, application programs and data loaded (read-out) from the memory module MEM.

The hit decision circuit IDHT decides whether or not data for the read request and write request from the information processing circuit CPU0 through 3 is present on the pages activated for each of the memory banks and response queues of each of the memory devices M0 through 2 (hereafter, called "hit decision"). To make this decision, the hit decision circuit IDHT links the bank address BAdd, the page address PAdd, and column address CAdd of each memory device contained in the memory module MEM with the address corresponding to the request from the information processing device CPU0 through CPU3. The hit decision circuit IDHT also stores the bank address, page address, and column address for the response queue storing data within the response queue contained in each memory device. The hit decision circuit IDHT further retains the bank address and page address for that activated page within the memory device from within the memory bank contained in each memory device.

Figure 3:
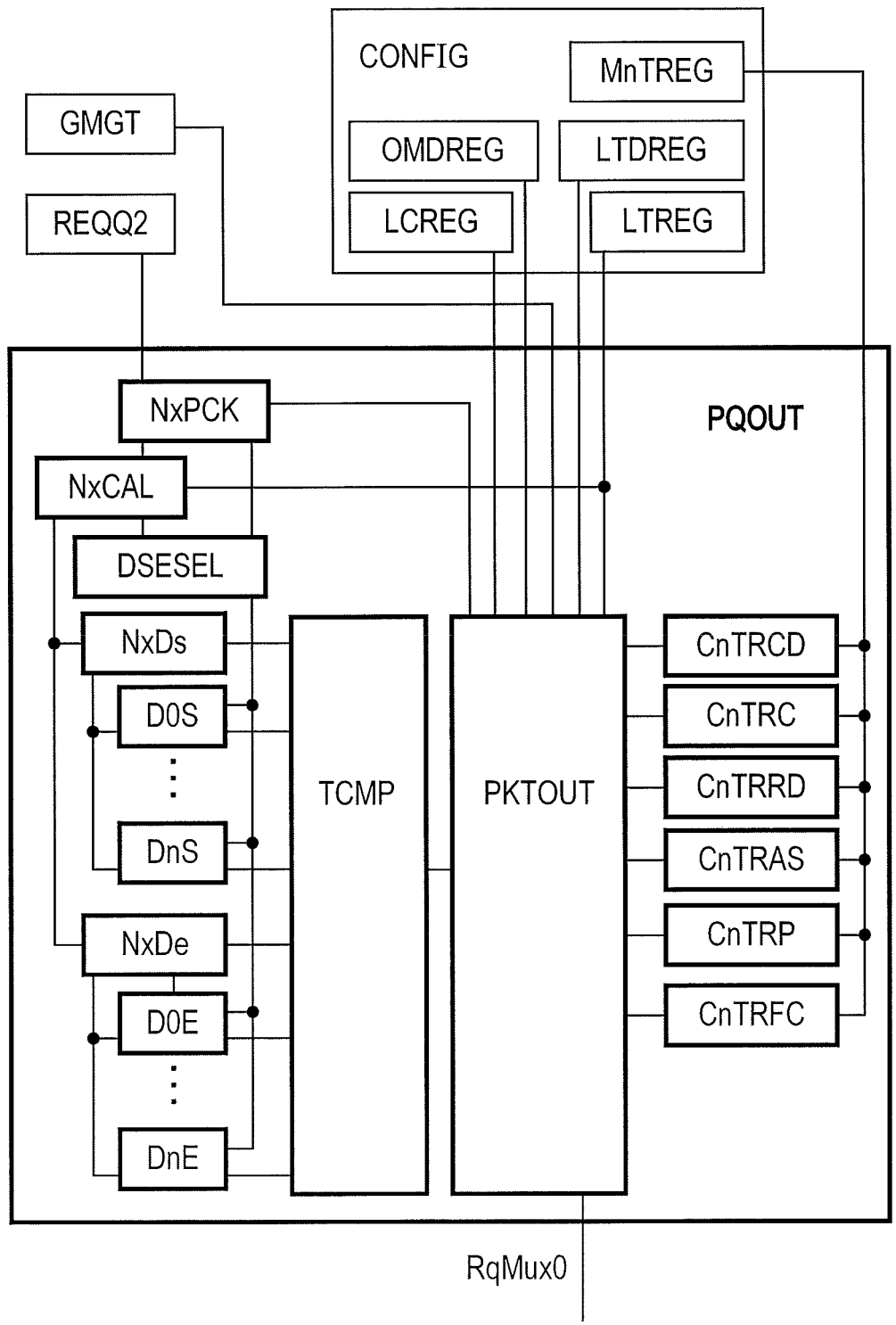
FIG. 3 is a block diagram showing one example of the structure of the request output circuit RQOUT.

The request output circuit RQOUT as shown in FIG. 3, includes the request retainer circuit NxPCK, the response time position calculator circuit NxCAL, the counter select circuit DSESEL, the time position comparator circuit TCMP, the request issue circuit PKTOUT, the plural counters CnTRCD, CnTRC, CnTRRD, CnTRAS, CnTRP, CnTRFC, DnS, DnE, and the registers NxDs, NsDe.

Each of the timing registers MnTREG contains the counters CnTRCD, CnTRC, CnTRRD, CnTRAS, CnTRP, and CnTRFC that initialize the corresponding timing register MnTREG value.

The request retainer circuit NxPCK is a circuit for retaining the next request. The response time position calculator circuit NxCAL calculates the start time position and the final end time position of the response from internal information for the request retained in the request retainer circuit NxPCK and the value for the latency register LTREG.

The register NxDs retains the start time position of the response calculated by the response time position calculator circuit NxCAL. The register NsDe retains the final end time position of the response calculated by the response time position calculator circuit NxCAL.

When a request is issued to the memory device Mn, the value of register NxDs is set into a counter DnS selected by the counter select circuit DSESEL. Further, when a request is issued to the memory device Mn, the value of register NxDe is set into the counter DnE selected by the counter select circuit DSESEL.

The time position comparator circuit TCMP compares the counter DnS value and DnE values showing the time position of the response for the previously issued request, with the register NxDs value and the NxDe value showing the time position of the response for the next request that will be issued, and convey those results to the request issue circuit PKTOUT.

The request issue circuit PKTOUT is a circuit for issuing the request retained in the request retainer circuit NxPCK from the signal RsMux0 by utilizing the latency control register LCREG, the latency domain register LTDREG, the latency register LTREG, the memory control mode register OMDREG contained in the configuration circuit CONFIG; the counter CnTRCD, CnTRC, CnTRRD, CnTRAS, CnTRP, CnTRFC, the comparison results from the time position comparator circuit TCMP, and availability information on the response queue RESQ1 from the queue management circuit QMGT.

The description of the memory module MEM now refers back to FIG. 1. The memory module MEM is comprised of the memory devices M0, M1, and M2. The information processing device CPU_CHIP and the memory devices M0, M1, and M2 are connected in serial.

The memory device M0 is a volatile memory, and may be a memory device configured over a single semiconductor substrate, or a memory device over which a plurality of memory chips are integrated. Further, the memory devices M1 and M2 are nonvolatile memories, and may be a memory device configurable over a single semiconductor substrate, or a memory device over which a plurality of memory chips are integrated. Typical volatile memories here include dynamic random access memory DRAM utilizing dynamic random access memory cells in memory arrays, and pseudo-static random access memory PSRAM, and static random access memories SRAM utilizing static random access memory cells, etc. The present invention is capable of utilizing all the volatile memory cells. The example described in this embodiment utilizes dynamic random access memory cells in memory arrays.

The nonvolatile memory may utilize ROM (read-only memories), EEPROM (electrically erasable and programmable ROM), flash memories, phase-change memory PCRAM, magnetic random access memory MRAM, resistor-switching type random access memories ReRAM, etc. The example described in this embodiment utilizes a flash memory. The typical flash memory moreover may include NOR type flash memories, AND type flash memories, NAND type flash memories, and ORNAND type flash memories. The present invention can utilize all of these flash memories.

The typical flash memory contains a flash memory utilizing a binary memory cell SLC capable of storing one bit of information in the memory cell, and a flash memory utilizing multi-value memory cells MLC capable of storing two or more bits of information in the memory cell. The present invention is capable of utilizing all of these flash memories.

The example described in the present embodiment is NOR type flash memory utilizing a binary memory cell SLC, and a NAND type flash memory utilizing a binary memory cell SLC.

The typical volatile memory utilized in the memory device M0 is a dynamic random access memory that utilizes dynamic memory cells, and possesses a memory capacity of approximately one Gbit. There are no particular restrictions, the memory device M0 is utilized as a temporary work memory for executing application programs in the information processing device CPU_CHIP.

The typical flash memory for the memory device M1 utilizes a NOR type flash memory cell possessing a memory capacity of approximately one Gbit. There are no particular restrictions, the memory device M1 is utilized to store application programs and boot programs, boot device ID values, and configuration information for the memory module MEM, OS executed in the information processing device CPU_CHIP.

The typical flash memory for the memory device M2 utilizes a NAND type flash memory cell possessing a memory capacity of approximately 16 Gbits. There are no particular restrictions, the memory device M1 is mainly utilized to store for example stationary photo data and video data, and audio data required for playing and recording (dubbing) audio and video in the information processing device CPU_CHIP.

The memory devices M0 through 2 are described next while referring to FIG. 4 through FIG. 8. The memory devices M0, M1, and M2 each contain the initializing setter circuits INIT0, INIT1, and INIT2. These respective initializing setter circuits INIT0, INIT1, and INIT2 initialize the respective memory devices immediately after the power is turned on.

An ID register IDR for storing the respective memory device identification number ID is set in the request queue control circuits RqCT in the memory devices M0, M1, and M2. The method for setting the identification No. into the ID register IDR is shown next.

In the process for making initialization settings in the memory devices immediately after power is applied to the memory devices M0, M1, and M2, the initializing setter circuits INIT0, INIT1, and INIT2 set the identification number ID1, 2 and 3 retained in their own identification No. retaining circuits SR0, SR1, and SR2, into the ID registers IDR within the respective memory devices M0, M1, and M2, and set the ID valid bit IDV to High. The time required for initialization can be shortened by specifying the identification number ID values for memory devices M0, M1, and M2 on the memory device side in this way.

The memory devices M0, M1, and M2 respectively contain a boot device recognition signal Bsig. If those boot device recognition signal Bsig is electrically connected to ground (gnd), then this indicates that the memory devices function as boot devices that store boot programs for booting that memory device immediately after the power is turned on. If the boot device recognition signals Bsig is electrically connected to the (power) supply (vdd) then this indicates that the memory device is not a boot device. In the present embodiment, the memory device M1 is a boot device and the memory devices M0 and M2 are not set as boot devices. The boot device recognition signals Bsig can program what memory device to set as the boot device and in this way be flexibly utilized to match the system.

The information processing device CPU_CHIP and memory devices M0, M1, and M2 are serially connected. Clock methods to operate the devices are the common clock method, source synchronous clock method, and embedded clock method, etc. All of these clock methods can be utilized in this embodiment. The operation example described in the present embodiment utilizes the source synchronous clock method.

Here, the RqCk0, RqCk1 and the RqCk2 are request clocks, and the RsCk0, RsCk1, and the RsCk2 are response clocks. The RqMux0, RqMux1 and the RqMux2 are request signals, and the RsMux0, RsMux1, and the RsMux2 are response signals. Though there are no particular restrictions, the requests sent by any of these request signals are comprised of a four-byte common request section CMNREQF, and a maximum 36 byte variable request section VBREQ. These request signals are multiplexed and sent synchronized with the respective request clocks RqCk0, RqCk1, and RqCk2.

The common request section CMNREQF is comprised of a request start flag ReqStFlg, an identification number ID, a command, a master No. MID, a data length DL, a variable request length VREQL, and a request No. ReqN. The variable request section VBREQ is comprised of a four-byte address and a maximum 32 bytes of write data. The data length DL expresses the length of the read data and the write data in byte units. The variable request length VREQL expresses the length of the variable request section VBREQ in byte units.

Though there are no particular restrictions, the responses sent by way of the RsMux0, RsMux1 and RsMux2 response signals are comprised of four byte common response section CMNRESF and a maximum 32 byte read data. These response signals are multiplexed and sent synchronized with the respective request clocks RsCk0, RsCk1, and RsCk2.

The common response section CMNRESF is comprised of a response start flag ResStFlag, an identification number ID, a command, a master No. MID, a read data length RDL, and a response No. ResN. The read data length RDL expresses the length of the read data in byte units.

The master No. shows which information processing circuit among the information processing circuits CPU0, 1, 2, and 3 is the source of the request, and corresponds to the values set in the respective master No. register MID0, MID1, and MID2. That request starts when the request start flag is High (level). The identification number ID value is an identification number that identifies the memory devices M0, M1, and M2. The request No. is the identification number of the request itself. The request length indicates the length of the multiplexed request. The response starts when the response start flag is High (level). The identification number ID value is the identification number that identifies the memory devices M0, M1, and M2. The response No. is the identification number for identifying the response itself. The response length indicates the length of the multiplexed response.

Description of the Memory Device M0

Figure 4:
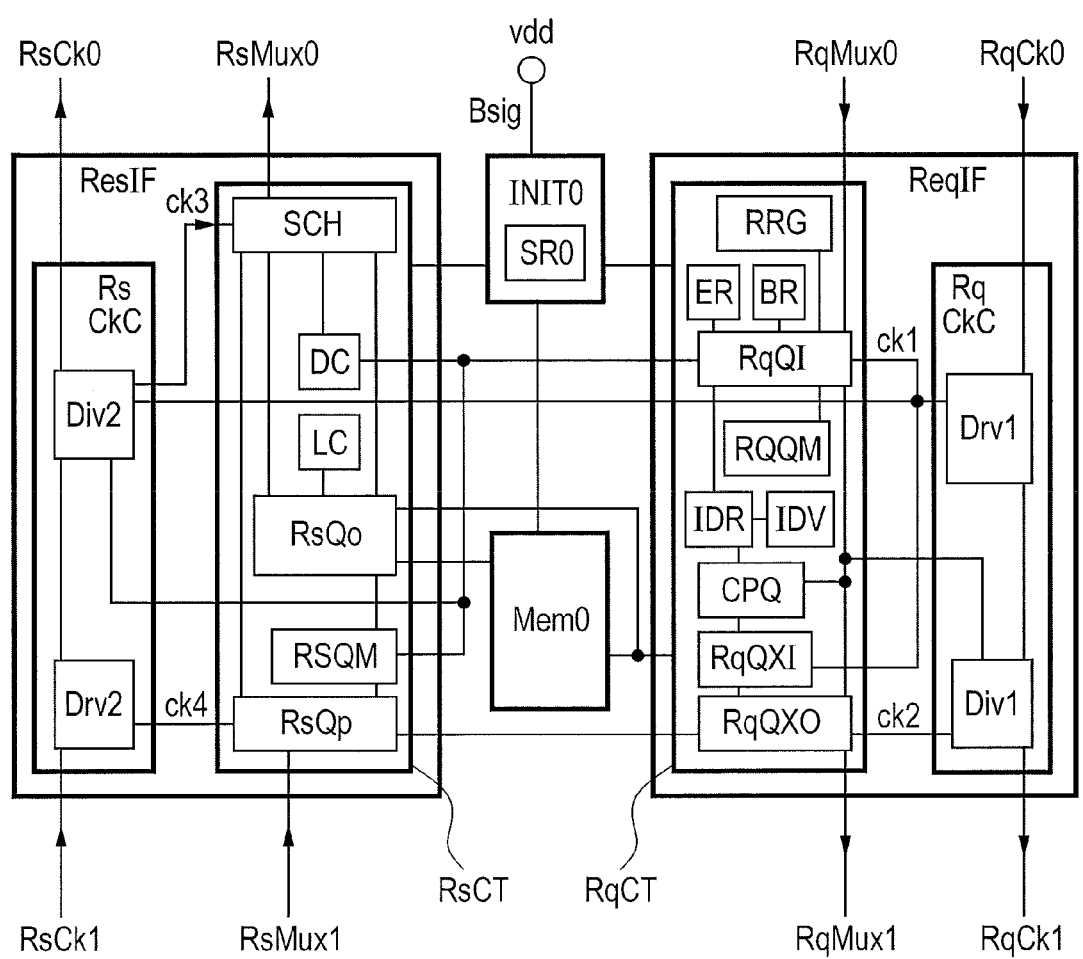
FIG. 4 is a block diagram showing one example of the structure of the memory device.

FIG. 4 is a block diagram showing an example of the structure of the memory device M0. The memory device M0 is comprised of a request interface circuit ReqIF, and a response interface circuit ResIF, an initializing setter circuit INIT0, and a memory circuit Mem0. The initializing setter circuit INIT0 contains an identification No. retaining circuit SR0. Though there are no particular restrictions, the identification number retaining circuit SR0 retains the identification number ID value 1 of the memory device M0.

The request interface circuit ReqIF is comprised of a request clock control circuit RqCkC and a request queue control circuit RqCT. The request clock control circuit RqCkC is comprised of a clock driver Drv1 and a clock divider circuit Div1.

The request queue control circuit RqCT is comprised of a request queue circuit RqQI, a request queue circuit RqQXI, a request queue circuit RqQXO, an ID register circuit IDR, an ID comparator circuit CPQ, a response priority sequence setter register circuit RRG, a request queue check circuit RQQM, an ID valid bit IDV, and a boot device flag register BR, and a terminal device flag register ER.

Though there are no particular restrictions, the request queue circuit RqQI is comprised from eight request queues. The request queue circuit RqQXI is comprised from four request queues. The request queue circuit RqQXO is comprised from four request queues.

The response interface circuit ResIF is comprised of the response clock control circuit RsCkC and the response queue control circuit RsCT. The response clock control circuit RsCkC is comprised of the clock driver Drv2 and the clock divider circuit Div2. The response queue control circuit RsCT is comprised from the response queue circuit RsQo, the response queue circuit RsQp, the response queue check circuit RSQM, the response scheduler circuit SCH, the latency code register LC, and the device code register DC. Though there are no particular restrictions, the response queue circuit RsQo is comprised from four response queues, and the response queue circuit RsQp is comprised from eight response queues.

The memory circuit Mem0 is a volatile memory; and moreover is a dynamic random access memory utilizing dynamic random access memory cells. The initializing setter circuit INIT0 initializes the memory device M0 when power is turned on to the memory device M0. The request clock control circuit RqCkC conveys the clock input from the clock signal RqCk0 by way of the internal clock ck1 to the request queue control circuit RqCT and the response clock control circuit RsCkC. The request clock control circuit RqCkC outputs the clock input from the request clock signal RqCk0 by way of the clock driver Drv1 and the clock divider circuit Div1 via the clock signal RqCk1. Moreover, the request clock control circuit RqCkC can lower the clock frequency of the clock signal ck2 and the request clock RqCk1, stop the clock, and re-operate the clock in compliance with command input by way of the request signal RqMux0.

The response clock control circuit RsCkC outputs the clock input from the internal clock signal ck1 to the response queue control circuit RsCT via the internal clock signal ck3. The response clock control circuit RsCkC also outputs the clock input from the internal clock signal ck1, from the clock signal RsCk0 by way of the clock divider circuit Div2. The response clock control circuit RsCkC also outputs the clock input from the clock signal RsCk1 by way of the clock driver Drv2, to the response queue control circuit RsCT from the clock signal ck4. The response clock control circuit RsCkC is further capable of lowering the clock frequency of the response clock RsCk0, stopping the clock, and re-operating the clock in compliance with command input by way of the request signal RqMux0.

The request queue circuit RqQI stores the request that the ID value, the request number. ReqN, the command, the address, and write data that were multiplexed and input to the memory device by way of the request signal RqMux0, generates a response No. ResN, that is the same number as the request No. ReqN, and sends that response No. ResN to the response queue control circuit RsCT.

The identification number ID values for the memory device M0 are stored within the ID register circuit IDR. The ID comparator circuit CPQ compares the ID value stored within the request queue circuit RqQI, with the identification number ID value stored within the ID register circuit IDR. The request queue circuit RqQXI and the request queue circuit RqQXO store the requests that were transferred from the request queue circuit RqQI.

The response queue circuit RsQo stores the data loaded (hereafter read-out data) from the memory circuit Mem0 of memory device M0, the ID value loaded (hereafter read-out data) from the ID register circuit IDR, and the response No. ResN. The response queue circuit RsQp stores the read-out data and the error information and status information the response No. ResN, the ID value input by way of the response signal RsMux1.

The response scheduler circuit SCH sets the response priority sequence for the response stored in the response queue circuit RsQo, and the response stored in the response queue circuit RsQp, and also performs arbitration for outputting high priority sequence responses from the response signal RsMux0. Though there are no particular restrictions, the control methods for setting the response priority sequence are the fixed sequence method and the sequence change method. The response scheduler circuit SCH sets the response priority sequence according to the method that was set in the response priority sequence setter register circuit RRG. The fixed sequence method is capable of setting the response within the response queue circuit RsQp contained in each memory device to a higher priority than the responses within the response queue circuit RsQo; and capable of setting the response within the response queue circuit RsQo to a higher priority than the response within the response queue circuit RsQp. The sequence change method is capable of changing the priority sequence of the response within the response queue circuit RsQp and the response within the response queue circuit RsQo contained in each memory device by utilizing the round robin method.

The memory circuit Mem0 contained within the memory device M0 utilizes the same structure as the dynamic random access memory that is well known in the related art and so a detailed description is omitted here.

Description of the Memory Device M1

Figure 5:
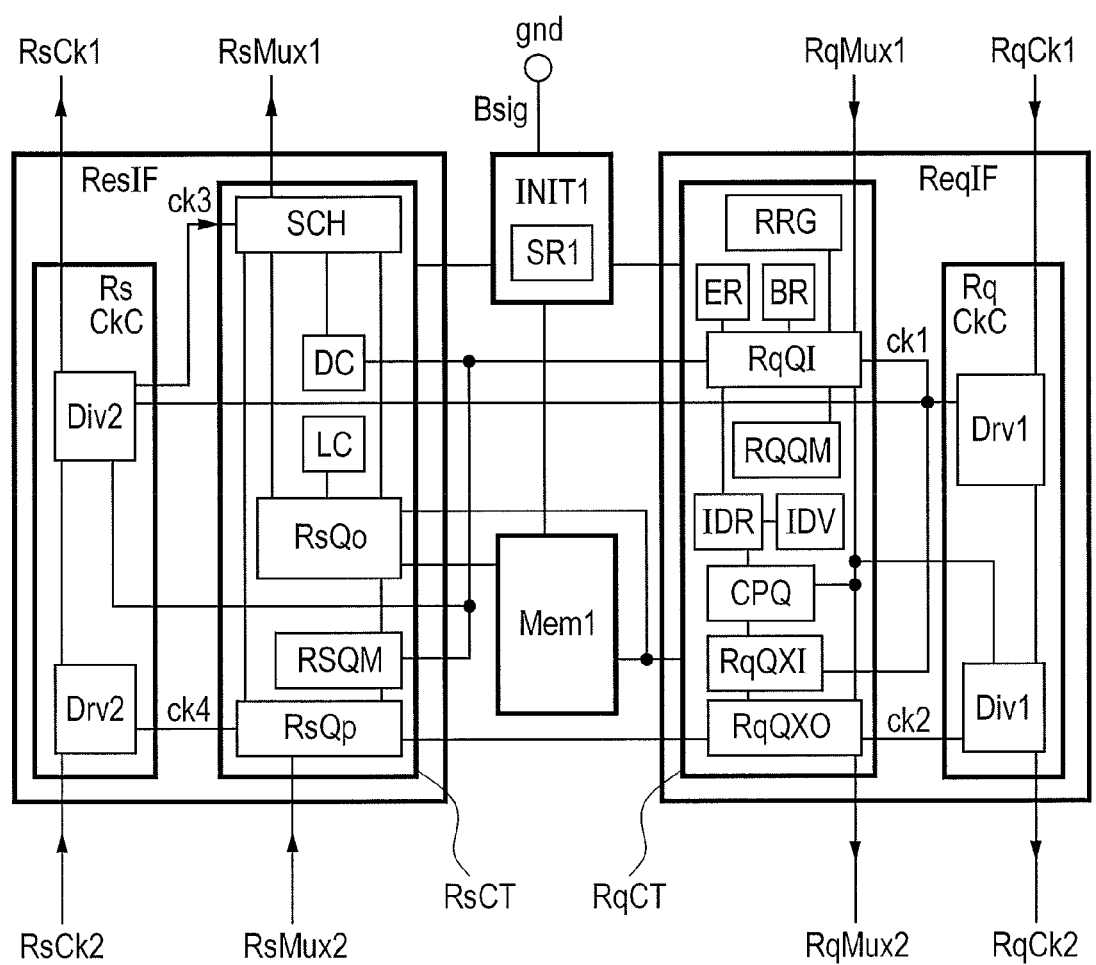
FIG. 5 is a block diagram showing one example of the structure of the memory device.

FIG. 5 is a block diagram showing one example of the structure of the memory device M1. The point differing from the memory device M0 shown in FIG. 4 is that the memory circuit Mem1 is a nonvolatile memory; and also the point that there is a NOR type flash memory utilizing NOR type flash memory cells. A boot device ID value BotID is therefore stored within the memory circuit Mem1. Circuits other than the memory circuit Mem1 and the initializing setter circuit INIT1 that configure the memory device M1 and operation of those circuits are the same as the memory device M0 in FIG. 3. The initializing setter circuit INIT1 contains an identification No. retaining circuit SR1. Though there are no particular restrictions, the identification No. retaining circuit SR1 retains the identification number ID value 2 for the memory device M1.

Memory Circuit Mem1

Figure 6:
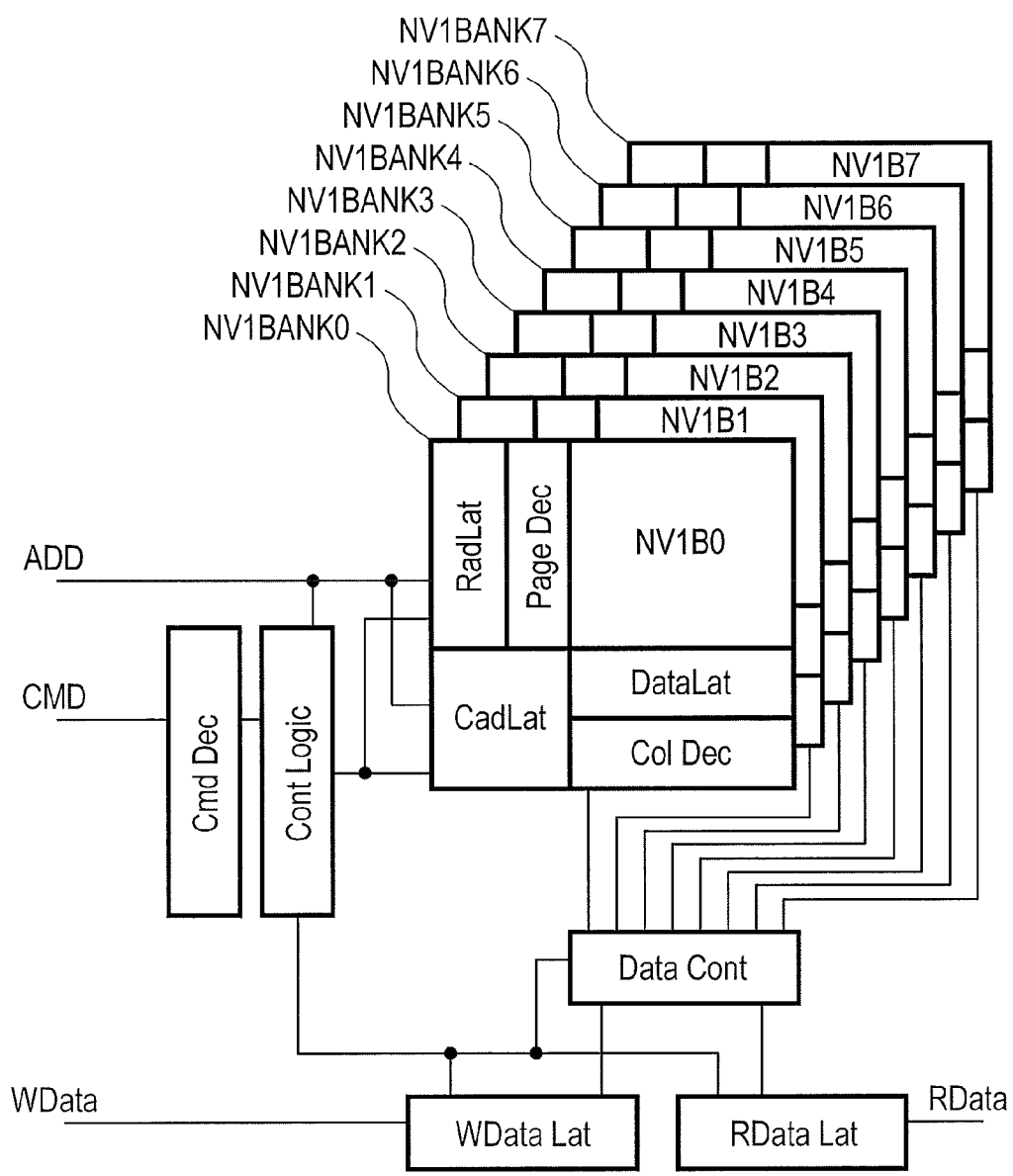
FIG. 6 a block diagram showing one example of the circuit block of the memory circuit contained in the memory device.

FIG. 6 is a block diagram showing one example of the circuit block of the memory circuit Mem1 contained in the memory device M1. The memory circuit Mem1 is comprised of a command decoder CmdDec, a control circuit Cont Logic, a write data buffer WDataLat, a read data buffer RdataLat, a data control circuit DataCont, and the memory banks NV1BANK0 through NV1BANK7. Each of the memory banks NV1BANK0 through NV1BANK7 moreover are comprised of a page address buffer PadLat, a column address buffer CadLat, a page decoder PageDec, a column decoder ColDec, a data buffer DataLat, and the memory array circuits NV1B0 through NV1B7.

The readout operation of the memory circuit Mem1 is described in the following example. When a request RqACID2S5 containing a bank active command AC, a bank address BADD7 and a page address PADD5 is stored in the request queue RqQX1 of the memory device M1, the bank active command AC is sent from the command signal CMD, and the bank address BADD7 and the page address PADD5 are sent from the address signal ADD, to the memory circuit Mem1. The command decoder CmdDec decodes the bank active command AC, and the control circuit ContLogic selects the memory bank NV1BK7, the page address 5 is stored in the page address buffer PadLat of the memory bank NV1B7, and is input to the page decoder PageDec. Those memory cells coupled to the page address PADD5 within the memory array circuit NV1B7 are then activated. Though there are no particular restrictions, a 1 kByte portion of data is transferred to the data buffer DataLat.

Next, when a request RqRDID2S6 containing a read command RD, a read data length RDL value 4, a bank address BADD7 and a column address CADD64 is stored in the request queue RqQXI of memory device M1; the command signal CMD sends a read command RD and the data length DL value 4, and the address signal ADD sends a bank address BADD7 and a column address CADD63, to the memory circuit Mem1. The command decoder CmdDec decodes the read command RD and the data length DL value 4, and the control circuit Cont Logic selects the memory bank NV1BK7, and the column address 63 is stored in the column address buffer CadLat of the memory bank NV1BK7, and input to the column decoder ColDec.

The four byte portion of data is afterwards read out from the data buffer DataLat using the column address 64 as the start address; and by way of the data control circuit DataCont this data is transferred and stored in the read data buffer RData Lat. This read-out four byte portion of data is afterwards transferred to the response queue circuit RsQo.

An example of the write operation of the memory circuit Mem1 is described next. When a request RqWTID2S7 containing a write command WT, the data length DL value 4, the bank address BADD7, the column address CADD128, and a four byte portion of write data is stored in the request queue RqQXI of memory device M1, the command signal CMD sends the write command WT and the data length DL value 4 to the memory circuit Mem1, the address signal ADD sends the bank address BADD7 and the column address CADD128, and the write data signal WData sends the four byte portion of write data to the memory circuit Mem1.

The command decoder CmdDec decodes the write command WT and the data length DL value 4, and the control circuit Cont Logic selects the memory bank NV1BK7, and the column address 128 is stored in the column address buffer CadLat of the memory bank NV1BK7, and input to the column decoder ColDec. The control circuit Cont Logic stores the four byte portion of write data into the write data buffer WData Lat.

The four byte portion of write data is afterwards transferred from the write data buffer WData Lat using the column address 128 as the start address, by way of the data control circuit Data Cont to the data buffer DataLat within the memory bank NV1BANK7, where it is written into the memory array circuit NV1B7.

Each of the memory banks NV1BANK0 through NV1BANK7 can operate autonomously so that read out and write operations can be executed simultaneously among different banks and high speed operation can be attained.

Description of the Memory Device M2

Figure 7:
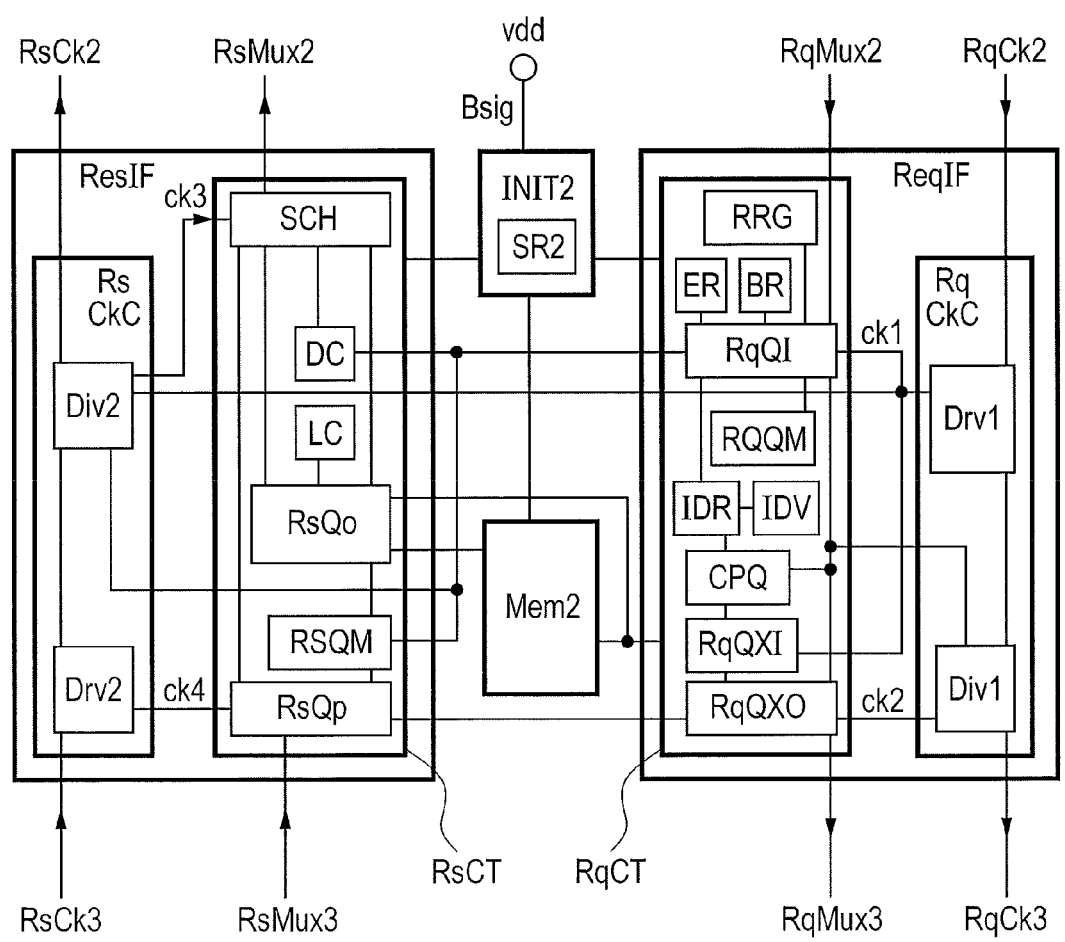
FIG. 7 is a block diagram showing one example of the structure of the memory device.

FIG. 7 is a block diagram showing one example of the structure of the memory device M2. The points where the memory device M2 differs from the memory devices M0, M1 shown in FIG. 4 and FIG. 5 is that the memory circuit Mem2 is a nonvolatile memory and that the NAND type flash memory utilizes NAND type flash memory cells. Except for the memory circuit Mem2 and the initializing setter circuit INIT2, the circuit operation and the circuits configuring the memory device M2 are identical to the memory device M0 in FIG. 4 and the memory device M1 in FIG. 5. Namely, all circuits other than the initializing setter circuit INIT0, INT1, INIT2 and the memory circuits Mem0, Mem1, Mem2, are circuits jointly used by the memory device M0 through M2. The initializing setter circuit INIT2 contains an identification No. retaining circuit SR2. Though there are no particular restrictions, the identification No. retaining circuit SR2 retains the identification number ID value 3 of the memory device M2.

Memory Circuit Mem2

Figure 8:
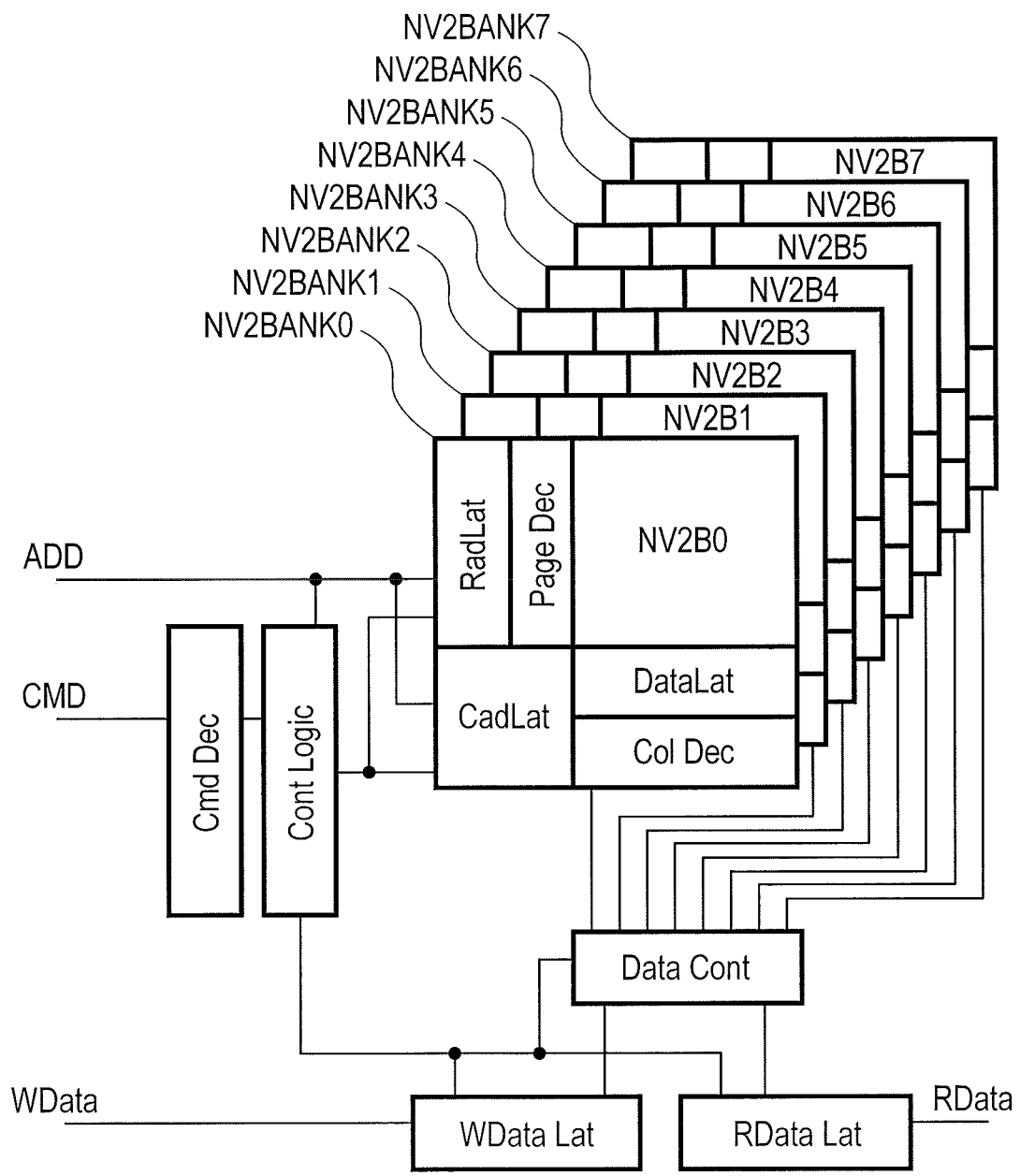
FIG. 8 is a block diagram showing one example of the circuit block of the memory circuit contained in the memory device.

FIG. 8 is a block diagram showing one example of the circuit block of the memory circuit Mem2 configured in the memory device M2. The memory circuit Mem2 is comprised of a command decoder CmdDec, a control circuit Cont Logic, a write data buffer WDataLat, a read data buffer RDataLat, a data control circuit DataCont, and the memory banks NV2BANK0 through NV2BANK7. The memory banks NV2BANK0 through NV2BANK7 moreover are comprised of a page address buffer PadLat, a column address buffer CadLat, a page decoder PageDec, a column decoder ColDec, a data buffer DataLat, and the memory array circuits NV2B0 through NV2B7.

The readout operation and the write operation in memory circuit Mem2 are performed using the same procedure as the memory circuit Mem1. Each of the memory banks NV2BANK0 through NV2BANK7 can operate autonomously so that read out and write operations can be executed simultaneously among different banks and high speed operation can be attained.

Initializing Sequence at Power-on

The operation of the information processing system is described next. First of all, the operation when turning on the power and immediately after turning on the power is described next.

Figure 9:
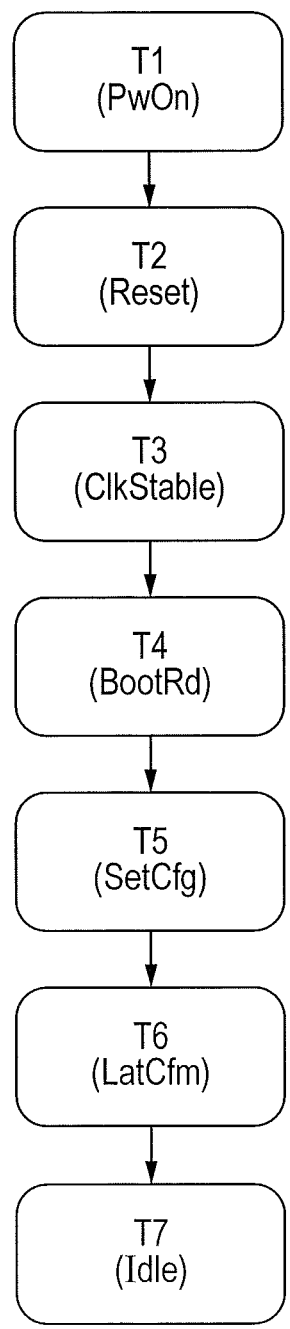
FIG. 9 is a flow chart showing one example of the operation when turning on the power in the information processing system of the present invention.

An example of the operation of this information processing system is first described while referring to FIG. 1 through FIG. 9. FIG. 9 is a flow chart showing one example of the initializing sequence when turning on the power to the information processing system/device. In the T1 period (PwON), the operation turns on power to the information processing device CPU_CHIP, and the memory device M0, M1, and M2 within the memory module MEM, and resets itself in the T2 period (Reset). Though there are no particular restrictions on the reset method, a method to reset automatically by each of the internal circuits may be utilized, or an externally located reset terminal may be utilized to perform reset using the reset signal from this terminal, or a reset method may also be utilized that inputs a reset command from the information processing device CPU_CHIP to the memories M0, M1 and M2 by way of the request signal RqMux0, RqMux1 and RqMux2.

In the T2 reset period, the internal states of the information processing device CPU_CHIP, the memory device M0, M1, and M2 are initialized. This initializing is shown in the following example. The information processing device CPU_CHIP initializes all the registers within the configuration circuit CONFIG. Moreover, the information processing device CPU_CHIP sets a 0 in the master No. register MID0 contained in the information processing circuit CPU0, sets a 1 in the master No. register MID1 contained in the information processing circuit CPU1, sets a 2 in the master No. register MID2 contained in the information processing circuit CPU2, and sets a 3 in the master No. register MID3 contained in the information processing circuit CPU3.

The information processing device CPU_CHIP also initializes the memory map managed by itself. Though there are no particular restrictions, this setting may be performed in areas such as the boot program area, the configuration area, the program area, the copy area, the work area, the data area, and the IO device area. The boot program area and the program area are assigned to the memory device M1, the copy area and the work area are assigned to the memory device 0, the data area is assigned to the memory device M2, and the configuration area is assigned to the configuration circuit CONFIG.

The initializing setter circuit INIT0 in the memory device M0 initializes the memory device's own request queue control circuit RqCT, response queue control circuit RsCT, request clock control circuit RqCkC, response clock control circuit RsCkC, clock divider circuits Div1, Div2 and the memory circuit Mem0.

The memory device M0 sets the identification No. value ID1 retained in its own identification No. retaining circuit SR0, into the ID register IDR, and sets the ID valid bit IDV to High (level). The response priority sequence in the response scheduler circuit SCH contained in the response queue control circuit RqCT of memory device M0 is initialized so that: the response priority sequence of the response queue circuit RsQo is set to 1, and the response priority sequence of the response queue circuit RsQp is set to 2. The division ratio of the clock divider circuit Div1 and Div2 is initialized to 1. The memory device M0 checks that the RsMux1, and RqCk1 are not open to confirm that the memory device M0 itself is not the end terminal memory device among the serially-coupled memory devices, and sets the end device flag register ER to 0. The memory device M0 further checks that the boot device recognition signal Bsig coupled to the power supply (vdd) to confirm that the memory device M0 itself is not the boot device, and sets the boot device flag register BR to 0.

The initializing setter circuit INIT1 within the memory device M1 itself, initializes the request queue control circuit RqCT, response queue control circuit RqCT, request clock control circuit RqCkC, response clock control circuit RsCkC, clock divider circuits Div1, Div2 and the memory circuit Mem1 within the memory device M1 itself.

The memory device M1 sets the identification No. value ID2 held in its own identification No. retaining circuit SR1, into the ID register IDR, and sets the ID valid bit IDV to High (level). Next, the response priority sequence in the response scheduler circuit SCH contained in the response queue control circuit RqCT of memory device M1 is initialized so that: the response priority sequence of memory device M1 is set to 1, and the response priority sequence of memory device M2 is set to 2. The division ratios of the clock divider circuit Div1 and Div2 are set to 1.

The memory device M1 checks that the RsMux2, and RqCk2 are not open to confirm that it is not the end terminal memory device among the serially-coupled memory devices, and sets the end device flag register ER to 0. The memory device M1 further checks that the boot device recognition signal Bsig is coupled to ground (gnd) to confirm that it is the boot device, and sets the boot device flag register BR to 1.

The initializing setter circuit INIT2 within the memory device M2 itself, initializes the request queue control circuit RqCT, response queue control circuit RqCT, request clock control circuit RqCkC, response clock control circuit RsCkC, clock divider circuits Div1, Div2 and the memory circuit Mem2.

The memory device M2 sets the identification number value ID 3 retained in its own identification No. retaining circuit SR2, into the ID register IDR, and sets the ID valid bit IDV to High. Next, the response priority sequence in the response scheduler circuit SCH contained in the response queue control circuit RqCT of memory device M2 is set so that: the response priority sequence of the memory device M2 is initialized to 1. The division ratios of the clock divider circuit Div1 and Div2 are set to 1. Moreover, the memory device M2 checks that the RqEn3, RsMux3, and RqCk3 are open to confirm that it is an end terminal memory device among the serially-coupled memory devices, and sets the end device flag register ER to 1. The memory device M2 further checks that the boot device recognition signal Bsig coupled to the power supply (vdd) to confirm that it (memory device M2) is not the boot device, and sets the boot device flag register BR to 0. Though there are no particular restrictions, the above initializing is implemented by the initializing setter circuits (sequencer configured from hardware) in each of the memories.

In period T3 (ClkStable) after the T2 reset period (Reset) has ended, the information processing device CPU_CHIP check the identification No. of the memory device M0, M1, and M2 signals.

First of all, the information processing device CPU_CHIP inputs a request clock RqCk0 into the memory device M0. This request clock RqCk0 is then output by way of the clock driver Drv1 of memory device M0 to the clock divider circuit Div1, and is output as a clock signal ck1 to the clock divider circuit Div2. The clock signal ck2 outputs the clock that was input to the clock divider circuit Div1 which is output by way of the request clock RqCk1 to the memory device M1. The clock signal ck3 outputs the clock that was input to the clock divider circuit Div2 of memory device M0, and the response clock RsCk0 then outputs this clock to the information processing device CPU_CHIP.

The memory device M1 outputs the request clock RqCk1 that was input from the memory device M0, by way of the clock driver Drv1 of memory device M1, to the clock divider circuit Div1 and outputs it as a clock signal ck1 to the clock divider circuit Div2. The clock signal ck2 then outputs the clock that was input to the clock divider circuit Div1, and outputs it by way of the request clock RqCk2 to the memory device M2. Moreover, the clock signal ck3 outputs the clock that was input to the clock divider circuit Div2 of memory device M1, and outputs it by way of the response clock RsCk1 to the memory device M0. The clock input by way of the response clock RsCk1 to the clock driver Drv2 of memory device M0 is then output to the clock signal ck4.

The memory device M1 inputs a request clock RqCk 2 in the memory device M2, and the clock driver Drv1 of memory device M2 then outputs this request clock RqCk2 as clock signal ck1 to the clock divider Div1 and the clock divider Div2. The clock signal ck2 outputs the clock that was input to the clock divider circuit Div1, and the request clock RqCk3 outputs this to the memory device M2. The clock signal ck3 then outputs the clock that was input to the clock divider circuit Div2 of memory device M2, and the response clock RsCk2 outputs this to the memory device M1. The clock input by way of the response clock RsCk2 to the clock driver Drv2 of memory device M1 is then output to the clock signal ck4.

Next, the information processing device CPU_CHIP checks the memory device M0, M1, and M2 identification numbers (No.). The information processing device CPU_CHIP transfers by way of the request signal RqMux0 the multiplexed request RqRIDID1S1 containing a request start flag RqStFL value 1, an identification number ID value 1, an ID read command RID, a master number (No.) MID value 0, a request No. ReqN value 1, and a response queue No. RQN value 0, to the memory device M0.

The memory device M0 confirms that this request is a request to itself (M0) by way of the ID value 2 contained in the request RqRIDID1S1, the high state of its own ID valid bit IDV, and that there is a match with the ID value 1 retained in the ID register circuit IDR.

The memory device M0 next generates a response RIDID1S1 comprised of a response start flag, the identification number ID value 1 of memory device M0, the ID read command RID, the master No. MID value 0, the read data length RDL value 2, the response No. ResN value 1 (a value equivalent to the request number ReqN value 1), completion information IDC with attached ID No., a boot device flag register BR value 0, and an end device flag register ER value 0.

The response RsRIDID1S1 is subsequently transferred to the response queue for response queue No. 0 within the response queue RsQo specified by the response queue No. QUN value 0, and sent to the information processing device CPU_CHIP from the response signal RsMux0.

The information processing device CPU_CHIP receives the response RsRIDID1S1 and learns that the attaching of an identification number ID of memory device M0 is finished by way of the completion information IDC with attached ID No. for ID value 1 of memory device M0 that is contained within the response RsRIDID1S1.

The information processing device CPU_CHIP also finds out from the 0 value in the boot device flag register, that the memory device M0 is not the memory device retaining the boot program. The memory device M0 finds by way of an end device flag register ER value of 0, that the memory device M0 is not the end (terminated) memory device. The information processing device CPU_CHIP sets a valid signal VALID value 1, an identification number ID value 1 of memory device M0, a boot device information BOOTDEV value 0 and an end device information ENDFLAG value 0, corresponding to the connection serial No. CNCT NO value 1, into the connection register CNNREG of the configuration circuit CONFIG.

Next, the information processing device CPU_CHIP transfers the multiplexed request RqRIDID2S2 containing the request start flag RqStF1 value 1, the identification number ID value 2, the ID read command RID, the master No. MID value 0, the request number ReqN value 2, and the response queue No. RQN value 0, to the memory device M0 by way of the request signal RqMux0.

The memory device M0 compares its own identification number ID value 1 retained in its own ID register IDR with the identification number ID number value 2 contained in the request RqRIDID2S2 and if there is a mismatch, transfers that request RqRIDID2S2 to the memory device M1.

The memory device M1 confirms that this (request RqRIDID2S2) is a request to itself (M1) by way of the ID value 2 contained in the request RqRIDID2S2, the high state of its own ID valid bit IDV, and that there is a match with the ID value 2 retained in the ID register circuit IDR.

Next, the memory device M1 generates a response RsRIDID2S2 comprised of a response start flag, an identification number ID value 2 of memory device M1, an ID read command RID, a master No. MID value 0, a read data length RDL value 2, a response number. ResN value 2 (value equivalent to the request number ReqN value 2), the completion information IDC with attached ID No., the boot device flag register BR value 1 and the end device flag register ER value 0.

The response RsRIDID2S2 is then transferred to the response queue for the response queue No. 0 within the response queue RsQo specified by the response queue No. QUN value 0, and the response signal RsMux1 then sends the response RsRIDID2S2 to the memory device M0. The memory device M0 receives the response RsRIDID2S2, and transfers the response RsRIDID2S2 by way of the response signal RsMux0 to the information processing device CPU_CHIP.

The information processing device CPU_CHIP receives the response RsRIDID2S2 and finds out that the attachment an identification number ID of memory device M1 has ended (terminated) by way of the completion information with attached ID No. and the ID value 2 of memory device M1 that are contained within this response RsRIDID2S2.

The information processing device CPU_CHIP also finds out from the 1 value in a boot device flag register that the memory device M1 is the memory device retaining the boot program; and further finds out by way of the end device flag register ER value of 0 that the memory device M1 is not the end (terminal) memory device.

The information processing device CPU_CHIP further sets a valid signal VALID value 1, an identification number ID value 2 of memory device M1, a boot device information BOOTDEV value 1 and an end (terminal) device information ENDFLAG value 0 corresponding to the connection serial No. CNCT NO value 2, into the connection register CNNREG of the configuration circuit CONFIG.

The information processing device CPU_CHIP next transfers the multiplexed request RqRIDID3S3 containing the request start flag RqStFL value 1, the identification number ID value 3, the ID read command RID, the master No. MID value 0, the request number ReqN value 3, and the response queue No. RQN value 0 to the memory device M0 by way of the request signal RqMux0.

The memory device M0 compares the identification number ID value 1 retained in its own ID register IDR with the identification No. number value 3 contained in the request RqRIDID3S3 and if a mismatch, transfers the request RqRIDID3S3 to the memory device M1.

The memory device M1 receives the request RqRIDID3S3, and compares the identification number ID number value 3 contained in the request RqRIDID3S3 with the identification number ID value 2 retained in its own ID register IDR and if a mismatch, transfers the request RqRIDID3S3 to the memory device M1.

The memory device M2 confirms that the request RqRIDID3S3 is a request to itself (M1) by way of the ID value 3 contained in the request RqRIDID3S3, the high state of its own ID valid bit IDV, and that there is a match with the ID value 3 retained in the ID register circuit IDR.

Next, the memory device M2 generates a response RsRIDID3S3 comprised of a response start flag, an identification number ID value 3 of memory device M2, an ID read command RID, a master No. MID value 0, a read data length RDL value 2, a response number. ResN value 3 (value equivalent to the request No. ReqN value 3), the completion information IDC with attached ID No., and the end device flag register ER value 1.

The response RsRIDID3S3 is then transferred to the response queue for the response queue No. 0 within the response queue RsQo specified by the response queue No. QUN value 0, and the response signal RsMux2 then sends the response RsRIDID3S3 to the memory device M1. The memory device M1 receives the response RsRIDID3S3, and sends the response RsRIDID3S3 by way of the response signal RsMux1 to the memory device M0. The memory device M0 receives the response RsRIDID3S3, and transfers the response RsRIDID3S3 by way of the response signal RsMux0 to the information processing device CPU_CHIP.

The information processing device CPU_CHIP receives the response RsRIDID3S3 and find out that the attachment of the identification number ID of memory device M2 has ended from the completion information with attached ID No. and the ID value 3 of memory device M2 contained in this response RsRIDID3S3.

The information processing device CPU_CHIP also finds out that the memory device M2 is not the memory device retaining the boot program by way of a boot device flag register value of 0; and further finds out that the memory device M2 is the end (terminal) memory device by way of the end device flag register ER value of 1.

The information processing device CPU_CHIP further sets a valid signal VALID value 1, an identification number ID value 3 of memory device M2, a boot device information BOOTDEV value 0 and an end (terminal) device information ENDFLAG value 1 corresponding to the connection serial No. CNCT NO value 3, into the connection register CNNREG of the configuration circuit CONFIG.

The information processing device CPU_CHIP finds out by way of the above information that attachment of the identification number ID in the end memory device M2 has ended.

The information processing device CPU_CHIP loads (reads out) the boot programs stored in the memory device M1 during the T4 period (BootRd) after the T3 period has ended. The boot program contains a program BTP0 for starting up the information processing device CPU_CHIP, and a program for assigning identification ID to each memory device, and a program for setting values in the various registers within the configuration circuit, and also contains values to set into these registers.

An example of the operation for reading out (loading) the boot program is described next.

The information processing circuit CPU0 within the information processing device CPU_CHIP read outs the boot program from the memory device M1 having the identification number ID value 2.

The information processing device CPU_CHIP first of all synchronizes the request RqACID2S4 containing the request start flag RqStFL value 1, the identification number ID value 2, the active command AC, the master No. MID value 0, the variable request length VREQL value 4, and the request No. ReqN value 4, the bank address BK0 and the page address ROW0 with the clock signal RqCK0, and then transfers it (RqACID2S4) from the request signal RqMux0 to the memory device M0.

The information processing device CPU_CHIP then synchronizes the request RqRDID2S5 containing the request start flag RqStFL value 1, the identification number ID value 2, the read command RD, the master No. MID value 0, the variable request length VREQL value 4, the request No. ReqN value 5, the response queue No. QUN value 0, the bank address BK0 and the column address COL0, and the read data length RDL value 32; with the clock signal RqCK0, and transfers the request RqRDID2S5 from the request signal RqMux0 to the memory device M0.

The memory device M0 stores the request RqACID2S4 and the request RqRDID2S5 from the information processing device CPU_CHIP, in that sequence in its own request queue control circuit RqCT. The memory device M0 compares the identification No. number value 2 contained in the request RqACID2S4 and the request RqRDID2S5, with the identification number ID value 1 retained in its own ID register IDR. If the results are not a match, then the memory device M0 decides that the request RqACID2S4 and the request RqRDID2S5 are not requests directed towards itself, and transfers them in sequence to the memory device M1 by way of the request signal RqMux1.

The memory device M1 stores the request RqRDID2S5 and the request RqACID2S4 from the memory device M0 into its own request queue control circuit RqCT. The request queue control circuit RqCT in the memory device M1 compares the identification number ID number value 2 contained in the request RqACID2S4 with the identification number ID value 2 that is retained in its own ID register IDR. If the two values are a match then the memory device M1 confirms that the request is directed towards itself, and transfers the request RqACID2S4 to the request queue RqQXI in memory device M1.

The bank active command AD, bank address BK0, and the page address ROW0 contained in the request RqACID2S4 are also transferred to the memory circuit Mem1; a one page portion (Though there are no particular restrictions, a 1 kbyte portion) of the boot program coupled to the page address 0 of the memory bank NV1BANK0 of memory circuit Mem1 is transferred to the data buffer DataLat.

Next, the request queue control circuit RqCT of memory device M1 compares the identification number ID number value 2 contained in the request RqRDID2S5 with the identification number ID value 2 that is retained in its own ID register IDR. If both values are a match then the memory request control circuit RqCT confirms that this is a request directed towards itself, and transfers the request RqRDID2S5 to the request queue RqQXI of memory device M1.

The read command RD, bank address BK0, column address COL0 and read data length RDL value 32 contained in the request RqRDID2S5 are transferred to the memory circuit Mem1; and a 32 byte portion of boot program is read out from the data buffer DataLat of the memory bank NV1BANK0 of memory circuit Mem1 with the column address 0 as the start address.

A response RsR4ID2S5 attached with a common response section CMNRESF comprised of a response start flag ResSt-Flag value 1, an identification number ID value 2, a read command RD, a master No. MID value 0, a read data length RDL value 32, and a response number ResN value 5 (value equivalent to request number. ReqN value 5) is generated in the 32 byte portion boot program that was loaded. The response RsR4ID2S5 is subsequently transferred to the response queue for the response queue No. 0 within the response queue RsQo specified by the response queue No. QUN value 0, and sent from the response signal RsMux1 to the memory device M0. This response RsR4ID2S5 is stored in the response queue circuit RsQp of memory device M0, and is input by way of the response signal RsMux0 to the information processing device CPU_CHIP.

The information processing device CPU_CHIP stores the response RsRID2S5 in the response queue RsQ. The information processing device CPU_CHIP can finds out by way of the read command RD and the ID value 2 contained in the response RsRID2S5 that the boot program was sent from the memory device M1.

The above operation allows the information processing device CPU_CHIP to read out a boot program of the required size from the memory device M1. Finally, the memory map in the memory module MEM is then reallocated (reassigned) in compliance with the boot program.

During the T5 period (SetCfg) after the end of the T4 period, the information processing device CPU_CHIP sets values into the respective registers within the configuration circuit CONFIG of the memory control circuit DCMC in compliance with the boot program.

Latency control flag information and response overlap tolerance time DOVLP information and so on are set in the latency control register. The information processing device CPU_CHIP sets information such as ID value information of the memory device managing the latency into the latency domain register LTDREG. Information such as timing information among requests and requests for operating the memory device M0 is set in the timing register M0TREG for the memory device M0. Information such as timing information among requests and requests for operating the memory device M1 is set in the timing register M1TREG for the memory device M1. Information such as timing information among requests and requests for operating the memory device M2 is set in the timing register M2TREG for the memory device M2. The data read-out latency from the memory devices M0, M1, and M2 is set in the latency register LTREG. There are two respective types of data read-out latency in the memory devices M0, M1 and M2. One type is the data read-out latency LatQue during readout of data directly from the response queue RsQo. The other type is the data read-out latency LatBank during readout of data from the memory circuit Mem0, Mem1, and Mem2. The information processing device CPU_CHIP sets which mode from among the bank open mode or the bank close mode to operate the memory devices M0, M1, and M2 in the operation mode register OMDREG.

In the T6 period (LatCfm) after the end of the T5 period, the information processing device CPU_CHIP measures the memory devices M0, M1, and M2 data read-out latency LatQue and LatBank in conformance with the boot program and verifies the latency value. During and after the T7 period (Idle) after the end of the T6 period, the memory module MEM sets to the idle state, and then sets to standby state to await a request from the information processing device CPU_CHIP.

By setting each memory device's own identification number ID in this way after power-on, the boot program can be quickly loaded (read-out) and the information processing device CPU_CHIP and memory module MEM can start up at high speed.

Register Settings: Connection Register CNNREG

FIG. 10 is a table showing an example of the values that were set in the preset connection register CNNREG in initializing sequence at power-on. Though there are no particular restrictions, a connection serial No. CNCT NO, a valid signal VALID, an identification number ID for each memory device and the information processing device CPU_CHIP, the boot device information BOOTDEV, and the end memory device information ENDFLAG are set in the connection register CNNREG. A valid signal VALID of 1 indicates that the boot device information BOOTDEV, and the end memory device information ENDFLAG are valid; and a valid signal VALID of 0 indicates that these are invalid. The connection serial No. CNCT NO is from 0 through 8, and signifies that the higher the number, the farther the connection position of information processing device CPU_CHIP. An identification number ID value corresponding to a 1 in the boot device information BOOTDEV is the identification number ID value of the memory device that stores the boot program. Moreover, an ID value corresponding to the end memory device information ENDFLAG of 1 is the identification number ID value of that end (terminal) memory device. An identification number ID value 0 for information processing device CPU_CHIP, a boot device information BOOTDEV value 0, and an end memory device information ENDFLAG value 0 are registered in the connection number CNCT NO of 0. Also, an identification number ID value 1 for memory device M0, a boot device information BOOTDEV value 0, and an end memory device information ENDFLAG value 0 are registered in the connection number CNCT NO of 1. An identification number ID value 2 for memory device M1, a boot device information BOOTDEV value 1, and an end memory device information ENDFLAG value 0 are registered in the connection number CNCT NO of 2. An identification number ID value 3 for memory device 2, a boot device information BOOTDEV value 0, and an end memory device information ENDFLAG value 1 are registered in the connection number CNCT NO of 3.

The above description indicates a serial connection utilized as the connection configuration such that the memory device M0 is connected subsequent to the information processing device CPU_CHIP, the memory device M1 is connected subsequent to the memory device M0, and the memory device M2 is connected subsequent to the memory device M1. The above description further indicates that the identification number ID value for the information processing device CPU_CHIP is set to 0, the identification number ID value of memory device M0 is set to 1, the identification number ID value of memory device M1 is set to 2, and the identification number ID value of memory device M2 is set to 3. By utilizing the connection register CNNREG in this way, the information processing device CPU_CHIP can manage which memory device will correspond to what identification number, and in what sequence it will be connected so that the information processing system of the present invention not only maintains reliability but can also swiftly carry out recovery processing when errors occur. The information processing device CPU_CHIP can also set new ID and update the connection register CNNREG not only for the initializing sequence at power-on, but also when coupled to detachable new memory cards or storage devices, etc.

Register Settings: Latency Control Register LCREG

FIG. 11 is a table that shows an example of values set in the latency control register LCREG by the initializing sequence at power-on.

Though there are no particular restrictions, the latency control register LCREG sets the latency control flag LCFLG and the response overlap tolerance time width DOVLP. When the latency control flag LCFLG is 1, the information processing device CPU_CHIP takes into account the time zone that the response input for the prior issued request, and the time zone that the response input for the next request that will be issued, to suppress the latency to within a fixed range and also enter a latency control mode to issue a request so that the data transfer rate will reach a maximum rate.

The response overlap tolerance time width DOVLP indicates the allowable overlap time zone in cases where time zones overlap each other for example when a response A is made to a request A to memory device M0; and in that case a response B is made to a request B next issued to a memory device other than M0; and the time zone for response A overlaps the time zone for response A from the first time position of A.

In other words, when the response overlap tolerance time width DOVLP is 0, at a latency control flag LCFLG of 1 (latency control mode), the information processing device CPU_CHIP sets each response to a minimum latency, and also outputs a request to the request signal RqMux0 to attain a high data transfer rate, in order that the start time position of the response A for the request A made to any of the memory devices (any of memory devices M0, M1, and M2) that was already issued to the request signal RqMux0, overlaps the time zone of the response B for the next issuing request B for the memory device (but a memory device different from that in request A) in the range within 0 clock cycle, or in other words so there is no overlap.

When the response overlap tolerance time width DOVLP is 4, and the latency control flag LCFLG is 1 (latency control mode), the information processing device CPU_CHIP makes the latency of each response as small as possible, and also outputs a request to the request signal RqMux0 to attain a high data transfer rate, in order that the start time position of the response A for the request A made to any of the memory devices (any of memory devices M0, M1, and M2) that was already issued to the request signal RqMux0 overlaps the time zone of the response B for the next issuing request B for the memory device (but a memory device different from that in request A) in the range within four clock cycles.

In other words, having a response overlap tolerance time width DOVLP and latency control flag LCFLG allows: (1) a latency clamp mode that protects the desired latency without fail though the data transfer rate will decrease somewhat and, (2) permits a latency variable mode capable of raising the data transfer rate though the latency becomes somewhat irregular. A detailed description of each of the operating mode is given later on.

If the latency control flag LCFLG is 0 then a latency non-controlled mode issues the next request without taking the response time zone for the previously issued request into account. Moreover in this embodiment, the latency clamp mode or the latency variable mode was set according to whether the response overlap tolerance time width DOVLP was set to 0 or set to a positive integer however the setting of the mode can also be attained by setting different flags or registers.

The example in the present embodiment showed a common response overlap tolerance time width DOVLP in the memory devices from 0 through 2, however the response overlap tolerance time width DOVLP may be in any of the memory devices.

Register Settings: Latency Domain Register LTDREG

FIG. 12 is a table showing an example of the values set in the latency domain register LTDREG set in the initializing sequence at power-on. Though there are no particular restrictions, a valid signal VALID, a master flag MFLAG corresponding to the identification number ID for the information processing device CPU_CHIP and each memory device, latency domain information LAT DMN are set in the latency domain register LTDREG. The master flag MFLAG corresponding to the identification number ID value, and the latency domain information LAT DMN are valid when the valid signal VALID is 1, and are invalid when 0. A master flag MFLAG of 1 indicates that the device such as the corresponding information processing device or memory device is the master device. A master flag MFLAG of 0 indicates that the device for the corresponding identification number ID is the slave device. A master device identification number ID set in the latency domain information LAT DMN indicates what master device controls what slave device, and manages the latency. In the present embodiment the identification number ID values in the latency domain register LTDREG are from 0 to 8. An identification number ID value of 0 is the identification number for the information processing device CPU_CHIP, and the master flag MFLAG value is set to 1, and the latency domain information LAT DMN value is set to 0. An identification number ID value of 1 is the identification number for the memory device M0, and the master flag MFLAG value is set to 0, and the latency domain information LAT DMN value is set to 0. An identification number ID value of 2 is the identification number for the memory device M1, and the master flag MFLAG value is set to 0, and the latency domain information LAT DMN value is set to 0. An identification number ID value of 3 is the identification number for the memory device M2, and the master flag MFLAG value is set to 0, and the latency domain information LAT DMN value is set to 0.

The latency domain register LTDREG (setting) shows that the information processing device CPU_CHIP becomes the master device, and controls the memory devices M0, M1, and M2 serving as the slave devices and that it controls the latency. The latency domain register LTDREG can in this way set the master device, and can specify the slave devices controlled by the master device so that the slave devices can be controlled as needed and the latency managed even in cases where a plurality of master devices such as the information processing device CPU_CHIP are serially coupled to slave devices such as the memory device M0, M1, and M2. Moreover the information processing device CPU_CHIP can set a new ID and can update the latency domain register LTDREG not only just during the initializing sequence at power-on but also when connected to new memory devices or memory cards, or storage devices such as SSD (Solid State Drive) and HDD (Hard Disk Drive).

Register Settings: Latency Register LTREG

FIG. 13 is a table that shows an example of values set in the latency register LTREG by the initializing sequence at power-on. A valid signal Valid, a latency LatQue, a latency LatBank, and a timeout latency LatTimeOut corresponding to the identification number ID for the information processing device CPU_CHIP and each memory device are set in the latency register LTREG.

A value of 1 for the valid signal Valid shows that the latency LatQue, a latency LatBank, and a timeout latency LatTimeOut for the corresponding identification number ID are valid, and a value of 0 indicates they are invalid. The latency LatQue indicates the read-out latency (time) from read-out of data directly from the response queue RsQ0 within the memory device per the read request from the information processing device CPU_CHIP, until the read-out data reaches the information processing device CPU_CHIP. The latency LatBank indicates the read-out latency from the read-out of data from the memory bank within the memory device in response to a read request from the information processing device CPU_CHIP, to the arrival of the read-out data at the information processing device CPU_CHIP. In the present invention, there are cases where the latency is updated by a request issued later, so the registered latency is the minimum latency (or the desired latency).

In the event that the data that was read-out in response to a read request from the information processing device CPU_CHIP exceeds the timeout latency LatTimeOut and is not input to the information processing device CPU_CHIP, the latency adjuster circuit LCHCK then decides that a timeout has occurred.

The identification number ID value 0 is an identification number for the information processing device CPU_CHIP. The information processing device CPU_CHIP serves as a master device to control each of the memory devices and so sets the latency LatQue value to 0, the latency LatBank value to 0, and the timeout latency LatTimeOut value to 0. The identification number ID value 1 is the identification number for the memory device M0. In this embodiment, the latency LatQue value is set to 8, the latency LatBank value is set to 12, and the timeout latency LatTimeOut value is set to 60.

The identification number ID value 2 is an identification number for the memory device M1. In this embodiment, the latency LatQue value is set to 20, the latency LatBank value is set to 24, and the timeout latency LatTimeOut value is set to 100.

The identification number ID value 3 is an identification number for the memory device M2. In this embodiment, the latency LatQue value is set to 32, the latency LatBank value is set to 36, and the timeout latency LatTimeOut value is set to 140.

Moreover, the information processing device CPU_CHIP can set the above latency LatQue, latency LatBank, and the timeout latency LatTimeOut for a new ID and can update the latency register LTREG, not only just during the initializing sequence at power-on but also when connected to new memory devices, memory cards, and storage devices, etc.

The information processing device CPU_CHIP can also set a new ID, can re-measure the new latency and set that measurement value in the latency register LTREG and update it when connected to new memory devices, memory cards, and storage devices such as SSD (Solid State Drive) and HDD (Hard Disk Drive).

Register Settings: Timing Register M0TREG

FIG. 14 is a table showing an example of the values set in the timing register M0TREG relating to the memory device M0 set by the initializing sequence at power-on. The valid signal Valid and timing information for the information processing device CPU_CHIP to control the memory device M0 are set in the timing register M0TREG. A valid signal Valid of 1 validates (enables) the timing information for controlling the memory device M0 and a setting of 0 indicates that information is invalid. Though there are no particular restrictions, a tm0RCD (minimum time interval for bank active command and read and write command in the same bank), a tm0RC (minimum time interval for bank active command and bank active command in the same bank), a tm0RRD (minimum time interval for bank active command and bank active command in different banks), a tm0RAS (minimum time interval for bank active command and pre-charge command in same bank), a tm0RP (minimum time interval for pre-charge command and bank active command in the same bank), a tm0RFC (refresh cycle minimum time), and so on are set in the timing register M0TREG. This minimum time interval indicates the number of clock cycles for clock operation of the information processing device CPU_CHIP. In this embodiment, the tm0RCD is set to 8 clock cycles, the tm0RC is set to 30 clock cycles, the tm0RRD is set to 4 clock cycles, the tm0RAS is set to 22 clock cycles, the tm0RP is set to 8 clock cycles, and the tm0RFC is set to 60 cycles. These values can moreover be changed to match the performance of the memory device M0.

Register Setting: Timing Register M1TREG

FIG. 15 is a table that shows an example of values set in the timing register M1TREG relating to the memory device M1 set in the initializing sequence at power-on. A valid signal Valid and timing information for allowing the information processing device CPU_CHIP to control the memory device M1 are set in the timing register M1TREG. A valid signal Valid of 1 enables (validates) timing information for controlling the memory device M1; and a setting of 0 indicates that information is invalid. A tm1RCD (minimum time interval for read and write command and bank active command in the same bank), a tm1RC (minimum time interval for bank active command and bank active command in the same bank), a tm1RD (minimum time interval for bank active command and bank active command in different banks), a tm1RAS (minimum time interval for bank active command and pre-charge command in the same bank), and a tm1RP (minimum time interval for pre-charge command and bank active command in the same bank) and so on are set in the timing register M1TREG. The minimum time interval indicates the number of clock cycles for clock operation of the information processing device CPU_CHIP. In the present embodiment, the tm1RCD is set to 8 clock cycles, the tm1RC is set to 60 clock cycles, the tm1RRD is set to 8 clock cycles, the tm1RAS is set to 44 clock cycles, and the tm1RP is set to 16 clock cycles. Moreover, these values can be changed to match the performance of the memory device M1.

Register Setting: Timing Register M2TREG

FIG. 16 is a table showing an example of the values set in the timing register M2TREG relating to the memory device M2 that was set, in the initializing sequence at power-on. A valid signal Valid and timing information for allowing the information processing device CPU_CHIP to control the memory device M2 are set in the timing register M2TREG. A valid signal Valid of 1 enables (validates) timing information for controlling the memory device M2; and a value of 0 indicates that information is invalid. A tm2RCD (minimum time interval for read and write command and bank active command in the same bank), a tm2RC (minimum time interval for bank active command and bank active command in the same bank), a tm2RD (minimum time interval for bank active command and bank active command in different banks), a tm2RAS (minimum time interval for bank active command and pre-charge command in the same bank), and a tm2RP (minimum time interval for pre-charge command and bank active command in the same bank) and so on set in the timing register M2TREG. The minimum time interval in this embodiment indicates the number of clock cycles for clock operation of the information processing device CPU_CHIP. The t2RCD is set to 10000 clock cycles, the tm2RC is set to 10062 clock cycles, the tm2RRD is set to 16 clock cycles, the tm2RAS is set to 10046 clock cycles, and the tm2RP is set to 32 clock cycles. These values can moreover be changed to match the performance of the memory device M2.

When the valid signal Valid for the timing information tm2RCD has become 0, the request including bank active commands ends, and a response containing command permit information to allow input of requests containing the next read and write commands, are issued from the memory device M2, and are input by way of the memory device M1 and the memory device M2 to the information processing device CPU_CHIP. The information processing device CPU_CHIP receives the response including that command permit information, and issues the next request to the memory device M2.

Register Setting: Operation Mode Register OMDREG

FIG. 17 is a table showing an example of the values that were set in the memory control mode register OMDREG in the initializing sequence at power-on. An valid signal Valid and control mode information OPMODE corresponding to the identification number ID for the information processing device CPU_CHIP and each memory device are set in the memory control mode register OMDREG. When the valid signal Valid is a 1, then the memory control mode information OPMODE corresponding to the identification number ID is valid, and if set to 0 then the information is invalid. Control methods for allowing the information processing device CPU_CHIP to control each memory can be set to three types of control modes which are the channel control mode, the bank open mode, and the bank closed mode.

A control mode information OPMOD that is at 1 indicates a setting to bank close mode, 2 indicates a setting to bank open mode, and 3 indicates a setting to the channel control mode. Bank close mode is a control method that does not utilize the response queue RsQo in each memory device, and the data buffer DataLat or sense amplifier SenseAmp in each memory bank within the memory device as a cache memory. If the control mode information OPMOD is set to the bank close mode then the memory control circuit DCMC sets the sense amplifier SenseAmp or data buffer DataLat in each memory bank within the memory device to a normally non-active state (page close) after reading or writing the data. The bank open mode is a control method utilizing the sense amplifier SenseAmp or data buffer DataLat in each memory bank within each memory device as a cache memory. When the control mode information OPMOD is set to bank open mode, the memory control circuit DCMC sets the sense amplifier Sense Amp or data buffer DataLat in each memory bank within the memory device to a normally active state after reading or writing the data, and continues to retain the data within the sense amplifier Sense Amp or data buffer DataLat (page open).

The hit decision circuit IDHT decides whether data for read and write request from the information processing circuit CPU0 through the CPU3 is present within the sense amplifier SenseAmp or data buffer DataLat in each memory bank (page hit decision). If there is a page hit then the data can be read out from the sense amplifier SenseAmp or data buffer DataLat without having to access the memory array circuits to allow high-speed data readout as well as low power consumption and a low latency.

The channel control mode is a control method that utilizes the response queue RsQo in each memory device, and the sense amplifier SenseAmp or data buffer DataLat in each memory bank within the memory device as the cache memory. If the control mode information OPMOD is set to the channel control mode then the memory control circuit DCMC sets the sense amplifier SenseAmp or data buffer DataLat in each memory bank of the memory device to the normally active state (page open) after data read-out or data writing. The hit decision circuit IDHT within the memory control circuit DCMC decides if the data for the read and write request from the information processing circuit CPU0 through the CPU3 is present within the response queue RsQo in each memory (channel hit decision) and also decides if the data is present within the sense amplifier SenseAmp or data buffer DataLat in each memory bank (page hit decision). In the event of a channel hit, the data can be directly read out from the response queue RsQo without having to access the sense amplifier SenseAmp or data buffer DataLat so that the data can be readout at low power and also low latency and at high speed. These control modes correspond to the applications that operate on the information processing CPU_CHIP, and may be set to any of the control modes.

In the present embodiment, the identification number ID value 1 is the identification number for the memory device M0, and the control mode information OPMODE is set to the channel control mode. In other words, this setting shows the information processing device CPU_CHIP can control the memory device M0 by way of the channel control mode. The identification number ID value 2 is the identification number for the memory device M1, and the control mode information OPMODE is set to the channel control mode. In other words, this shows that the information processing CPU_CHIP controls the memory device M1 by way of the channel control mode. The identification number ID value 3 is the identification number for the memory device M2, and the control mode information OPMODE is set to the channel control mode. In other words, this shows the information processing device CPU_CHIP controls the memory device M2 by way of the channel control mode. Moreover, the information processing device CPU_CHIP can set the above control mode information OPMODE for a new ID, and can update the operation mode register OMDRE not only in the initializing sequence at power-on but also when a memory device, or detachable memory card or storage device is newly connected.

Hit Decision Operation

FIG. 18 is tables showing an example of the read request that the memory control circuit DCMC outputs to each memory device based on the hit decision results obtained by the hit decision circuit IDHT, when the information processing device CPU_CHIP controls the memory devices M0, M1, and M2 by way of the channel control mode. If the decision results via the hit decision circuit IDHT area channel hit (CHANNEL HIT), then the memory control circuit DCMC outputs a request including a read command RD for reading out data from the response queue RsQo without utilizing results from the page hit decision. If the decision results via the hit decision circuit IDHT are a channel miss (CHANNEL MISS), and there is a page hit with the memory bank page in an open state (OPEN), then the memory control circuit DCMC outputs a request including a read command RD2 for reading out data from the sense amplifier SenseAmp or the data buffer DataLat. The data read out from the sense amplifier SenseAmp or the data buffer DataLat is transferred to the response queue RsQo, and finally transferred to the information processing device CPU_CHIP.

If the decision results via the hit decision circuit IDHT are a channel miss (CHANNEL MISS), and there is a page hit (PAGE HIT) with the memory bank page in an open state (OPEN), then the memory control circuit DCMC outputs a request including a read command RD2 for reading out data from the sense amplifier SenseAmp or the data buffer DataLat. The data read out from the sense amplifier SenseAmp or the data buffer DataLat is transferred to the response queue RsQo, and is finally transferred to the information processing device CPU_CHIP.

If the decision results via the hit decision circuit IDHT are a channel miss (CHANNEL NISS), and there is a page hit (PAGE HIT) with the memory bank page in the close state (CLOSE), then first of all the memory control circuit DCMC outputs a request including a bank active command for activating the memory bank, and opening the page. Next, the memory control circuit DCMC outputs a request including a read command RD2 for reading out data from the sense amplifier SenseAmp or the data buffer DataLat. The data read out from the sense amplifier SenseAmp or the data buffer DataLat is transferred to the response queue RsQo, and is finally transferred to the information processing device CPU_CHIP.

If the decision results via the hit decision circuit IDHT are a channel miss (CHANNEL MISS), and there is a page miss (PAGE MISS) with the memory bank page in the open state (OPEN), then first of all the memory control circuit DCMC outputs a request including a pre-charge command for deactivating the memory bank, and closing the page. Next, the memory control circuit DCMC outputs a request including a bank active command for activating the memory bank and opening the page. The memory control circuit DCMC next outputs a request including a read command RD2 for reading out data from the sense amplifier SenseAmp or the data buffer DataLat. The data read out from the sense amplifier SenseAmp or the data buffer DataLat is transferred to the response queue RsQo, and is finally transferred to the information processing device CPU_CHIP.

If the decision results via the hit decision circuit IDHT are a channel miss (CHANNEL MISS), and there is a page miss (PAGE MISS) with the memory bank page in the close state (CLOSE), then the memory control circuit DCMC first of all outputs a request including a bank active command for activating the memory bank, and opening the page. The memory control circuit DCMC outputs a request including a read command RD2 for reading out data from the sense amplifier SenseAmp or the data buffer DataLat next. The data read out from the sense amplifier SenseAmp or the data buffer DataLat is transferred to the response queue RsQo, and is finally transferred to the information processing device CPU_CHIP.

The example in the above description was for a request for reading out data to output from the memory control circuit DCMC to each memory device. Needless to say however, this same operation may be performed for data writing. When controlling by using the channel control mode in this way, not only can the sense amplifier SenseAmp or the data buffer DataLat in each memory bank within the each memory device be utilized as a cache memory but the response queue RsQ0 in each memory device can also be utilized as a cache memory so that the cache memory size is increased, the hit rate within the cache memory can also be raised, and each memory device can be operated at low latency and also at high speed with low power consumption.

Memory Map Description

Figure 19:
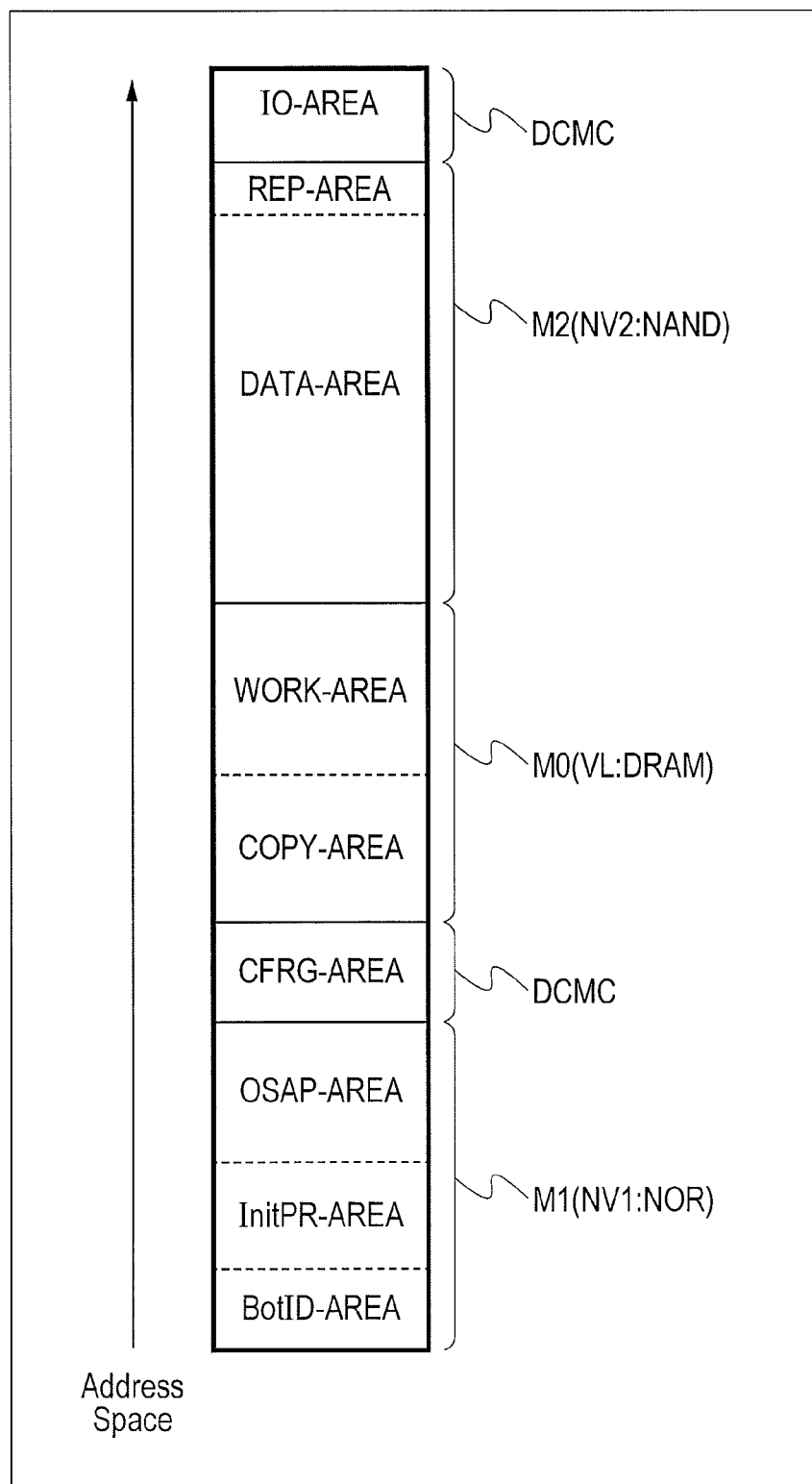
FIG. 19 is a block diagram showing one example of a memory map for the memory module MEM managed by the information processing device CPU_CHIP.

FIG. 19 is a block diagram showing an example of the memory map for the memory module MEM managed by the information processing device CPU_CHIP. Though there are no particular restrictions, in this embodiment the memory (storage) area of the memory device M0 is 1 Gbit, the memory area of memory device 1 is 1 Gbit, and the memory area of memory device M2 is 16 Gbit+512 Mbit (512 Mbit is the alternate area) in the memory module as an example for describing a typical memory map.

In the present embodiment, the memory device M0 is a volatile memory, and a dynamic random access memory utilizing dynamic random access memory cells. Moreover, the memory device M1 is a nonvolatile memory and is further a NOR type flash memory utilizing NOR type flash memory cells. The memory device M2 is a nonvolatile memory, and further is a NAND type flash memory utilizing NAND type flash memory cells.

The memory control circuit DCMC is subdivided into a configuration area and an IO area. Though there are no particular restrictions, the configuration area is comprised of a queue register QREG within the configuration circuit CONFIG of the memory control circuit DCMC, the latency register LTREG, the latency domain register LTDREG, the timing register M0TREG relating to the memory device M0, the timing register M1TREG relating to the memory device M1, the timing register M2TREG relating to the memory device M2, the control mode register OMDREG, and addresses corresponding to registers such as the IO register.

The IO area is an area for accessing detachable memory modules such as memory cards or SSD (Solid State Drives) or memory cards comprised of plural flash memories and controllers. The memory device M1 is grouped into a boot device ID storage area BotID-AREA, an initializing program area InitPR-AREA, and a program storage area OSAP-AREA. Boot device ID information is stored in the boot device ID storage area BotID-AREA. End terminal memory device ID information relating to the serially-connected memory module MEM is stored in the terminal device ID storage area End ID-AREA. The boot program is stored in the initializing program area InitPR-AREA. Operating systems and application programs are stored in the program storage area OSAP-AREA. The memory device M0 is grouped into a copy area COPY-AREA, and a work area WORK-AREA. The work area WORK-AREA is utilized as a work memory when executing programs, and the copy area COPY-AREA is utilized as a memory for copying programs and data from the memory device M1 and M2. The memory device M2 is grouped into a data area DATA-AREA and an alternate area REP-AREA. Data such as the music data, audio data, video data, and static image data are stored in the data area DATA-AREA.

The reliability of the flash memory deteriorates due to repeated updating and the data written in the write process may become different data at read-out and in rare instances data might not be written during updating. The alternate area REP-AREA is provided as a new area for updating this data that has become defective. The size of the alternate area REP-AREA may be decided by the reliability that the memory device M2 is able to guarantee.

Data Copy Operation Description

The read-out time for memory device M0 data is drastically short compared to the read-out time for the memory device M2. So if the required image data could be transferred from the memory device M2 to the memory device M0 in advance, then the information processing device CPU_CHIP would be capable of high-speed image processing. Though there are no particular restrictions, here we describe an example for transferring data from the memory device M2 to the memory device M0 in the case where the respective ID register values for the memory devices M0, M1, and M2 are set to 1, 2, and 3.

In order to read out data from the data area DATA-AREA in memory device M2, the information processing device CPU_CHIP sends a data read-out command for a one page portion of data (512 bytes of data+16 bytes of ECC code), and an identification number ID3 of memory device M2, to the memory module MEM. The memory module MEM reads out a one page portion of data from the data area DATA-AREA of memory device M2 according to the ID number 3 and one page portion data read-out command, attaches the identification number ID3, and sends it to the information processing device CPU_CHIP.

The information processing device CPU_CHIP performs error detection on the one page portion of data sent from the memory device M2. If there are no errors, then, in order to transfer the one page portion of data to the copy region COPY-AREA of the memory device M0, the information processing device CPU_CHIP sends the ID number 1 of memory device M0 and the one page data write command to the memory module MEM.

However if there was an error and correction performed, then in order to transfer the one page portion of data to the copy area COPY-AREA of the memory device M0, the information processing device CPU_CHIP sends an ID number 2 to the memory device M0 and a one page data write command to the memory module MEM. The memory module MEM then writes a one page portion of data into the copy area COPY-AREA of the memory device M0 according to the ID number 2 and the one page data write command.

Next, the transfer of data from the memory device M0 to the memory device M2 is described for the case where saving image data (written by the information processing device CPU_CHIP at high speed onto the memory device M0) as needed onto the memory device M2. In order to read out data from the copy area COPY-AREA of the memory device M0, the information processing device CPU_CHIP sends the identification number ID value 1 of the memory device M0 and the one page (512 Byte) data read-out command to the memory module MEM. The memory module MEM reads out a one page portion of data from the copy area COPY-AREA of the memory device M0, according to the identification number ID value 1 and the one page data read-out command, attaches an information number ID value 1, and sends it to the information processing device CPU_CHIP. In order to transfer the one page portion of data that was sent from the memory device M0, to the data area DATA-AREA in memory device M2, the information processing device CPU_CHIP sends the identification number ID value 3 of the memory device M2 and a one page portion of data write command to the memory module MEM.

When the memory module MEM sends the identification number ID value 3 and a one page portion of data write command to the memory device M2 by way of the memory devices M0 and M1, the memory device M2 writes the one page portion of data into its own data area DATA-AREA. The memory device M2 checks whether the data writing ended successfully or not, and if successful then terminates the write processing. If the writing was a failure, then the memory device M2 sends the identification number ID value 3 and the write error information, and notifies the information processing device CPU_CHIP of the write error information by way of the memory device M1 and the memory device M0. After receiving the identification number ID value 3 and the write error information, the information processing device CPU_CHIP sends the identification number ID value 3 of the memory device M2 and the one page data write command to the memory module MEM in order to write to a previously prepared new address in the alternate area REP-AREA into the memory device M2. When the memory module MEM sends the identification number ID value 3 and the one page data write command by way of the memory device M0 and M1 to the memory device M2, the memory device M2 then writes the one page portion into its own alternate area REP-AREA. Moreover, when this alternate processing was performed, the information processing device CPU_CHIP retains and manages the defective address and the address information as to what address was substituted with the defective address.

By obtaining an area within the memory device capable of copying a portion of the data in memory device M2, and transferring the data from the memory device M2 to the memory device M0 in advance as already described, the memory device M2 data can be read out at a speed equivalent to that of memory device M0, and can be processed at high speed by the information processing device CPU_CHIP. Further, when writing data onto the memory device M2, once the data has been written into the memory device M0, the data can be written back into the memory device M2 as needed so that the writing of data can proceed at high speed. Error detection and error correction is also performed during readout from the memory device M2, and alternative processing is performed on defective addresses that were not correctly performed during writing so that a high degree of reliability is maintained.

Description of the Request Issue Operation in the Memory Control Circuit DCMC

Figure 20:
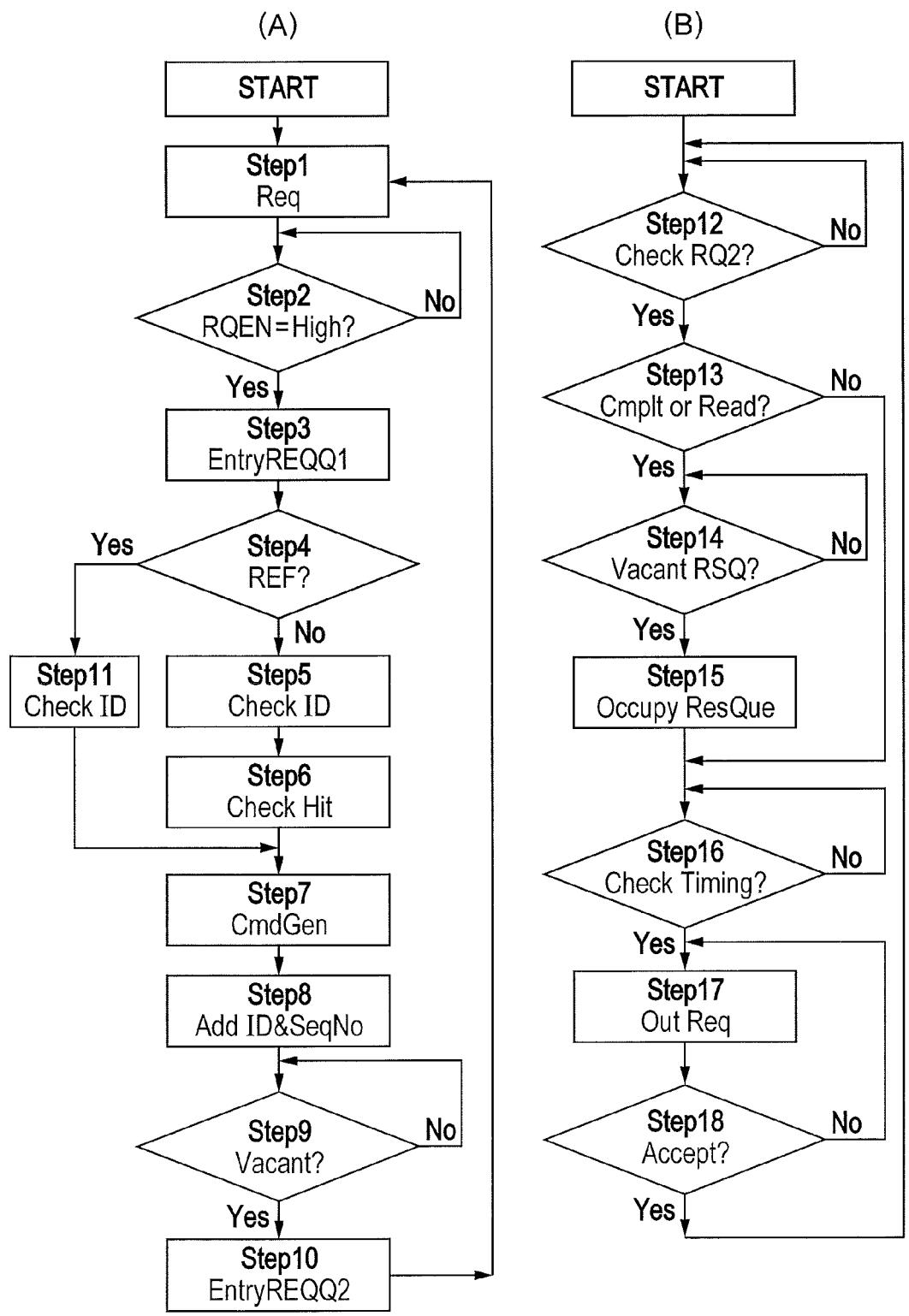
FIG. 20 is a flow chart showing one example of the operation for issue of a request from the memory control circuit to the memory module.

FIG. 20 is a flow chart showing one example of the operation by the memory control circuit DCMC for issuing a request from the memory control circuit to the memory module MEM. FIG. 20A is a flow chart showing one example of the operation through the entry of the request into the request queue REQQ2. FIG. 20B is a flow chart showing one example of the operation through to issuing to the memory module MEM, the request that was entered into the request queue REQQ2. The operations in FIG. 20A and FIG. 20B can be performed in parallel. The information processing circuits CPU0, CPU1, CPU2 and CPU3 issue read requests and write requests to the memory module MEM in order to execute the applications by way of the memory controller DCMC. Here, an example of the memory controller DCMC operation when the information processing circuit CPU2 issues a read request for reading out 32 bytes of data from the memory device M1 of memory module MEM to the memory controller DCMC is described next.

The arbiter circuit CARM sends a read request ReadReq32M1 to readout 32 bytes of data from the command signal CMD, and an address RAddM1 from the address signal ADD to the request queue REQQ1 (FIG. 20: Step 1). This request queue REQQ1 is comprised from a plurality of request queues. If there is a request queue with space available to receive the request, then the request enable signal RQEN sets to High state, and if there is no request queue with space available then request enable signal RQEN sets to Low state.

If the request enable signal REQEN is in the Low state (FIG. 20: Step 2), then the address RAddM1 and the read request ReadReq32M1 from the information processing circuit CPU2 are not stored in the request queue REQQ1. If the request enable signal REQEN is in the High state (FIG. 20: Step 2), then the address RAddM1 and the read request ReadReq32M1 are stored in the request queue REQQ1 (FIG. 20: Step 3).

The hit decision circuit IDHT checks whether there is a refresh request RefM0 from the refresh request circuit REF (FIG. 20: Step 4). If there is a refresh request, then this refresh request RefM0 is given priority and an identification number ID is decided (FIG. 20: Step 11). This refresh request RefM0 is a refresh request to the memory device M0 and so is judged that the identification number ID is 1 per the setting value in the configuration circuit CONFIG. If there is no refresh request RefM0, then an identification number ID is decided for the address RAddM1 and the read request ReadReq32M1 are stored in the request queue REQQ1 (FIG. 20: Step 5). Though there are no particular restrictions, the hit decision circuit IDHT compares the address RAddM1 and the memory map address value for the memory module MEM shown in FIG. 20, and decides the identification number ID. The address RAddM1 is an address in the program region OSAP-AREA so that the identification number ID value is judged as 2 and the read request ReadReq32M1 is judged as a request for the memory device M1.

Next, the hit decision circuit IDHT makes a page address hit decision for the address RAddM1 relating to the read request ReadReq32M1 to the memory device M1 (FIG. 20: Step 6). The method for deciding a page hit is shown below. The hit decision circuit IDHT contains the following three functions for making a channel hit decision and a page hit decision.

(1) The hit decision circuit IDHT links the bank address EBAdd and the page address EPAdd and the column address ECAdd in each memory device to an address relating to a request to each memory device from the information processing circuit CPU0 through CPU3.

(2) The hit decision circuit IDHT retains the bank address EBAdd and the page address EPAdd and the column address ECAdd for data within the response queue RsQo contained in each memory device.

(3) The hit decision circuit IDHT retains the valid signal Valid showing the activated memory bank, and the latest activated page address Padd per the memory banks in each memory device, and sends them to the command generator circuit COMGEN. A bank activation signal AValid that is High, indicates that the memory bank is activated, and a Low signal shows that the memory bank is not activated.

The hit decision circuit IDHT extracts the page address EPAddM1 and the column address ECAddM1, and the bank address EBAddM1 within the address RAddM1 relating to the read request ReadReq32M1 to the memory device M1.

The hit decision circuit IDHT next makes the channel hit decision and the page hit decision. In the channel hit decision, the hit decision circuit IDHT compares the bank address EBAdd, the page address EPAdd, and the column address ECAdd of data within the response queue RsQo contained in the memory device M1, with the page address EPAddM1, the column address ECAddM1, and the bank address EBAddM1 that were extracted by the hit decision circuit IDHT (FIG. 20: Step 6). If all of the addresses are a match, then a channel hit has occurred. If not all the addresses are a match, then a channel miss has occurred (FIG. 20: Step 6). Next, the page address EPAddM1 and the page address value PAddM1 corresponding to the memory bank in the memory device M1 specified by the bank address EBAddM1 are compared (FIG. 20: Step 6). If the page address value PAddM1 matches the page address EPAddM1 then a page hit has occurred. If the page address value PAddM1 does not match the page address EPAddM1 then a page address miss has occurred (FIG. 20: Step 6).

Next, the command generator circuit COMGEN receives the address RaddM1, the hit decision results and the bank activation signal AValid value and the decided identification number ID value 2, and the read request ReadReq32M1 to the memory device M1 from the hit decision circuit IDHT, and generates a command and address to the memory device M1 (FIG. 20: Step 7).

If the decision result was a channel hit, then the data required by the information processing circuit CPU2 is present within the response queue RsQo that was the channel hit for memory device M1. The data can be directly read out from this from this response queue RsQo so that a read command RD32$m$1, and a corresponding response queue number RsQNo and a column address ECAddM1 are generated (FIG. 20: Step 7). This response queue RsQo is comprised of a plurality of responses, and response queue number are utilized for identifying the respective response queues. The hit decision circuit IDHT in the memory control circuit DCMC manages these response queue identification numbers.

When the decision result is a channel miss, and furthermore the bank activation signal AValid is High at a page hit, then the data required by the information processing circuit CPU2 is present within the data buffer DataLat in the memory bank where the page address hit for the memory device M1 occurred, and the data can be directly read out from this data buffer DataLat so that a the read command RD32 and a corresponding bank address EBAddM1 and a column address ECAddM1 are generated (FIG. 20: Step 7). When the decision result is a channel miss, and furthermore the bank activation signal AValid is High at a page miss, then the data required by the information processing circuit CPU2 is not present within the data buffer DataLat in the memory bank where the page address miss for the memory device M1 occurred, so that the data buffer DataLat is invalidated, and new data is transferred to the data buffer DataLat, and a read-out operation from the data buffer DataLat is then required. Whereupon, first of all, the pre-charge command Pre, and the bank address EBAddM1 are generated in order to invalidate the data within the data buffer DataLat in the memory bank of the memory device M1 specified by the bank address EBAddM1 (FIG. 20: Step 7).

The bank active command AC and the bank address EBAddM1 and the page address EPAddm1 are next generated in order to transfer the new data to the data buffer DataLat. Finally, a read command RD32 and a column address ECAddM1 are generated in order to read out a 32 byte portion of data from the data buffer DataLat (FIG. 20: Step 7). Moreover, when the memory control circuit DCMC has output a request containing a bank address EBAddM1, and a pre-charge command Pre to the memory module MEM, then the bank activation signal AValid corresponding to the memory bank specified by the bank address EBAddm1 in the memory device M1 is updated to Low, and retained. Also, when the memory control circuit DCMC has output a request containing a bank active command AC and a bank address EBAddM1 and a page address EPAddM1 to the memory module MEM, then the bank activation signal AValid corresponding to the memory bank specified by the bank address EBAddM1 in the memory device M1 is updated to High, and retained, and furthermore the page address value PAddM1 is updated to a new page address EPAddm1, and retained.

When the decision result is a channel miss, and furthermore the bank activation signal AValid is low at a page miss, then the data buffer DataLat for the memory bank where the page address miss in the memory device M1 occurred is already invalidated. The bank active command AC and the bank address EBAddM1 and the page address EPAddM1 are then generated in order to transfer the new data to the data buffer DataLat. Finally, the read command RD32 and the column address ECAddM1 are generated in order to read out the 32 byte portion of data from the data buffer DataLat (FIG. 20: Step 7). Further, when the memory control circuit DCMC has output a request containing a bank active command AC and a bank address EBAddM1, and a page address EPAddM1 to the memory module MEM, then the bank activation signal AValid corresponding to the memory bank specified by the bank address EBAddM1 in the memory device M1 is updated to High and retained, and furthermore the page address value PAddM1 is updated to the new page address EPAddM1, and retained.

When the decision result is a channel miss and also a page address hit, at a bank activation signal AValid of Low, the data buffer DataLat of the memory bank where the page address hit in memory device M1 occurred is already invalidated. The bank active command ACm1 and the bank address EBAddM1 and the page address EPAddM1 are generated in order to transfer the new data to the data buffer DataLat. Finally, a read command RD32 and column address ECAddM1 are generated in order to readout a 32 byte portion of data from the data buffer DataLat (FIG. 20: Step 7). Moreover, when the memory control circuit DCMC outputs a request containing a bank active command ACm1, the bank address EBAddM1 and the page address EPAddM1 to the memory module MEM, then the bank activation signal AValid corresponding to the memory bank specified by the bank address EBAddM1 in the memory device M1 is updated to High, and retained.

Further, though there are no particular restrictions, the request start flag ReqStFlag, the identification number ID, the request number ReqN, the master number MID, and the variable request length VREQL are attached to the commands generated by the command generator circuit COMGEN itself, or the response queue number RsQNo and the address (bank address, page address and column address), or request containing the write data. Though there are no particular restrictions, the request is reorganized in the sequence of the request start flag ReqStFlg, the identification number ID, the command, the master number MID, the variable request length, the request number ReqN, the response queue number QUN, the data length RDL, the address (bank address, page address and column address), and write data.

The request start flag ReqStFlg, the identification number ID, the command, the master number MID, the variable request length VREQL, the request number ReqN, are a common request section CMNREQF possessing a common structure whatever the request, and though there are no particular restrictions, are a four byte portion fixed request length. Also, the response queue number QUN, the read data length RDL, the address (bank address, page address and column address), and write data are the variable request section VBREF having different request lengths according to their command, and whose request length is specified by the variable section request length VREQL.

A request start flag ReqStFlag that is High indicates that the request has begun, while a request start flag ReqStFlag that is Low indicates that the request has not been issued. The request number ReqN is a number for identifying the request that is reorganized by the command generator circuit COMGEN, and that is attached while counting upwards once at a time from 0 through 255. The variable request length VREQL shows the request length in byte units.

The request reorganization for requests containing the bank active command AC generated by the command generator circuit COMGEN, the read command RD, and addresses for their commands when the decision results here are a channel miss, and also a page address hit, and further with the bank activation signal AValid at Low is described next.

Attachment of the identification number ID and the request number ReqN is first of all described. Requests including a bank active command AC and bank address EBAddm1 and page address EPAddm1 not requiring a termination (end) notice are reorganized by the command generator circuit COMGEN in the sequence of a request start flag ReqStFlg value 1, and identification number ID value 2, a bank active command AC, a master number MID value 2, a variable request length VREQL value 3, a request number ReqN value 10 and an address (bank address and page address) not requiring a termination (end) notice; and are retained as the bank active request RqACID2S10 (FIG. 20: Step 8). This bank active request RqACID2S10 is also a request not requiring a termination (end) notice.

Next, the request containing the 32 byte data read command RD32 and the column address ECAddM1 are reorganized in the sequence of a request start flag ReqStFlg value 1, an identification number ID value 2, a read command RD32, a master number MID value 2, a variable request length VREQL value 3, a request number ReqN value 11, a response queue number QUN value 0, a data length RDL value 332, and an address (bank address and column address), and are retained as the read request RqRDID2S11 (FIG. 20: Step 8).

The request queue REQQ2 is configured of a plurality of request queues but if there are no request queues with available (open space) to receive that request (FIG. 20: Step 9), then that request is not stored, and awaits the arrival of a request with available (open space). If there is a request queue with available (open space) (FIG. 20: Step 9), then the bank active request RqACID2S10 and the read request RqRDID2S11 are stored into the request queue REQQ2 (FIG. 20: Step 10).

The request output circuit RQOUT receives the timing register M0TTREG setting values relating to the memory device M0 within the configuration circuit CONFIG, the timing register M1TREG setting values relating to the memory device M1, and the timing register M2TREG setting values relating to the memory device M2, and issues the request sent from the request queue REQQ2, to each memory device in the memory module MEM while complying with those timing setting values. During issue of the requests, the request output circuit RQOUT receives information from the latency control register LCREG or the latency register LTREG to regulate the issue of requests. The operation of these request output circuits is described later on in detail.

If the request output circuit RQOUT issues a request requiring a termination (end) notice to a specified memory device within the memory module MEM, then after the information processing device CPU_CHIP has received the termination (end) notice from that memory device, the request output circuit RQOUT issues the next request to that memory device. More specifically, when the request output circuit RQOUT issues a request requiring a termination (end) notice to the memory device M2 within the memory module MEM, then after the information processing device CPU_CHIP has received the termination (end) notice from the memory device M2, the request output circuit RQOUT issues the next request to the memory device M2.

Further, the request output circuit RQOUT can of course issue requests to other memory devices M0 and M1 while the information processing device CPU_CHIP is awaiting the termination (end) notice from the memory device M2.

The request output circuit RQOUT first of all checks the request queue REQQ2 to find if there are any requests being retained there (FIG. 20: Step 12). If there are requests retained within the request queue REQQ2 then the request output circuit RQOUT checks if that request is a read request or is a request requiring a termination (end) notice (FIG. 20: Step 13).

The bank active request RqACID2S10 is a request that does not require a termination (end) notice, and moreover is not a read request. The identification number ID value of the bank active request RqACID2S10 is 2 so the request output circuit RQOUT checks the timing information set in the timing registers relating to the memory device M1, and decides whether or not the bank active request RqACID2S10 can be issued (FIG. 20: Step 16).

If the bank active request RqACID2S10 is in a state that allows issuing it, then the request output circuit RQOUT immediately issues the bank active request RqACID2S10 to the memory module MEM (FIG. 20: Step 17).

If there is no request queue with available (empty) space in the request queue circuit RqQI in the memory device M0, then the memory device M0 cannot receive the bank active request RqACID2S10 that was issued. If the memory device M0 is in this way unable to receive the bank active request RqACID2S10 that was issued, then immediately after issue of the bank active request RqACID2S10, the memory device M0 sends a response ResNoAccID2S10 containing information called a Receive Impossible Information NOACC by way of the response signal RsMux0 to the response input circuit RSIN in the memory control circuit DCMC (FIG. 20: Step 18). This response ResNoAccID2S10 is comprised of a response start flag ResStFlag value 1, an identification number ID value 2, a bank active command ACm1, a master number MID value 2, a response number RESN value 10 (value equivalent to request number REQN value 10) and the Receive Impossible information NOACC. The response input circuit RSIN sends the responseResNoAccID2S10 that was input, to the request output circuit RQOUT.

The request output circuit RQOUT once again issues the bank active request RqACID2S10 by way of the identification number ID value 2, a bank active command ACm1, a master number MID value 2, a response number ResN value 10 and the Receive Impossible information NOACC (FIG. 20: Step 17). In the event, the memory device M0 has received the bank active request RqACID2S10 that was issued, then the memory device M0 does not send a response including the Receive Impossible information NOACC (FIG. 20: Step 18).

After the bank active request RqACID2S10 has been issued, and received by the memory device M0, the request output circuit RQOUT checks if the request is being retained in the request queue REQQ2 (FIG. 20: Step 12). If the request is being retained in the request queue REQQ2, then the request output circuit RQOUT checks if the request is a read request or a request requiring a termination (end) notice (FIG. 20: Step 13). The request RqRDID2S11 is a read request and therefore the request output circuit RQOUT checks by way of the queue management circuit QMGT whether or not there is a non-reserved response queue with open space available among the plurality of response queues contained within the response queue RESQ1 (FIG. 20: Step 14).

If there are no non-reserved response queues with open space available within the response queue RESQ1, then the request output circuit RQOUT awaits a non-reserved response queue with open space available (FIG. 20: Step 14). If there is a non-reserved response queues with open space available within the response queue RESQ1 then the identification number ID value 2 and the request number ReqQ value 11 within the read request RqRDID2S11 are copied into a portion of the open-space available response queue of response queue RESQ1 by way of the queue management circuit QMGT, and the required available (open space) response queue for accepting a response corresponding to the read request RqRDID2S11 is reserved in advance and procured (FIG. 20: Step 15).

The queue management circuit QMGT manages the number of response queues, the number of non-reserved available (open space) response queues, the number of reserved available (open space) response queues, and the number of occupied response queues with previously stored responses; within the response queue circuit held by the memory control circuit DCMC. Moreover, the queue management circuit QMGT also manages the number of response queues, the number of non-reserved available (open space) response queues, the number of reserved available (open space) response queues, and the number of occupied response queues with previously stored responses; within the response queue circuit RsQo and the response queue circuit RsQp held by the memory devices M0, M1, and M2.

Though there are no particular restrictions here, when there are non-reserved available (open space) response queues that were procured in advance, the queue management circuit QMGT reduces the number of non-reserved available (open space) response queues within the response queue RESQ1 by one; and increases the number of reserved available (open space) response queues by one. The queue management circuit QMGT also decreases the number of non-reserved available (open space) response queues within the response queue circuit RsQo corresponding to the identification number ID value 2 by one; and increases the number of reserved available (open space) response queues by one; and decreases the number of non-reserved available (open space) response queues within the response queue circuit RsQp in the memory device M0 that correspond to the identification number ID value 1; and increases the number of reserved available (open space) response queues by one (FIG. 20: Step 14).

Since the identification number ID value is 2 for the read request RqRDID2S11, the request output circuit RQOUT checks information such as the timing information set in the timing register M1TREG that relates to the memory device M1, and decides whether or not the read request RqRDID2S11 can be issued (FIG. 20: Step 16). If the read request RqRDID2S11 is in a state that allows its issue, then the request output circuit RQOUT conveys that issue of the read request RqRDID2S11 to the latency adjuster circuit LCHCK and issues the read request RqRDID2S11 to the memory module MEM (FIG. 20: Step 17).

This latency adjuster circuit LCHCK accepts the read request RqRDID2S11 issue notification from the request output circuit RQOUT, and starts management of the latency. If there are no available (open space) request queues in the request queue circuit RqQI of memory device M0, then the memory device M0 cannot receive the read request RqRDID2S11 that was issued. When the memory device M0 cannot receive the issued read request RqRDID2S11 in this way, then immediately after the read request RqRDID2S11 was issued, the memory device M0 sends a response ResNoAccID2S11 containing information called a Receive Impossible Information NOACC by way of the response signal RsMux0 to the response input circuit RSIN in the memory control circuit DCMC (FIG. 20: Step 18).

This response ResNoAccID2S11 is comprised of a response start flag ResStFlag value 1, an identification number ID value 2, a read command RD, a master number MID value 2, a response number ResN value 11 (value equivalent to request number ReqN value 11) and the Receive Impossible information NOACC. The response input circuit RSIN sends the response ResNoAccID2S11 that was input to the request output circuit RQOUT. The request output circuit RQOUT once again notifies the latency adjuster circuit LCHCK of the issue of the read request RqRDID2S11 by way of the identification number ID value 2, the read command RD, a master number MID value 2, a response number ResN value 11 and the Receive Impossible information NOACC contained in the response ResNoAccID2S11, and issues the read request RqRDID2S11 to the memory module MEM (FIG. 20: Step 17).

The latency adjuster circuit LCHCK receives notification of the re-issue of the read request RqRDID2S11 from the request output circuit RQOUT, and invalidates all latency values measured thus far, and starts the latency measurements from the beginning. When the memory device M0 has received the issued read request RqRDID2S11, then the memory device M0 does not send a response containing the Receive Impossible information NOACC (Step 18).

The response RsRDID2S11 containing the data that was readout in the request RqRDID2S11, is input to the response input circuit RSIN in the memory control circuit DCMC; and when stored in the response queue RESQ1, the queue management circuit QMGT counts the number of occupied response queues stored within the response queue RESQ1, the number of non-reserved available (open space) response queues and the number of reserved available (open space) response queues within the response queue RESQ1, and updates that information.

Furthermore, when the response RsRDID2S11 contained in the response queue RESQ1 is sent to the information processing circuit CPU2, the queue management circuit QMGT deletes the response RsRDID2S11 retained in the response queue RESQ1, and once again counts the number of occupied response queues stored within the response queue RESQ1, the number of non-reserved available (open space) response queues and the number of reserved available (open space) response queues within the response queue RESQ1, and updates that information.

An example of the operation when retaining a bank active request RqACwithCompletion ID3S10 requiring termination (end) notification and a read request RqRDID3S11 in the request queue REQQ2 is described next.

The bank active request RqACwithCompletion ID3S10 contains a request start flag ReqStFlg value 1, an identification number ID value 3, a bank active command ACwithCompletion requiring termination (end) notification, a master number MID value 2, a variable request length VREQL value 3, a request number ReqN value 10, and an address (bank address and page address).

The read request RqRDID3S11 contains a request start flag ReqStFlg value 1, an identification number ID value 3, a read command RD32, a master number MID value 2, a variable request length VREQL value 3, a request number ReqN value 11, a response queue number QUN value 0, data length RDL value 32, and an address (bank address and column address).

The request output circuit RQOUT first of all checks the request queue REQQ2 to find if there are any requests being retained there (FIG. 20: Step 12). If there are requests retained within the request queue REQQ2 then the request output circuit RQOUT checks if that request is a read request or is a request requiring a termination (end) notice (FIG. 20: Step 13).

The bank active request RqACwithCompletionID3S10 is a request that requires a termination (end) notice and therefore the request output circuit RQOUT checks by way of the queue management circuit QMGT whether there are any non-reserved available (open space) response queues within the plurality of response queues contained with the response queue RESQ1 (FIG. 20: Step 14).

If there are no non-reserved available (open space) response queues within the response queue RESQ1, then the request output circuit RQOUT waits for a non-reserved available (open space) response queue (FIG. 20: Step 14). If there is a non-reserved available (open space) response queue within the response queue RESQ1 then the identification number ID value 3 and the request number ReqN value 10 within the bank active request RqACwithCompletionID3S10 are copied into a portion of the available (open space) response queue of the response queue RESQ1 by way of the queue management circuit QMGT, and the required available (open space) response queue is reserved and procured in advance in order to accept the response ACwithCompletionID3S10 containing termination (end) notification regarding the bank active request RqACwithCompletionID3S10 (FIG. 20: Step 15).

The bank active request RqACwithCompletionID3S10 has an identification number ID value of 3 so the request output circuit RQOUT checks the timing information set in the timing register M2TREG that relates to the memory device M2, and decides that the bank active request RqACwithCompletionID3S10 can be issued (FIG. 20: Step 16).

Next, if the bank active request RqACwithCompletionID3S10 is in a state allowing it to be issued, then the request output circuit RQOUT immediately issues the bank active request RqACwithCompletionID3S10 to the memory module MEM (FIG. 20: Step 17).

If there are no available (open space) request queues in the request queue circuit RqQI in memory device M0, then the memory device M0 cannot receive the issued bank active request RqACwithCompletionID3S10. If the memory device M0 cannot in this way receive the issued bank active request RqACwithCompletionID3S10, then the memory device M0 sends a response ResNoAccID3S10 containing information called a Receive Impossible Information NOACC by way of the response signal RsMux0 to the response input circuit RSIN in the memory control circuit DCMC (FIG. 20: Step 18). The response ResNoAccID3S10 is comprised of a response start flag ResStFlag value 1, an identification number ID value 2, a bank active command ACwithCompletion, a master number MID value 3, a response number ResN value 10 (value equivalent to request number ReqN value 10) and the Receive Impossible information NOACC. The response input circuit RSIN sends the response ResNoAccID3S10 that was input, to the request output circuit RQOUT. The request output circuit RQOUT once again issues the bank active request RqACwithCompletionID3S10 by way of the identification number ID value 3, the bank active command ACwithCompletion, a master number MID value 3, a response number ResN value 10 and the Receive Impossible information NOACC contained in the response ResNoAccID3S10 (FIG. 20: Step 17). In the event, that the memory device M0 has received the issued bank active request RqACwithCompletionID3S10, then the memory device M0 does not send a response including the Receive Impossible information NOACC (FIG. 20: Step 18).

After the bank active request RqACwithCompletionID3S10 has been issued and received by the memory device M0, the request output circuit RQOUT checks if the request is being retained in the request queue REQQ2 (FIG. 20: Step 12). If the request is being retained in the request queue REQQ2, then the request output circuit RQOUT checks if the request is a read request or a request requiring a termination (end) notice (FIG. 20: Step 13). The read request RqRDID3S11 is a read request and therefore the request output circuit RQOUT checks by way of the queue management circuit QMGT whether or not there is a non-reserved response queue with open space available among the plurality of response queues contained within the response queue RESQ1 (FIG. 20: Step 14).

If there are no non-reserved response queues with available (open space) within the response queue RESQ1, then the request output circuit RQOUT awaits a non-reserved response queue with available (open space) (FIG. 20: Step 14). If there are non-reserved response queues with available (open space) within the response queue RESQ1, then the identification number ID value 2 and the request number ReqQ value 11 within the read request RqRDID2S11 are copied into a portion of the available (open space) response queue of response queue RESQ1 by way of the queue management circuit QMGT, and the required available (open space) response queue for accepting a response corresponding to the read request RqRDID2S11 is reserved in advance and procured (FIG. 20: Step 15).

The identification number ID value is 3 for the read request RqRDID3S11 so the request output circuit RQOUT checks if the response ACwithCompletionResID3S10 containing termination (end) notification information corresponding to the bank active request RqACwithCompletionID3S10 to the memory device M2 is input in the response input circuit RSIN, and if it is retained within the response queue RESQ1 (FIG. 20: Step 16).

If the response ACwithCompletionResID3S10 is being retained within the response queue RESQ1, then the request output circuit RQOUT notifies the latency adjuster circuit LCHCK that the issue of the read request RqRDID3S11 and issues the read request RqRDID3S11 to the memory module MEM (FIG. 20: Step 17).

The request output circuit RQOUT also notifies the queue management circuit QMGT, that the read request RqRDID3S11 was issued to the memory module MEM. The queue management circuit QMGT deletes the response ACwithCompletionResID3S10 retained in the response queue RESQ1, and once again counts the number of occupied response queues stored within the response queue RESQ1, the number of non-reserved available (open space) response queues and the number of reserved available (open space) response queues (within the response queue RESQ1) and updates that information.

The latency adjuster circuit LCHCK accepts the read request RqRDID3S11 issue notification from the request output circuit RQOUT, and starts the latency management. If there are no available (open space) response queues in the request queue circuit RqQI of the memory device M0, then the memory device M0 cannot receive the issued read request RqRDID3S11. When the memory device M0 cannot receive the issued read request RqRDID3S11 in this way, then immediately after the read request RqRDID3S11 was issued, the memory device M0 sends a response ResNoAccID3S11 containing information called a Receive Impossible Information NOACC by way of the response signal RsMux0 to the response input circuit RSIN in the memory control circuit DCMC (FIG. 20: Step 18)

This response ResNoAccID3S11 is comprised of a response start flag ResStFlag value 1, an identification number ID value 3, a read command RD32, a master number MID value 3, a response number ResN value 11 (value equivalent to request number ReqN value 11) and the Receive Impossible Information NOACC. The response input circuit RSIN sends the response ResNoAccID3S11 that was input to the request output circuit RQOUT.

The request output circuit RQOUT once again notifies the latency adjuster circuit LCHCK of the issue of the read request RqRDID3S11 by way of the identification number ID value 3, the read command RD32, a master number MID value 3, a response number ResN value 11 and the Receive Impossible Information NOACC contained in the response ResNoAccID3S11, and issues the read request RqRDID3S11 to the memory module MEM (FIG. 20: Step 17).

The latency adjuster circuit LCHCK receives notification of the re-issue of the read request RqRDID3S11 from the request output circuit RQOUT, and invalidates all latency values measured thus far, and once again starts the latency measurements from the beginning. When the memory device M0 has received the issued read request RqRDID3S11, then the memory device M0 does not send a response containing the information referred to as the Receive Impossible information NOACC (FIG. 20: Step 18).

Data Transfer Between the Information Processing Device CPU_CHIP and the Memory Module MEM The data transfer operation between the information processing device CPU_CHIP and the memory module MEM is described next while referring to FIG. 1 through FIG. 8, and FIG. 21 through FIG. 22.

Figure 21:
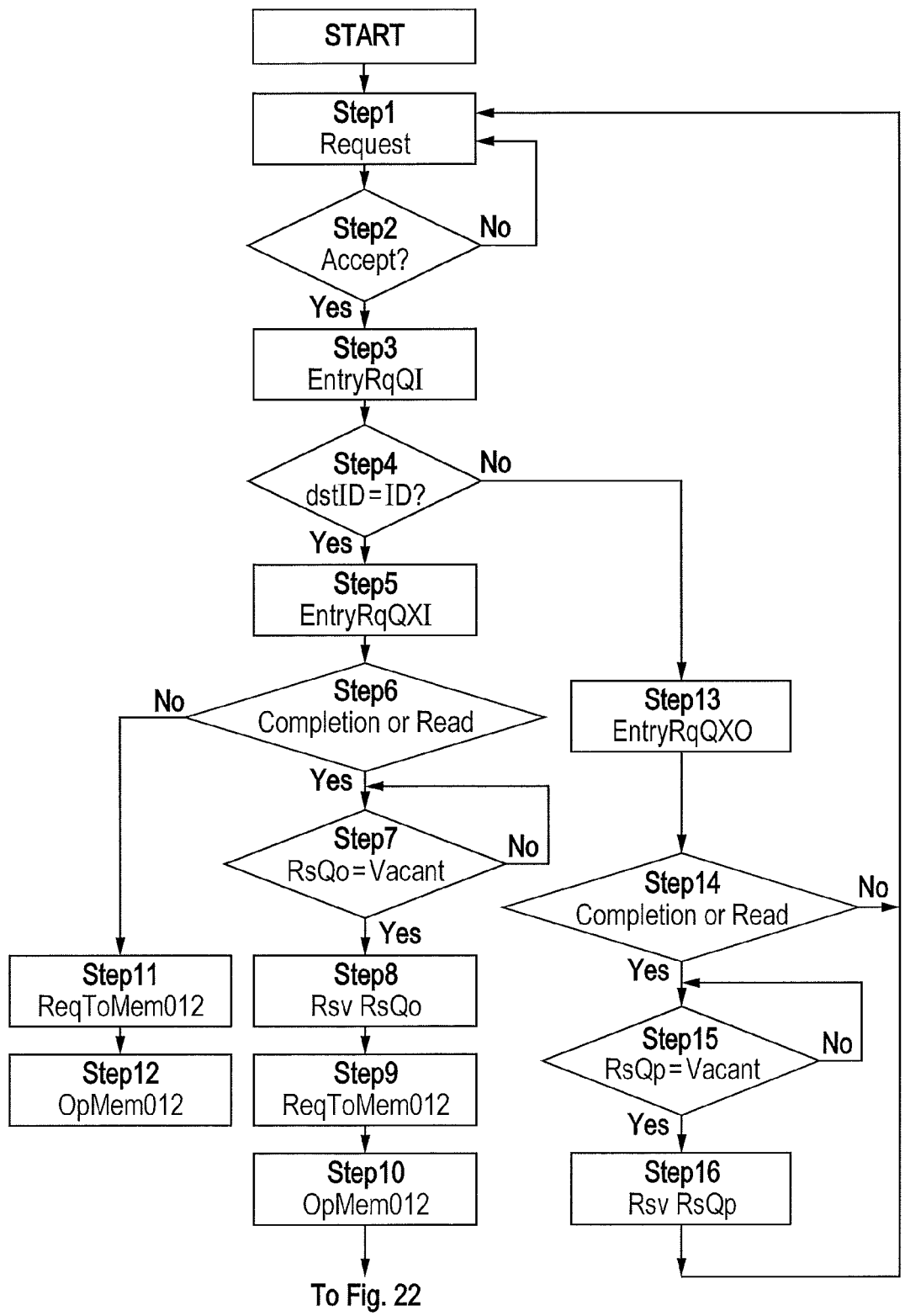
FIG. 21 is a flow chart showing one example of the operation involved in a request from the information processing device to the memory module.
Figure 22:
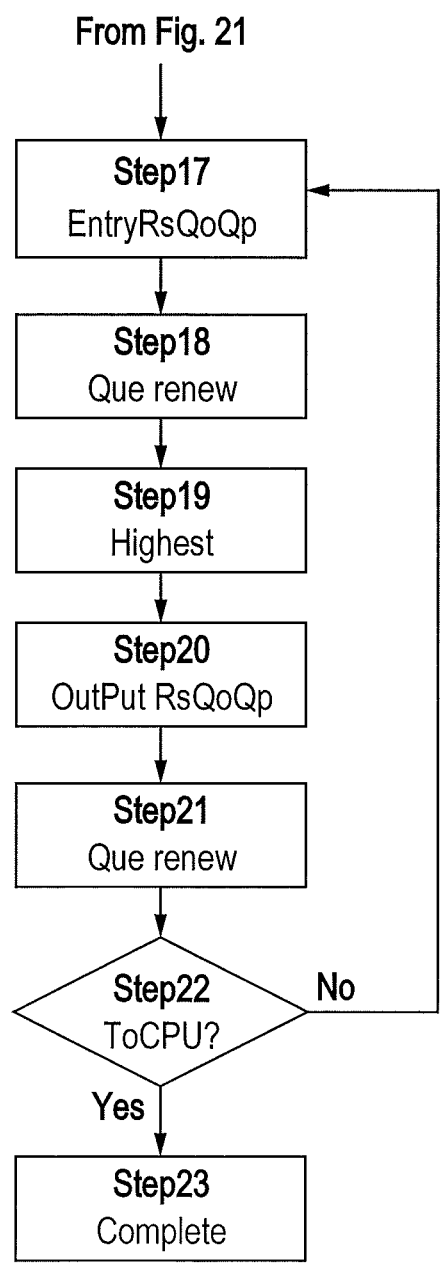
FIG. 22 is a flow chart showing one example of the operation for the response from the memory module to the information processing device.

FIG. 21 is a flow chart showing one example of the operation involved in a request from the information processing device CPU_CHIP to the memory module MEM. FIG. 22 is a flow chart showing one example of the operation for the response from the memory module MEM to the information processing device CPU_CHIP.

Prior to describing the operation of the present embodiment, the status of each register which is a precondition for operation is first of all described. The ID register IDR values for the memory devices M0, M1, and M2 are respectively set to 1, 2, and 3. Each register in the configuration circuit CONFIG is set to the values shown in FIG. 10 through FIG. 18. The number of request queues in the request queue circuit REQQ2 of the memory control circuit DCMC is 12, and these request queues are all in the available (open) state. The number of request queues in the response queue circuit RESQ1 of the memory control circuit DCMC is 24, and these response queues are all in the available (open) state. The number of request queues in the request queue circuit RqQI of the memory device M0 is 12, the number of request queues in the request queue circuit RqQXI is 4, and the number of request queues for the request queue circuit RqQXO is 8, and these request queues are all in the available (open) state. Moreover, the number of request queues in the response queue circuit RsQo of memory device M0 is 8, and the number of response queues in the response queue circuit RsQp is 16, and these response queues are all in the available (open) state. Also, the number of request queues in the request queue circuit RqQI of the memory device M1 is 8, the number of request queues in the request queue circuit RqQXI is 4, the number of request queues for the request queue circuit RqQXO is 4, and there are no requests entered in these request queues. The number of request queues for the response queue circuit RsQo of memory device M1 is 8, the number of response queues for the response queue circuit RsQp is 8, and these response queues are all in the available (open) state. The number of request queues in the request queue circuit RqQI for memory device M2 is 4, the number of request queues in the request queue circuit RqQXI is 4, the number of request queues for the request queue circuit RqQXO is 4, and there are no requests entered in these request queues. The number of request queues for the response queue circuit RsQo of memory device M2 is 8, the number of response queues for the response queue circuit RsQp is 8, and these request queues are all in the available (open) state. Further, all memory banks of memory devices M0, M1, and M2 are in the inactive state. Requests to the memory devices M0, M1, and M2 are requests from the information processing circuit CPU3 of the information processing device CPU_CHIP. Requests from the information processing device CPU_CHIP to the memory devices M0, M1, and M2 are comprised of a four bytes common request section CMNREQF, and a maximum 36 byte variable request section VBREQF. The common request section CMNREQF is comprised of a request start flag ReqStFlg, an identification number ID, a command, a master number MID, a variable (section) request length VREQL, and a request number REQN. The variable request section VBREQF is comprised of a four byte address and a maximum 32 bytes of write data. The variable (section) request length VREQL expresses the length of the variable request section VBREQF in bytes. The single request queue contained in the memory devices M0, M1, and M2 is capable of storing the four byte common request section CMNREQF, and a variable request section VBREQF with a maximum of 36 bytes. The responses to the information processing device CPU_CHIP from the memory devices M0, M1, and M2 are comprised of a four byte common response section CMNRESF, and a maximum 32 bytes of read data. The common response section CMNRESF is comprised of a response start flag ResStFlg, an identification number ID, a command, a master number MID, a read data length RDL, and a response number ResN. The read data length RDL expresses the read data length in byte units. The single response queue contained in the memory devices M0, M1, and M2 is capable of storing the four byte common request section CMNRESF, and a maximum 32 bytes of read data.

An example of data transfer between the information processing device CPU_CHIP and the memory device M1 in the present embodiment is described next. The transfer of data between the information processing device CPU_CHIP and the memory device M0 or M2 is the same operation so a description is omitted here.

The memory control circuit DCMC for the information processing device CPU_CHIP utilizes the request signal RqMux0 to synchronize: the request start flag ReqStFlag value 1, the identification number ID value 2, the bank active command AC not requiring an termination (end) notice, a master number MID value 3 (master number ID of information processing circuit CPU3), a variable request length VREQL value 4, a request number ReqN value 15, a bank address BK0, and a multiplexed page address Row 63 request RqACID2S15 with a clock signal RqCK0, and transfers this to the memory device M0 (FIG. 21: Step 1). When the request RqACID2S15 is input to the memory device M0, the queue check circuit RQQM makes a check if there are available (open space) request queues within the request queue circuit RqQI (FIG. 21: Step 2). If there are available (open space) request queues within the request queue circuit RqQI, then the memory device M0 stores the request RqACID2S15 from the information processing device CPU_CHIP in its own request queue circuit RqQI (FIG. 21: Step 3). If there is no available (open space) request queue within the request queue circuit RqQ1, then the memory device M0 cannot receive the request RqACID2S15, and so immediately after the request RqACID2S15 was issued, the memory device M0 sends a response ResNoAccID2S15 containing information called a Receive Impossible Information NOACC by way of the response signal RsMux0 to the response input circuit RSIN in the memory control circuit DCMC. The response ResNoAccID2S15 is comprised of a response start flag ResStFlag value 1, an identification number ID value 2, a bank active command AC, a master number MID value 3, a response number RESN value 15 (value equivalent to the request number REQN value 15) and the Receive Impossible Information NOACC.

The response input circuit RSIN sends the response ResNoAccID2S15 that was input, to the request output circuit RQOUT. The request output circuit RQOUT once again issues the request RqACID2S15 by way of the identification number ID value 2, the bank active command AC, the master number MID value 3, the response number RESN value 15 and Receive Impossible Information NOACC that are contained within the response ResNoAccID2S15 (FIG. 21: Step 1). The ID comparator circuit CPQ subsequently compares the ID value 2 contained in the request RqACID2S15 that was entered into the request queue of the request queue circuit RqQI, with the ID value 1 retained in the ID register circuit IDR (FIG. 21: Step 4). If the comparison results are a mismatch, then the request RqACID2S15 is transferred to the request queue circuit RqQXO (FIG. 21: Step 13).

A check is next made on whether the request stored by the request queue circuit RqQXO is a read request containing a read command or a request requiring a termination (end) notice (FIG. 21: Step 14). The request RqACID2S15 does not include a read command and moreover is not a request requiring a termination (end) notice and so the memory device M0 transfers the request RqACID2S15 to the memory device M1 by way of the request signal RqMux1 (FIG. 21: Step 1). When the request RqACID2S15 is input into the memory device M1, then the queue check circuit RQQM of the memory device M1 checks for available (open space) request queues within the request queue circuit RqQI (FIG. 21: Step 2).

In the event there are available (open) request queues within the request queue circuit RqQI, then the memory device M1 stores the request RqACID2S15 from the memory device M0 into a request queue of its own request queue circuit RqQI (FIG. 21: Step 3). If there is no available (open space) request queues within the request queue circuit RqQI, then the memory device M1 cannot receive the request RqACID2S15 and so immediately after the request RqACID2S15 was issued, the memory device M1 sends the response ResNoAccID2S15 containing information called a Receive Impossible Information NOACC by way of the response signal RsMux1 to the memory device M0.

The memory device M0 once again issues the request RqACID2S15 by way of the identification number ID value 2, the bank active command AC, the master number MID value 3, the response number RESN value 15 and Receive Impossible Information NOACC that are contained within the response ResNoAccID2S15 (FIG. 21: Step 1).

The ID comparator circuit CPQ of the memory device M1 subsequently compare the ID value 2 contained in the request RqACID2S15 that was entered into the request queue of the request queue circuit RqQI, with the ID value 2 retained in the ID register circuit IDR (FIG. 21: Step 4).

If the comparison results are a match, then the request RqACID2S15 is transferred to the request queue circuit RqQXI (FIG. 21: Step 5). Next a check is made on whether the request stored in the request queue circuit RqQXI is a request containing a read command or a request requiring a termination (end) notice (FIG. 21: Step 6). If the request RqACID2S15 does not contain a read command, and further does not contain a request requiring a termination (end) notice, then the request queue circuit RqQXI transfers the request RqACID2S15 to the memory circuit Mem 1 (FIG. 21: Step 11). The memory circuit Mem 1 operates according to the request RqACID2S15 (FIG. 21: Step 12). More specifically, the command decoder CmdDec in the memory circuit Mem 1 decodes the bank active command BA, and the control circuit Cont Logic selects the memory bank NV1BANK0, the page address 63 is stored in the page address buffer PadLat of the memory bank NV1BANK0, and is input to the page decoder PageDec. The memory cell coupled to the page address 63 within the memory array circuit NV1Bk0 is then activated, and though there are no particular restrictions, a one kByte portion of data is transferred to the data buffer DataLat (FIG. 21: Step 12).

After transfer of the request RqACID2S15, from the 16 clock cycle onwards, the memory control circuit DCMC in the information processing device CPU_CHIP performs the operation to transfer the 32 byte data request RqRDID2S16 containing the read command RD 32 (comprised of a request start flag ReqStFlag value 1, an identification number ID value 2, a 32 byte data read command RD32, a master number MID value 3 (master number ID of information processing circuit CPU3, variable request length VREQL value 4, request number ReqN value 16, bank address BK0 and column address Col32) to the memory device M0 according to the value 16 set of tm1RCD set in the timing register M1TREG (minimum time period between the bank active command and the read and write commands).

First of all, a response number ResN value 16 equivalent to the request number ReqN value 16 and the identification number ID value 2 within the request RqRDID2S16 are copied into a portion of the available (open space) response queue within the response queue RESQ1, and the available (open space) response queue required for accepting a response ResRD32ID2S16 corresponding to the request RqRDID2S16 is procured in advance.

Next, the request output circuit RQOUT synchronizes the RqRDID2S16 with the clock signal RqCK0 by way of the request signal RqMux0, and transfers it to the memory device M0 (FIG. 21: Step 1). The request output circuit RQOUT also transfers the request number ReqN value 16 and the identification number ID value 2 within the request RqRDID2S16 to the latency adjuster circuit LCHCK, and retains them. Next, the latency adjuster circuit LCHCK starts measuring the latency relating to the response ResRD32ID2S16 corresponding to the request RqRDID2S16 simultaneous with transfer of the request RqRDID2S16 (FIG. 21: Step 1). When the request RqRDID2S16 is input to the memory device M0, the queue check circuit RQQM checks if there is an available (open space) request queue within the request queue RqQI (FIG. 21: Step 2).

If there is an available (open space) request queue within the request queue circuit RqQI, then the memory device M0 stores the request RqRDID2S16 from the information processing device CPU_CHIP in the request queue of its own request queue circuit RqQI (FIG. 21: Step 3). If there is no available (open space) request queue within the request queue circuit RqQ1, then the memory device M0 cannot receive the request RqRDID2S16, and so immediately after the request RqRDID2S16 was issued, the memory device M0 sends a response ResNoAccID1S16 containing information called a Receive Impossible Information NOACC by way of the response signal RsMux0 to the response input circuit RSIN in the memory control circuit DCMC.

The response input circuit RSIN sends the response ResNoAccID1S16 that was input, to the request output circuit RQOUT. The request output circuit RQOUT notifies the latency adjuster circuit LCHCK that the response ResNoAccID2S16 is issued once again by way of the identification number ID value 2, the read command RD, the master number MID value 3, the response number RESN value 16 and Receive Impossible Information NOACC that are contained within the response ResNoAccID1S16, and issues the request RqRDID2S16 (FIG. 21: Step 1).

The ID comparator circuit CPQ of the memory device M0 subsequently compares the ID value 2 contained in the request RqRDID1S16 that was entered into the request queue of the request queue circuit RqQI, with the ID value 1 retained in the ID register circuit IDR (FIG. 21: Step 4). If the comparison results are a mismatch, then the request RqRDID2S16 is transferred to the request queue circuit RqQXO (FIG. 21: Step 13). Next a check is made on whether the request stored by the request queue circuit RqX0 is a request containing a read command or a request requiring a termination (end) notice (FIG. 21: Step 14). The request RqRDID2S16 includes a read command and so the request queue circuit RqQXO checks if there are non-reserved response queues with open space available among the plurality of response queues within the response queue circuit RsQp (FIG. 21: Step 15). If there are no non-reserved response queues with open space available in the response queue circuit RsQP, then the request queue circuit RqQXO awaits a non-reserved response queues with open space available.

If there are non-reserved available (open space) response queues within the response queue circuit RsQp, then the request queue circuit RqQxO copies the request number ReqN value 16 and the identification number ID value 2 within the request RqRDID2S16 into the non-reserved available (open space) response queues within the response queue circuit RsQp, and the required available (open space) response queue for accepting a response ResRD32ID2S16 corresponding to the request RqRDID2S16 is reserved in advance and procured (FIG. 21: Step 16). If the request queue circuit RqQxO has reserved queues that are nonreserved available request queues of response queue circuit RsQp, then the queue check circuit RSQM counts the number of non-reserved available (open space) response queues and the number of reserved available (open space) response queues within the response queue circuit RsQo, and updates that information (FIG. 21: Step 16).

The memory device M0 next transfers the request RqRDID2S16 to the memory device M1 by way of the request signal RqMux1 (FIG. 21: Step 1). When the request RqRDID2S16 is input to the memory device M1, the queue check circuit RQQM of memory device M1 makes a check for available (open space) request queues within the request queue circuit RqQI (FIG. 21: Step 2). If there are available (open space) request queues within the request queue circuit RqQ1 of the memory device M1, then the memory device M1 stores the request RqRDID2S16 from the memory device M0 into its own request queue circuit RqQI (FIG. 21: Step 3).

If there is no available (open space) request queue within the request queue circuit RqQ1 of memory device M1, then the memory device M1 cannot receive the request RqRDID2S16, and so immediately after the request RqRDID2S16 was issued, the memory device M1 sends a response ResNoAccID2S16 containing information called a Receive Impossible Information NOACC by way of the response signal RsMux1 to the memory device M0. The memory device M0 once again issues this request RqRDID2S16 by way of the identification number ID value 2, a read command RD32, a master number MID value 3, a response number RESN value 16 and the Receive Impossible Information NOACC contained in the response ResNoAccID2S16 (FIG. 21: Step 1). The ID comparator circuit CPQ of the memory device M1 subsequently compares the ID value 2 contained in the request RqRDID2S16 that was entered into the request queue of the request queue circuit RqQI; with the ID value 2 retained in the ID register circuit IDR (FIG. 21: Step 4).

If the comparison results are a match, then the request RqRDID2S16 is transferred to the request queue circuit RqQXI (FIG. 21: Step 5). A check is next made on whether the request RqRDID2S16 stored by the request queue circuit RqQXI is a request containing a read command or a request requiring a termination (end) notice (FIG. 21: Step 6). The request RqRDID2S16 includes a read command and so the request queue circuit RqQXI checks if there are non-reserved available (open space) response queues within the response queue circuit RsQO (FIG. 21: Step 7). If there are no non-reserved available (open space) response queues within the response queue circuit RsQO, then the request queue circuit RqQXI stops the transfer of the request RqRDID2S16 until a non-reserved open space response queue becomes available. If there are non-reserved available (open space) response queues within the response queue circuit RsQO, then the request queue circuit RqQXI copies the request number ReqN value 16 and the identification number ID value 2 within the request RqRDID2S16 into the non-reserved available (open space) response queues within the response queue circuit RsQO, and the available (open space) response queue required for accepting read data from the memory device Mem1 corresponding to the request RqRDID2S16 is reserved and procured in advance (FIG. 21: Step 8).

If the request queue circuit RqQXI has reserved a non-reserved available (open space) response queues within the response queue circuit RsQO, then the queue check circuit RSQM counts the number of reserved available (open space) response queues, and the number of non-reserved available (open space) response queues within the response queue circuit RsQO, and updates that information (FIG. 21: Step 8). The request queue RqQXI next transfers the stored request RqRDID2S16 transfer to the memory circuit Mem 1 (FIG. 21: Step 9). The memory circuit Mem1 then operates according to the request RqRDID2S16 (FIG. 21: Step 10). More specifically, the 32 byte data read command RD32 is sent from the command signal CMD; and the bank address 0 and the column address 32 are sent from the address signal ADD to the memory circuit 32. The command decoder CmdDec decodes the 32 byte data read command RD32, the control circuit Cont Logic selects the memory bank NV1BANK0, the column address 32 is stored in the column address buffer CAddLat of the memory bank NV1BAK0, and is input to the column decoder ColDec.

The 32 byte portion of data is then read out from the data buffer DataLat of the memory bank NV1BANK using the column address 32 as the start address, and is stored by the data control circuit DataCont to the read data buffer RDataLat. A common response section CMNRESF comprised of a response start flag ResStFlag value 1, and identification number ID value 2 (equivalent to the ID register value 2), the 32 byte data of a read command RD32, a master number MID value 3 (master number ID of information processing circuit CPU3), a read data length RDL value 32, and a response number ResN value 16 (equivalent to the request number ReqN value 16) is then attached to the 32 byte portion of data read out from the read data buffer RDataLat, and entered as the response ResRD32ID2S16 to the response queue of the response queue circuit RsQo within the response queue control circuit RsCT (FIG. 2: Step 17).

When the response ResRD32ID2S16 is entered into the response queue circuit RsQo of memory device M1, the queue check circuit RSQM of memory device M1 counts the number of occupied response queues already stored, the number of reserved available (open space) response queues, and the number of non-reserved available (open space) response queues within the response queue circuit RsQo, and updates that information (FIG. 22: Step 18). The response scheduler circuit SCH in the memory device M1 next decides the response sequence priority for the response entered into the response queue circuit RsQo and the response queue circuit RsQp (FIG. 22: Step 19). Only the response ResRD32ID2S16 is entered into the response queue circuit RsQo and response queue circuit RsQp so that the response ResRD32ID2S16 has the highest response sequence priority (FIG. 22: Step 19). The response scheduler circuit SCH therefore sends the response ResRD32ID2S16 by way of the response signal RsMux1 to the memory device M0 (FIG. 22: Step 20).

The queue check circuit RSQM of memory device M1 once again counts the number of occupied response queues already stored, the number of reserved available (open space) response queues, and the number of non-reserved available (open space) response queues within the response queue circuit RsQo, and updates that information (FIG. 22: Step 21).

The response ResRD32ID2S16 within the response queue circuit RsQo of the memory device M1 is transferred to the response queue circuit RsQp of the memory device M0 (FIG. 22: Step 17) before being sent to the information processing device CPU_CHIP (FIG. 22: Step 22).

The memory device M0 has procured an available (open space) response queue for accepting the response ResRD32ID2S16 within the response queue circuit RsQp in advance and therefore the memory device M0 stores the response ResRD32ID2S16 into its own response queue circuit RsQp (FIG. 22: Step 17).

When the response ResRD32ID2S16 is entered to the response queue circuit RsQo of memory device M0, the queue check circuit RSQM of memory device M0 counts the number of occupied response queues already stored, the number of reserved open space available response queues, and the number of non-reserved open space available response queues within the response queue circuit RsQp, and updates that information (FIG. 22: Step 18). The response scheduler circuit SCH of memory device M0 next decides the response sequence priority for responses entered in the response queue circuit RsQo and the response queue circuit RsQp (FIG. 22: Step 19). The response ResRD32ID2S16 is the only response entered in the response queue circuit RsQo and the response queue circuit RsQp and so the response ResRD32ID2S16 has the highest priority response sequence (FIG. 22: Step 19). The response scheduler circuit SCH therefore sends the response ResRD32ID2S16 to the information processing device CPU_CHIP by way of the response signal RsMux0 (FIG. 22: Step 20). When the response ResRD32ID2S16 within the response queue circuit RsQp of the memory device M0 has been completely sent to the information processing device CPU_CHIP, the queue check circuit RSQM counts the number of occupied response queues already stored, the number of reserved available (open space) response queues, and the number of non-reserved available (open space) response queues within the response queue circuit RsQp, and updates that information (FIG. 22: Step 21).

The information processing device CPU_CHIP has procured an available (open space) response queue in advance for accepting the response ResRD32ID2S16 within the response queue circuit RsQp, and therefore the response ResRD32ID2S16 is stored into the response input circuit RSIN. When the response ResRD32ID2S16 within the response queue circuit RsQo of memory device M0 is sent to the information processing device CPU_CHIP (FIG. 22: Step 22), the data transfer between the memory device M0 and the information processing device CPU_CHIP ends (FIG. 22: Step 23). When the response input circuit RSIN of the memory control circuit DCMC receives the response ResRD32ID2S16, it extracts the identification number ID value 2 and the response number ResN value 16 contained within the response ResRD32ID2S16, and sends them to the latency adjuster circuit LCHCK. The latency adjuster circuit LCHCK finds out by way of the identification number ID value 2 and the response number ResN value 16 that the response ResRD32ID2S16 of request RqRDID2S16 has returned, and terminates the latency measurement.

The latency adjuster circuit LCHCK compares the latency measurement results with the latency LatBank corresponding to the identification ID value 2 set in the latency register LTREG within the configuration circuit CONFIG. If results from this comparison show that the difference exceeds the response overlap tolerance time width DOVLP, then the latency adjuster circuit LCHCK performs a latency compensation operation so that the measured latency for the read requests generated from here onwards will be equivalent to the latency LatBank value 24 clock cycles. If the comparison results are within the response overlap tolerance time width DOVLP then the latency adjuster circuit LCHCK does not perform latency compensation.

The latency adjuster circuit LCHCK also compares the latency measurement results with the latency LatTimeOut corresponding to the identification number ID value 2 set in the latency register LTREG within the configuration circuit CONFIG. If results from this comparison show that the latency measurement results exceed the LatTimeOut value 100, then the request output circuit RQOUT is notified of the timeout error. If the comparison results show that the latency measurement results are within the LatTimeOut value 100, then no notification of a timeout error is made.

After the response ResRD32ID2S16 is stored in the response queue RESQ1, the queue control circuit QMTG once again counts the number of occupied response queues where the response has been already stored, the number of reserved available (open space) response queues, and the number of non-reserved available (open space) response queues within the response queue RESQ1, and updates that information.

Further, when the response ResRD32ID2S16 stored in the response queue RESQ1 is sent to the information processing circuit CPU3, then the queue control circuit QMGT deletes the response ResRD32ID2S16 retained in the response queue RESQ1, and once again counts the number of occupied response queues where the response has been already stored within the response queue RESQ1, the number of reserved available (open space) response queues, and the number of non-reserved available (open space) response queues within the response queue RESQ1, and updates that information.

As shown in the above description, attaching an identification number ID and a request number to the request, allows transferring that request reliably from the information processing device CPU_CHIP to each memory device. Also, attaching a response number and an identification number ID to the response allows confirming that data was correctly transferred from each memory, that the number of connection signals can be reduced by serial connections between the information processing device CPU_CHIP and the memory device M0, M1, and M2, and these performed while the information processing device CPU_CHIP is executing the desired process. Further, when the information processing device CPU_CHIP transfers a request ReqRD including a read command to the memory device M0, in order for the information processing device CPU_CHIP to read out data from the memory module MEM, then a still non-reserved available (open space) response queue within the response queue RESQ1 of the information processing device CPU_CHIP is reserved, and a response queue with available (open space) required for accepting the response ResRD corresponding to the request ReqRD is procured. Also, when the memory device M0 is transferring the request ReqRD to the memory device M1, then a non-reserved available (open space) response queue within the response queue ResQp of memory device M0 is reserved in advance, and a response queue with the available (open space) required for accepting the response ResRD corresponding to the request ReqRD is procured. During transfer by the memory device M1 of the request ReqRD to the memory device M2, a non-reserved available (open space) response queue within the response queue ResQp of memory device M1 is reserved in advance, and a response queue with the available (open space) required for accepting the response ResRD corresponding to the request ReqRD is procured. The information processing memory system of the present embodiment can therefore obtain the required available (open space) response queues by this type of operation that are needed to transfer the response ResRD for the request ReqRD from the information processing device CPU_CHIP, and the response ResRD can be transferred to the information processing device CPU_CHIP at the shortest latency.

The correct operation of the information processing memory system of the present embodiment can be judged as correct or not by measuring the latency, and by checking if the difference between this measured latency value and the latency value retained in the latency register LTREG is within the response overlap tolerance time DOVLP.

Read-Out and Write Operation

Figure 23:
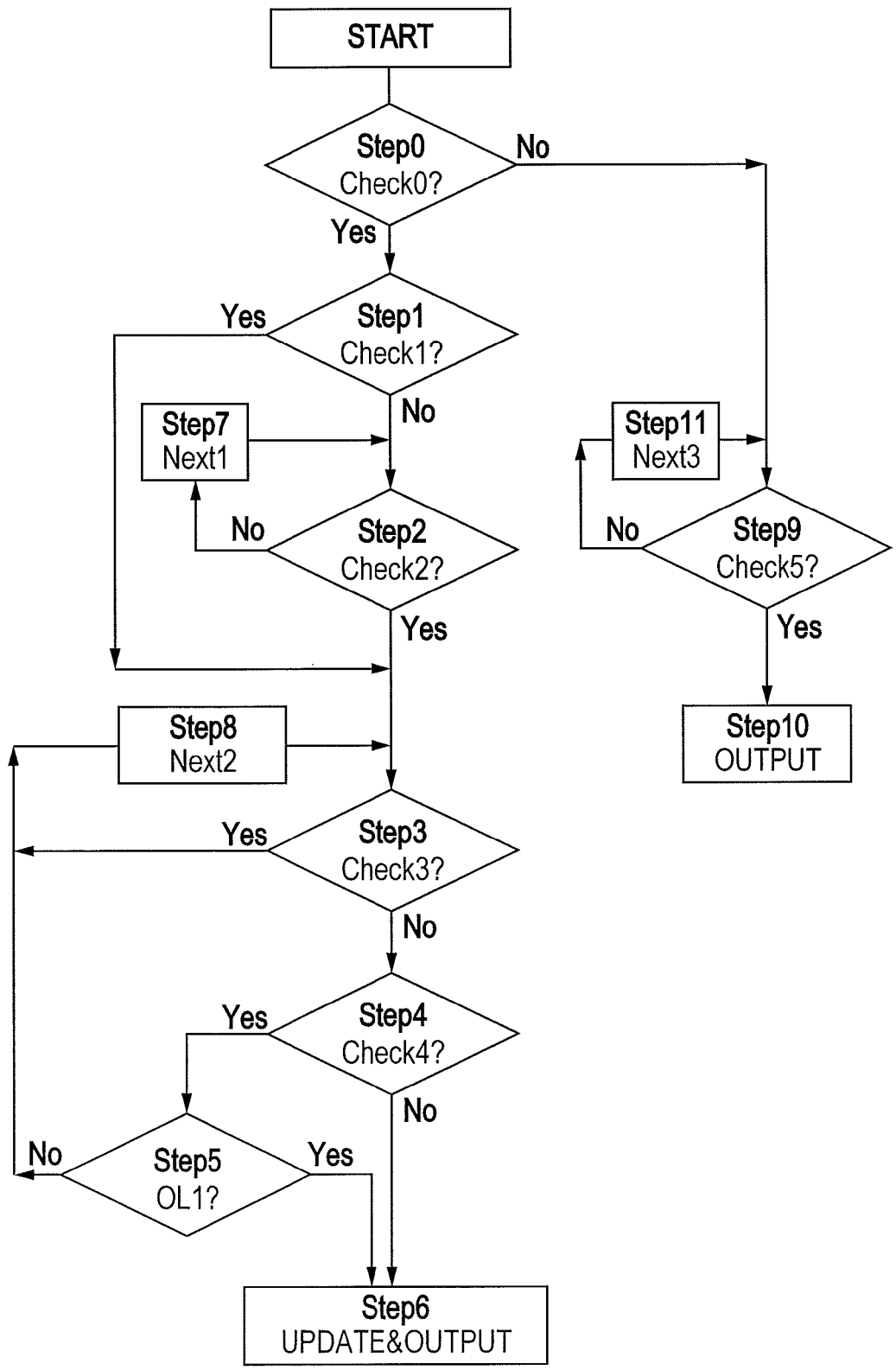
FIG. 23 is a flow chart showing one example of the operation involving time zone management of the response of the information processing device.

FIG. 23 shows an example of the check made by the request output circuit RQOUT in latency control mode, of the overlapping mutual response time widths between the time zone for the response to the read request issued by the request signal RqMux0, and the time zone of the previously issued response; the process flow from issue of the read request based on those results, and the process flow through the issue of the write request.

Though there are no particular restrictions, the flow chart shows an example during issue of the read requests RqRMn and RqRRMn (n=0, 1, 2) to the memory device Mn (n=0, 1, 2) by the request output circuit RQOUT. The LCONT is set to a 1, and the response overlap tolerance time DOVLP is set to the value m within the latency control register LCREG.

The read request RqRMn is a read request for reading out data from the memory circuit Memn of the memory device Mn. The read request RqRRMn is a read request for reading out data directly from the response queue RsQo of the memory device Mn.

The response overlap tolerance time DOVLP shows the allowable time width for overlapping times zones in cases where: there was a previously issued response for the request signal RqMux, such as a response A to a request A made to the memory device M0; and the time zone of the next issued response B for a request B to the memory device other than the memory device M0 overlaps the time zone of the response A from the initial time position.

In other words, when the response overlap tolerance time DOVLP is m, and the memory control circuit DCMC is already issuing a request to the request signal RqMux0 then in cases where: a response A to a request A was made to any of the memory devices (any of memory devices M0, M1, M2), and the time zone of response B to request B made to the next issued memory device overlaps the time zone for response A from the initial time position of A in a range within a clock cycle m; then a request is issued to the request signal RqMux0 to reduce the latency of each response to as small a latency as possible in the range of the clock cycle m in the overlapping area of the time zone of response B.

Here, prior to describing the actual operation, the counters DnS, Dne, and CnTRCD provided in the request output circuit RQOUT are described.

The counter CnTRCD is first of all described. In cases where transferring a request including read commands for reading out data from the memory circuit Memn of memory device Mn, or write commands for writing data onto the memory circuit Memn, after a request including a bank active command AC was transferred to the memory device Mn; then a time interval is needed for the tmnRCD value set in the timing register MnTREG. The counter CnTRCD of memory device Mn within the request output circuit RQOUT is a counter for checking this time interval tmnRCD. This counter CnTRCD is initialized to 0 during the power-up sequence. The tmnRCD value set in the timing register MnTREG is set into the counter CnTRED immediately before transfer of a request including the bank active command AC; and the setting value in the counter CnTRCD synchronized to the clock CLK is reduced one increment at a time until reaching the set value to 0.

The counter DnS and the counter DnE are counters for showing the response start time position RTLn and the final end time position RBLn, when the response to the request including the read command to the memory device Mn is being input to the memory control circuit DCMC by way of the response signal RsMux0. In other words, the period from the counter DnS value to the counter DnE value shows the relative time zone mnRsDr where the response for the request including the read command to the memory device Mn appears on the response signal RsMux0.

Simultaneously with transferring a request containing the read command to the memory device Mn, the request output circuit RQOUT sets the register NxDs value set in the start time position, and the register NxDe value set in the final end time position described later on, into the counters DnS and DnE. The counters DnS and DnE are subsequently synchronized to the clock CLK, the values set on the counters DnS and DnE reduced by one increment, and the relative time zone mnRsDr appearing in the response signal RsMux0 is updated. Though there are no particular restrictions, the information processing device CPU0 initializes the counters DnS and DnE to 0 (zero) during the power-up sequence.

The specific operation is described next. This description here covers the three memory device M0 through M2, and assumes usage of the information processing system shown in FIG. 1 as a precondition.

First of all, immediately prior to the request output circuit RQOUT issuing a request retained in the request holding circuit NxPCK by way of the request signal RqMux0, a check is made on whether that request is a read request (RqRMn or RqRRMn) or a write request RqWMn (Step 0).

If that request is a read request (RqRMn or RqRRMn) then the start time position RTLAT and the final end time position RBLAT for the response RsRMn to the respective read requests (RqRMn or RqRRMn) are counted, and each are set in the register NxDs and the register NxDe (Step 1).

If the request from the request output circuit RQOUT is the read request RqRRMn, then the process proceeds to Step 3. If the request from the request output circuit RQOUT is the read request RqRMn, then a check is made from the following condition 1 to condition 3 (Step 2).

Condition 1: Is the counter C0TRCD value 0 when the read request RqRMn is the request to the memory device M0? (C0TRCD==0)

Condition 2: Is the counter C1TRCD value 0 when the read request RqRMn is the request to the memory device M1? (C1TRCD==0)

Condition 3: Is the counter C2TRCD value 0 when the read request RqRMn is the request to the memory device M2? (C2TRCD==0)

If any of the conditions 1 through 3 are not satisfied then that request cannot be output, so the request output circuit RQOUT delays the issue of the read request RqRMn by one clock cycle (Step 7). Delaying the issue of the read request RqRMn by one clock cycle, allows reducing the values on all of the counters CT0RCD, CT1RCD, and CT2RCD by one value. If any of the conditions 1 through 3 are satisfied then the process proceeds to Step 3.

In Step 3, the request output circuit RQOUT checks the following conditions 4 through 6.

Condition 4: Is there a register NxDs value between the counter D0S value and the counter D0E value? (D0S value≤NxDs value<D0E value)

Condition 5: Is there a register NxDs value between the counter D1S value and the counter D1E value? (D1S value≤NxDs value<D1E value)

Condition 6: Is there a register NxDs value between the counter D2S value and the counter D2E value? (D2S value≤NxDs value<D2E value).

If any of the conditions 4 through 6 were satisfied, then issuing the response RsRMn will cause it to overlap the start time positions in the time zone of response for requests that were already issued and the time zone of the response for a request that will be issued, with the result that since the response RsRMn is a response to a previously issued request, the response to requests issued from now will be made to wait (placed in standby) in the response queue RsQo in the memory device and consequently a response cannot be made at the desired latency. To achieve the desired latency, the request output circuit RQOUT delays the issue of the read request RqRMn by one clock cycle (Step 8). Delaying issue of the read request RqRMn by one clock cycle reduces the values of all the counters D0S, D0E, D1S, D1E, D2S, D2E by one increment.

If any of the conditions 4 through 6 are not satisfied then the request output circuit RQOUT checks the following conditions 7 through 9 (Step 4).

Condition 7: Is there a register NxDe value between the counter D0S value and the counter D0E value? (D0S value−1≤NxDe value≤D0E value)

Condition 8: Is there a register NxDe value between the counter D1S value and the counter D1E value? (D1S value−1≤NxDe value≤D1E value)

Condition 9: Is there a register NxDe value between the counter D2S value and the counter D2E value? (D2S value−1≤NxDe value≤D2E value).

If any of the conditions 7 through 9 are not satisfied then the response RsRMn is not a response with a time zone overlapping the time zone of response for the previously issued request so the request output circuit RQOUT issues the read request RqRMn (Step 6).

If any of the conditions 7 through 9 are satisfied, then the response RsRMn is a response with a time zone overlapping the time zone of the response for the previously issued request (more specifically, a state where the response for a request that will be issued starts first; and a response for a previously issued request starts during that time) and so the request output circuit RQOUT checks the following conditions 10 through 12 (Step 5). In other words, the request output circuit RQOUT checks whether the overlapping time widths of the response RsRMn time zone and the time zone of the response for the previously issued request are within the DOVLP value or not.

Condition 10: If the response RsRMn is the response of the memory device M0: then $$DOVLP \text{ value the time width } RSOLP \text{ value}=(\text{register } NxDe \text{ value}+1)-(D1S \text{ value}-1)$$

$$DOVLP \text{ value the time width } RSOLP \text{ value}=(\text{register } NxDe \text{ value}+1)-(D2S \text{ value}-1)$$

Condition 11: If the response RsRMn is the response of the memory device M1: then $$DOVLP \text{ value the time width } RSOLP \text{ value}=(\text{register } NxDe \text{ value}+1)-(D0S \text{ value}-1)$$

$$DOVLP \text{ value the time width } RSOLP \text{ value}=(\text{register } NxDe \text{ value}+1)-(D2S \text{ value}-1)$$

Condition 12: If the response RsRMn is the response of the memory device M2: then $$DOVLP \text{ value the time width } RSOLP \text{ value}=(\text{register } NxDe \text{ value}+1)-(D0S \text{ value}-1)$$

$$DOVLP \text{ value the time width } RSOLP \text{ value}=(\text{register } NxDe \text{ value}+1)-(D1S \text{ value}-1)$$

If any of the conditions 10 through 12 are not satisfied, then the time width RSOLP value where the response RsRMn time zone, and the time zone of the response for the previously issued request overlap, is a time width much larger than the DOVLP value and unallowable, so the request output circuit RQOUT delays the issue of a read request RqRMn by one cycle (Step 8). Delaying the issue of the read request RqRMn by one clock cycle, reduces the values of all the counters D0S, D0E, D1S, D1E, D2S, D2E by one increment.

If any of the conditions 10 through 12 are satisfied, then the time width RSOLP value where the response RsRMn time zone, and the time zone of the response for the previously issued request overlap, is a time width that is within the response overlap tolerance time DOVLP value and is allowable, so the request output circuit RQOUT issues the read request RqRMn. Moreover, the request output circuit RQOUT knows by way of the response RsRMn for the read request RqRMn, that the time zone of the response for the previously issued request will be shifted time-wise to the rear by a portion equivalent just to the time width RSOLP; so simultaneously with issuing the read request RqRMn, the request output circuit RQOUT updates the start time position of the response for shifting (any of the D0S value, D1S value, and D2S values) and the final end time position (any of the D0E value, D1E value, and D2E value) (Step 6). The method for updating the start time position and the final end position in Step 6 is described next. When the response for shifting is a memory device M0 response, update so that:

the counter $D0S$ value=counter $D0S$ value−1+time width $RSOLP$ value, the counter $D0E$ value=counter $D0E$ value−1+time width $RSOLP$ value When the response for shifting is a memory device M1 response, update so that:

the counter $D1S$ value=counter $D1S$ value−1+time width $RSOLP$ value, the counter $D1E$ value=counter $D1E$ value−1+time width $RSOLP$ value When the response for shifting is a memory device M2 response, update so that:

the counter $D2S$ value=counter $D2S$ value−1+time width $RSOLP$ value, the counter $D2E$ value=counter $D2E$ value−1+time width $RSOLP$ value.

The request output circuit RQOUT constantly updates the start time position and the final end time position of the response to the rearward time shift so that the overlapping time width RSOLP value of the response time zone does not exceed the response overlap tolerance time DOVLP value. In other words, the request output circuit RQOUT issues a request to the memory device so as to extract a data transfer rate at the maximum limit while suppressing irregularities within the latency of the response within the response overlap tolerance time DOVLP value. If the latency control flag LCFLG is 0 (latency non-control mode) then only Step 1 in FIG. 23 is implemented, and the request is issued immediately if the conditions are satisfied.

If the results in Step 0 is that the request retained in the request retainer circuit NxPCK is a write request RqWMn, then a check is made of the following conditions 1 through 3 (Step 9).
Condition 1: Is the counter C0TRCD value 0 when the write request RqWMn is a request to the memory device M0? (C0TRCD==0)
Condition 2: Is the counter C1TRCD value 0 when the write request RqWMn is a request to the memory device M1? (C1TRCD==0)
Condition 3: Is the counter C2TRCD value 0 when the write request RqWMn is a request to the memory device M2? (C1TRCD==0).

If all of the conditions 1 through 3 are not satisfied then the request cannot be output so the request output circuit RQOUT delays the issue of the write request RqWMn by one clock cycle (Step 11). Delaying the issue of the write request RqWMn by one clock cycle, reduces the values of all the counters CT0RCD, CT1RCD, CT2RCD by one increment. If any of the conditions 1 through 3 is satisfied then the request output circuit RQOUT issues the write request RqWMn (Step 10).

Figure 24:
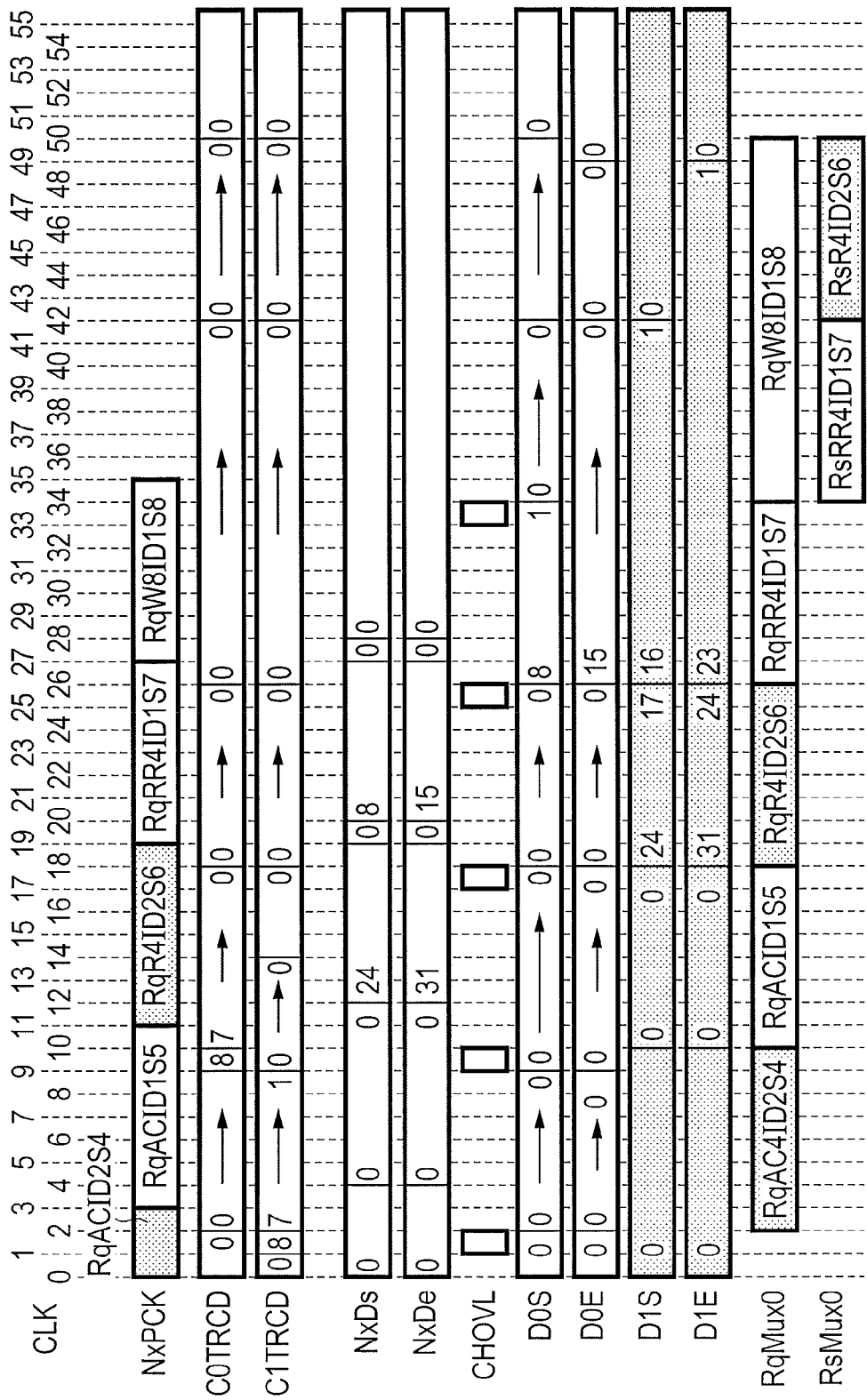
FIG. 24 is a timing diagram showing one example of the operation waveform in the information processing system of this invention.

FIG. 24 is a drawing showing one example of the operation waveform in the operation for writing data onto the memory device M0, and the operation for reading out data from the memory device M0 and the memory device M1 in the case where: setting an 8 into the latency LatQue value, setting a 12 into the latency LatBank value, of the memory device M0; setting a 20 into the latency LatQue value, setting a 24 into the latency LatBank value of the memory device M1; setting an 8 into the latency LatQue value, setting a 32 into the latency LatBank value of the memory device M2 within the latency register LTREG of the memory control circuit DCMC; setting an 8 into the tm0RCD value of the timing register M0TREG relating to the memory device M0, setting an 8 into the tm1RCD value of the timing register M1TREG relating to the memory device M1, and setting a 4000 into the tm2RCD value of the timing register M2TREG relating to the memory device M2.

One example of an operation waveform is shown with the memory control circuit DCMC operating in synchronization with the clock CLK, when setting a 1 into the latency control flag LCFLG within the latency control register LCREG, and setting a 0 into the response overlap tolerance time width DOVLP.

When the time zone of a response B for a request B that will be next issued to a memory device other than the memory device M0, overlaps from the start time position, the time zone of response for request already issued to the request signal RqMux0 such as a response A to a request A made to the memory device M0; then the response overlap tolerance time width DOVLP indicates the allowable time width for the overlapping time zones.

When the response overlap tolerance time width DOVLP is 0, then the memory control circuit DCMC outputs a request to the request signal RqMux0 to clamp the respective responses to the minimum latency (fixed latency mode) so that the time zone of response B for the request B next issued to the memory device will not overlap from the start time position of response A for a request A made to any of the memory device (any of the memory devices M0, M1, M2).

The request queue REQQ2 retains the request RqACID2S4, RqACID1S5, RqR4ID2S6, RqRR4ID1S7, and RqW8ID1S8.

The request RqACID2S4 is the bank active command to the memory device M1. The request RqACID1S5 is the bank active command to the memory device M0. The request RqR4ID2S6 is the read request to the memory device M1. The request RqRR4ID1S7 is the read request to the memory device M0. The request RqW8ID1S8 is the write request to the memory device M0.

The request RqACID2S4 is comprised of the request start flag RqStFL value 1, identification number ID value 2, active command AC, master number MID value 3, variable (section) request length VREQL value 4, request number ReqN value 4, bank address BK0 and the page address ROW63.

The request RqACID1S5 is comprised of the request start flag RqStFL value 1, identification number ID value 1, active command AC, master number MID value 3, variable (section) request length VREQL value 4, request number ReqN value 5, and bank address BK0 and the page address ROW0.

The request RqR4ID2S6 is comprised of the request start flag RqStFL value 1, identification number ID value 2, read command RD, master number MID value 3 variable (section) request length VREQL value 4, request number ReqN value 6, response queue number QUN value 0, bank address BK0 and column address COL32, and the read data length RDL value 4.

The request RqRR4ID1S7 is comprised of the request start flag RqStFL value 1, identification number ID value 1, response queue read command RRD, master number MID value 3, variable (section) request length VREQL value 4, request number ReqN value 7, response queue number RQN value 0, byte address BTADD value 0, and the read data length RDL value 4.

The request RqW8ID1S8 is comprised of the request start flag RqStFL value 1, identification number ID value 1, write command WT, master number MID value 3, variable (section) request length VREQL value 8, request number ReqN value 8, bank address BK0 and column address COL0, write data length RDL value 8, and the 8 byte write data WData.

The request output circuit RQOUT decodes in order, the requests retained in the request queue REQQ2. If the decoded results are a request that is a read request, then the request output circuit RQOUT calculates the start time position RTLAT and the final end time position RBLAT when the response for these read requests is input by way of the response signal RsMux0 to the memory control circuit DCMC. The start time position RTLAT and the final end time position RBLAT are subsequently set respectively in the register NxDs and the register NxDe.

Though there are no particular restrictions, the start time position RTLAT of response RsRR4ID1S7 for the request RqRR4ID1S7 becomes a latency m0 Lat value=8, and the final end time position RBLAT can be expressed as follows.

Final end time position $RBLAT$=(latency $m0Lat$ value)+{((byte quantity $CMNBL$ of common response section $CMNRESF$+byte quantity $RDBL$ of read data)÷response signal $RsBL$ (byte conversion))−1}.

Here, when the latency m0Lat value=8, the byte quantity CMNBL of common response section CMNRESF=4, the byte quantity RDBL of the read data=4, and the response signal quantity RsBL=1, then the final end time position RBLAT=8+{((4+4)÷1)−1}=15. Therefore, in the case of request RqRR4ID1S7, the value of 8 for the start time position RTLAT is stored in the register NxDs, and a value of 15 for the final end time position is stored in the register NxDe.

Further, the start time position RTLAT of a response RsR4ID2S6 to the request RqR4ID2S6, is a latency m1Lat value=24. For the final end time position RBLAT in the response RsR4ID2S6, when the latency m1Lat value=24, the byte quantity CMNBL of the common response section CMNRESF=4, the byte quantity RDBL of the read data=4, and the response signal quantity RsBL=1, then the final end time position RBLAT=24+{((4+4))÷1}=31. Therefore, in the case of request RqR4ID2S6, the value of 24 for the start time position RTLAT is stored in the register NxDs, and the value of 31 for final end time position is stored in the register NxDe.

The counter C0TRCD is set to the tm0RCD value 8 just prior to transfer of the request RqACID1S5. The counter C0TRCD is synchronized with the clock CLK and that value reduced one increment at a time. If that counter C0TRCD value reaches zero (0), then the request output circuit RQOUT can transfer a request containing a read and a write command to the memory circuit Mem0 of the memory device M0.

The counter C1TRCD is set to the tm1RCD value 8 just prior to transfer of the request RqACID2S4. The counter C1TRCD is synchronized with the clock CLK and that value reduced one increment at a time. If that counter C1TRCD value reaches zero (0), then the request output circuit RQOUT can transfer a request containing a read and a write command to the memory circuit Mem1 of the memory device M1.

The counter C2TRCD is set to the tm2RCD value 1000 just prior to transfer of a request including the bank active command AC to the memory device M2. The counter C2TRCD is synchronized with the clock CLK and that value reduced one increment at a time. If that counter C2TRCD value reaches zero (0), then the request output circuit RQOUT can transfer a request containing a read and a write command to the memory circuit Mem2 of the memory device M2.

The operation of the memory module MEM during output of requests by the request output circuit RQOUT is described next.

When the request output circuit RQOUT outputs the request RqACID2S4, the memory device M0 compares the ID value 2 contained in the request RqACID2S4 with the ID value 1 retained in its own ID register circuit IDR, and if the comparison results are a mismatch, transfers the request RqACID2S4 to the memory device 1. The memory device M1 checks that the request RqACID2S4 is a request to itself by whether the ID value 2 contained in the request RqACID2S4 matches the ID value 2 retained in its own ID register circuit IDR. The memory device M1 next utilizes the bank active command AC, the bank address BK0, and the page address ROW63 contained in the request RqACID2S4, to activate the memory cell coupled to the page address 63 within the memory circuit NV1BK0, and transfers a one kilobyte portion of data to the data buffer DataLat.

When the request output circuit RQOUT outputs the request RqACID1S5, the memory device M0 checks that request RqACID1S5 is a request for itself by whether the ID value 1 retained in its own ID register circuit IDR matches the ID value 1 contained in the request RqACID1S5. The memory device M0 next utilizes the bank active command AC, the bank address BK0, and the page address ROW0 contained in the request RqACID1S5, to activate the memory cell coupled to the page address 0 within the memory circuit MBank, and transfers a one kilobyte portion of data to the sense amplifier SenseAmp.

After the request output circuit RQOUT outputs the request RqACID1S5 by way of the request signal RqMux0, at the CLK time position 11 it then inputs the request RqR4ID2S6 retained in the request queue REQQ2 to the request retainer circuit NxPCK, where the request RqR4ID2S6 is decoded as a read request (process in Step 0 of FIG. 23). At the next CLK time position 12, the start time position RTLAT and the final end time position RBLAT for the response RsR4ID2S6 corresponding to the request RqR4ID2S6 are calculated, and the start time position RTLAT value 24 is set into the register NxDs, and the final end time position RBLAT value 31 is set into the register NxDe (process in Step 1 of FIG. 23).

In order to output the request RqR4ID2S6 the request output circuit RQOUT checks that the value of the counter C1TRCD has become zero (0) immediately prior (CLK time position 17) to completion of the output of the request RqACID1S5 to the memory device M1 (process in Step 2 of FIG. 23). The request output circuit RQOUT further compares the register NxDs value 24, the register NxDe value 31, the counter D0S value 0, the counter D0E value 0, the counter D1S value 0, and the counter D1E value 0, with the counter D2S value 0, the counter D2E value 0, and the response overlap tolerance time width DOVLP value 0, and checks if there are any other responses overlapping time-wise in the response RsR4ID2S6 for the request RqR4ID2S6 (process in Steps 3, 4, 5 of FIG. 23). At the CLK time position 18, the request signal RqMux0 then outputs a request RqR4ID2S6, and sets the register NxDs value 24 and the register NxDe value 31 into the counters D1S and D1E (process in Step 6 of FIG. 23).

After the request output circuit RQOUT outputs the request Rq4ID2S6 by way of the request signal RqMux0, at the CLK time position 19, it inputs the request RqRR4ID1S7 retained in the request queue REQQ2 to the request retainer circuit NxPCK, where the request RqRR4ID1S7 is decoded as a read request (process in Step 0 of FIG. 23). At the next CLK time position 20, the start time position RTLAT and the final end time position RBLAT for the response RsRR4ID1S7 corresponding to the request RqRR4ID1S7 are calculated, and the start time position RTLAT value 8 is set into the register NxDs, and the final end time position RBLAT value 15 is set into the register NxDe.

Next, in order to output the request RqRR4ID1S7, at the CLK time position 25, the request output circuit RQOUT checks that the value of the counter C0TRCD has become 0 (process in Step 2 of FIG. 23). The request output circuit RQOUT further compares the register NxDs value 8, the register NxDe value 15, the counter D0S value 0, the counter D0E value 0, the counter D1S value 17, and the counter D1E value 24, with the counter D2S value 0, the counter D2E value 0, and the response overlap tolerance time width DOVLP value 0, and checks if there are any other responses overlapping time-wise in the response RsRR4ID1S7 to the request RqRR4ID1S7 (process in Steps 3, 4, 5 of FIG. 23).

At the next CLK time position 26, the request signal RqMux0 then outputs a request RqRR4ID1S7, and sets the register NxDs value 8 and the register NxDe value 25 into the counters D0S and D0E (process in Step 6 of FIG. 23).

After the request output circuit RQOUT outputs the request RqRR4ID1S7 by way of the request signal RqMux0, at the CLK time position 27 it then inputs the request RqW8ID1S8 retained in the request queue REQQ2, to the request retainer circuit NxPCK, where, at the next cycle (time position 28), the request RqW8ID1S8 is decoded as a write request (process in Step 0 of FIG. 23). At the next CLK time position 33, the request output circuit RQOUT checks that the counter C0TRCD value has become 0 (process in Step 2 of FIG. 23). At the CLK time position 34, the request signal RqMux0 outputs a request RqW8ID1S8 containing eight bytes of write data WData (process in Step 10 of FIG. 23).

The response operation is described next. The memory device M0 receives the request RqR4ID2S6, and compares the ID value 2 contained in this request RqR4ID2S6 with the ID value 1 retained in its own ID register circuit IDR. These two ID values do not match, so the memory device M0 sends the request RqR4ID2S6 to the memory device M1.

The memory device M1 receives the request RqR4ID2S6, and checks if this request is directed towards itself by a match between the ID value 2 contained in this request RqR4ID2S6, and the ID value 2 retained in its own ID register circuit IDR. The memory device M1 next utilizes the read command RD contained in the request RqR4ID2S6, the bank address BK0 and column address COL32, the read data length RDL value byte address BTADD value 0, and the read data length value 4, to read out a four byte portion of data from the data buffer DataLat in the memory bank NV2B0 of memory circuit Mem2, with the column address 32 as the start address.

A response RsR4ID2S6 attached with a common response section CMNRESF comprised of a response start flag ResSt-Flag value 1, the identification number ID value 2, a four byte data read command RD4, a master number MID value 3, a read data length RDL value 4, and a response number ResN value 6 (value equivalent to request number ReqN value 6) are generated in the four byte portion of data that was read out. The response RsR4ID2S6 is subsequently transferred to the response queue of the response queue number 0 within the response queue RsQo specified by the response queue number QUN value 0, and then sent by the response signal RsMux1 to the memory device M0.

The response Rs4ID2S6 is stored in the response queue circuit RsQp of the memory device M0, and is input it to the response input circuit RSIN of the memory control circuit DCMC by way of the response signal RaMux1. The latency of the response Rs4ID2S6 at this time becomes 24 clock cycles.

The memory device M0 receives the request RqRR4ID1S7, and checks that this request RqRR4ID1S7 is directed towards itself by a match between the ID value 1 contained in this request Rq4ID2S7, and the ID value 1 retained in its own ID register circuit IDR. Next, the memory device M0 utilizes the response queue read command RRD, the response queue number RQN value 0, the byte address BTADD value 0, and the read data length RDL value 4 contained in the request RqRR4ID1S7 of the memory device M0, to read out a four byte portion of data, with the byte address BTADD value 0 as the start address.

In order to directly read out the data from the response queue RsQ0, the latency of the response RsRR4ID1S7 becomes eight clock cycles.

By managing the time zone of responses for requests made to each of the memory devices and then issuing requests as described above, a low latency can be achieved, and a high speed data transfer rate attained. Moreover data for quick readout can be read out immediately without having to wait for readout of delayed data so that high speed can be attained regardless of the input sequence of the requests. The request interface circuit ReIF and the response interface circuit can operate independently so that data read-out operation and data write operation can be implemented simultaneously, and the data transfer performance can be enhanced.

The data read-out and writing for the memory device M0 already described can needless to say, also be implemented in the other memory devices M1 and M2. Moreover, the request interface circuit ReIF and the response interface circuit operate independently in the response memory devices so that even if data readout and data write requests to different memory devices occur, these respective requests can be processed in parallel, and the data processing performance will of course be enhanced.

Figure 25:
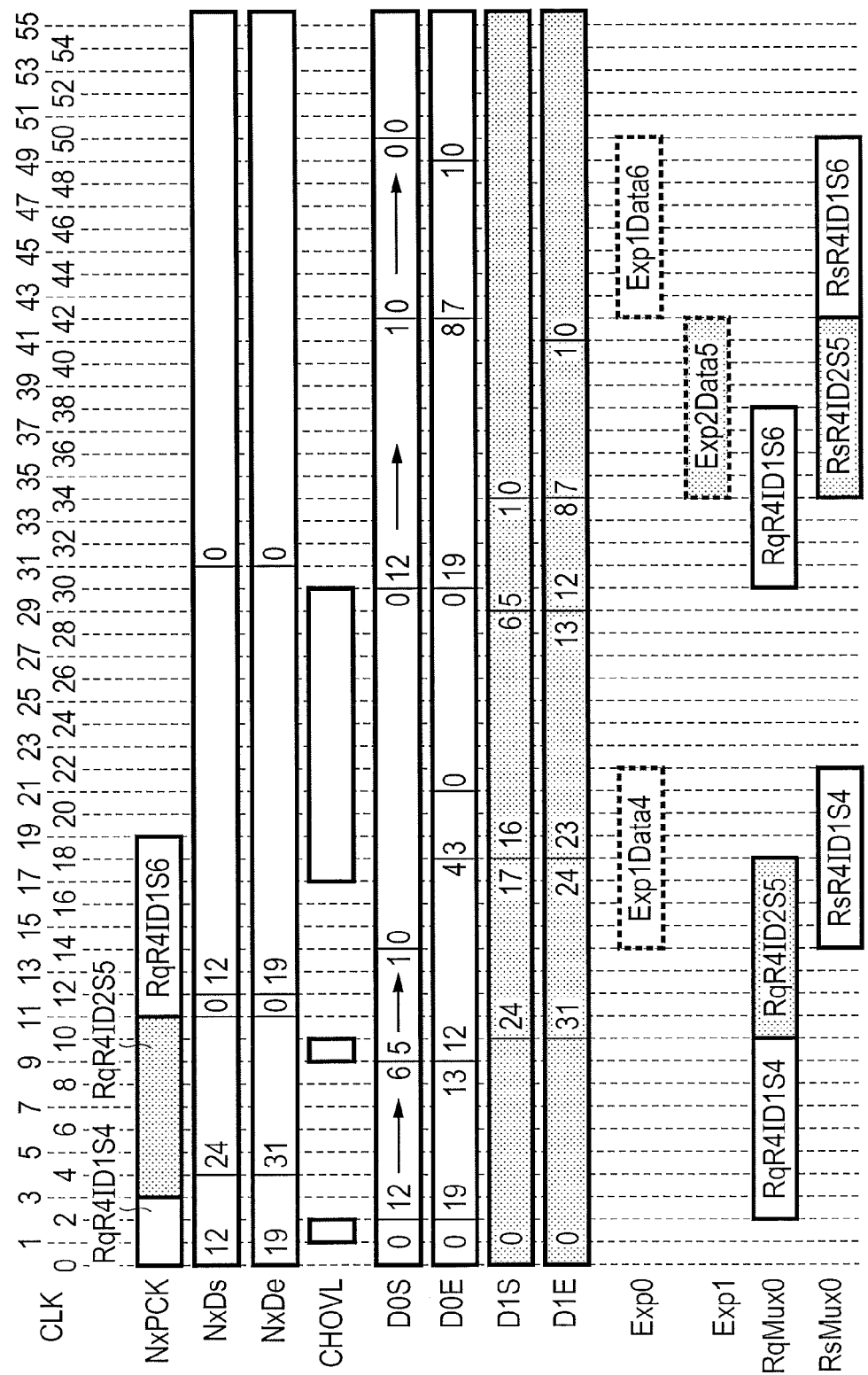
FIG. 25 is a timing diagram showing one example of the operation waveform in the information processing system of this invention.

FIG. 25 shows an example of the operating waveforms for read-out and writing of data from the memory device M0 and the memory device M1 of the memory control circuit DCMC in the case (fixed latency mode) where setting a 1 into the latency control flag LCFLG, and setting a 0 into the response overlap tolerance time width DOVLP within the latency control register LCREG.

The requests RqR4ID1S4, RqR4ID2S5, RqR4ID1S6 are moreover retained in the request queue REQQ2.

The request RqR4ID1S4 and the request RqR4ID1S6 are 4 byte data read requests made to the memory device M0. The request RqR4ID2S5 is a 4 byte data read request to the memory device M1.

The request RqR4ID1S4 is comprised of a request start flag RgStFL value 1, an identification number ID value 1, a read command RD, a master number MID value 3, a variable request length VREQL4, a request number ReqN value 4, a response queue number QUN value 0, a bank address BK0 and column address COL32, and a read data length RDL value 4.

The request RqR4ID2S5 is comprised of a request start flag RgStFL value 1, an identification number ID value 2, a read command RD, a master number MID value 3, a variable request length VREQL4, a request number ReqN value 5, a response queue number QUN value 0, a bank address BK0 and column address COL32, and a read data length RDL value 4.

The request RqR4ID1S6 is comprised of a request start flag RgStFL value 1, an identification number ID value 1, a read command RD, a master number MID value 3, a variable request length VREQL4, a request number ReqN value 5, a response queue number QUN value 0, a bank address BK0 and column address COL64, and a read data length RDL value 4.

The request output circuit RQOUT decodes in sequence the requests retained in the request queue REQQ2. If the decoded result is that the request is a read request, then the request output circuit RQOUT further calculates the start time position RTLAT and the final end time position RBLAT for the response when the response for this read request is input to the memory control circuit DCMC by way of the response signal RsMux0.

The start time position RTLAT and the final end time position RBLAT are subsequently set respectively in the register NxDs and the register NxDe.

In the example in FIG. 25, the start time position RTLAT for the response RsR4ID1S4 and RsR4ID1S6 for the requests RqR4ID1S4 and RqR4ID1S6 is a latency m0Lat value=12; and the final end time position RBLAT is a latency m0Lat value=12; the common response section CMNRESF byte count CMNBL=4, the read data byte count RDBL=4, and response signal count RsBL=1 and therefore the final end time position RBLAT=12+{((4+4)÷1)−1}=19. Therefore, in the case of the request RqR4ID1S4 and the RqR4ID1S6, a start time position RTLAT value of 12, is stored in the register NxDs, and the final end time position RBLAT of 19 is stored in the register NxDe.

Also, the start time position RTLAT for the response RsR4ID2S5 for the request RqR4ID2S5 is a latency m1Lat value=24; and the final end time position RBLAT is a latency m1Lat value=24; the common response section CMNRESF byte count CMNBL=4, the read data byte count RDBL=4, and response signal count RsBL=1 and therefore the final end time position RBLAT=24+{((4+4)÷1)−1}=31. Accordingly, in the case of the request RqR4ID2S5, the start time position RTLAT value of 24, is stored in the register NxDs, and the final end time position RBLAT of 31 is stored in the register NxDe.

The operation when the request output circuit RQOUT outputs a request RqR4ID1S4 containing a four byte data read command RD to the memory device M0 is described next.

When the decoded results from the request RqR4ID1S4 made to the memory device M0 previously input to the request retainer circuit NxPCK are that the request RqR4ID1S4 is a read request (process in Step 0 of FIG. 23), then at the next CLK time position 0, the request output circuit RQOUT calculates the start time position RTLAT and the final end time position RBLAT for the response RsR4ID1S4 for the request RqR4ID1S4, and sets the start time position RTLAT value of 12 into the register NxDs and the final end time position RBLAT value of 19 into the register NxDe (process in Step 1 of FIG. 23).

In order to output the request RqR4ID1S4, at the CLK time position 1, the request output circuit RQOUT checks that the value of the counter C0TRCD has become 0 (process in Step 2 of FIG. 23). The request output circuit RQOUT further compares the register NxDs value 12, the register NxDe value 19, the counter D0S value 0, the counter D0E value 0, the counter D1S value 0, the counter D1E value 0, with the counter D2S value 0, the counter D2E value 0, and the response overlap tolerance time width DOVLP value 0, and checks if there are any other responses overlapping time-wise in the response RsR4ID1S4 for the request RqR4ID1S4 (process in Steps 3, 4, 5 of FIG. 23). Then, at the CLK time position 2, the request signal RqMux0 then outputs the request RqR4ID1S4, and sets the register NxDs value 12 and the register NxDe value 19 into the counters D0S and D0E (process in Step 6 of FIG. 23).

The operation following the request RqR4ID1S4, when the request output circuit RQOUT outputs a request RqR4ID2S5 containing a read command to the memory device M1 is described next.

After the request signal RqMux0 outputs the request RqR4ID1S4, at the CLK time position 3, the request output circuit RQOUT inputs the request RqR4ID2S5 retained in the request queue REQQ2, and if the decoding result is that the request RqR4ID2S5 is a read request (process in Step 0 of FIG. 23), then at the next CLK time position 4, the request output circuit RQOUT calculates the start time position RTLAT and the final end time position RBLAT of the response RsR4ID2S5 corresponding to the request RqR4ID2S5, and sets the start time position RTLAT value of 24 into the register NxDs, and sets the final end time position RBLAT value of 31 into the register NxDe (process in Step 1 in FIG. 23).

Next, in order to output the request RqR4ID2S5, at CLK time position 9, the request output circuit RQOUT checks that the value of the counter C1TRCD has become 0 (process in Step 2 of FIG. 23). The request output circuit RQOUT further compares the register NxDs value 24, the register NxDe value 31, the counter D0S value 5, the counter D0E value 12, the counter D1S value 0, the counter D1E value 0, with the counter D2S value 0, the counter D2E value 0, and the response overlap tolerance time width DOVLP value 0; and checks if there are any other responses overlapping time-wise in the response RsR4ID2S5 for the request RqR4ID2S5 (process in Steps 3, 4, 5 of FIG. 23).

Then, at the CLK time position 10, the request signal RqMux0 then outputs the request RqR4ID2S5, and sets the register NxDs value 24 and the register NxDe value 31 into the counters D1S and D1E (process in Step 6 of FIG. 23).

The operation following the request RqR4ID2S5, when the request output circuit RQOUT outputs a request RqR4ID1S6 containing a read command to the memory device M0 is described next.

At the CLK time position 11, the request output circuit RQOUT is input with the request RqR4ID1S6 retained in the request queue REQQ2, and if the decoding result is that the request RqR4ID1S6 is a read request (process in Step 0 of FIG. 23), then at the CLK time position 12, the request output circuit RQOUT calculates the start time position RTLAT and the final end time position RBLAT of the response RsR4ID1S6 corresponding to the request RqR4ID1S6, and sets the start time position RTLAT value of 12 into the register NxDs, and sets the final end time position RBLAT value of 19 into the register NxDe (process in Step 1 in FIG. 23).

Next, in order to output the request RqR4ID1S6, at CLK time position 17, the request output circuit RQOUT checks that the value of the counter C0TRCD has become 0 (process in Step 2 of FIG. 23). The request output circuit RQOUT further compares the register NxDs value 12, the register NxDe value 19, the counter D0S value 0, the counter D0E value 4, the counter D1S value 17, the counter D1E value 24, with the counter D2S value 0, the counter D2E value 0, and the response overlap tolerance time width DOVLP value 0; and checks if the response RsR4ID1S6 for the request RqR4ID1S6 is overlapping time-wise with the other response RsR4ID2S5 (process in Steps 3, 4, 5 of FIG. 23). Therefore in that case, the request RqR4ID1S6 cannot be output (process in Step 8 of FIG. 23). The request output circuit then repeatedly performs Step 3, Step 4, Step 5, and Step 8.

At the CLK time position 29, the request output circuit compares the register NxDs value 12, the register NxDe value 19, the counter D0S value 0, the counter D0E value 0, the counter D1S value 5, the counter D1E value 12, with the counter D2S value 0, the counter D2E value 0, and the response overlap tolerance time width DOVLP; and checks that the response RsR4ID1S6 for the request RqR4ID1S6 is not overlapping time-wise with the other response (process in Steps 3, 4, 5 of FIG. 23). The request output circuit next outputs the request RqR4ID1S6 from the request signal RqMux0 at the CLK time position 30, and sets the register NxDs value 12 and the register NxDe value 19 into the counters D0S and D0E (process in Step 6 of FIG. 23).

The response operation is described next. The memory device M0 accepts the request RqR4ID1S4, and checks if this is a request directed towards itself by a match between the ID value 1 contained in this request RqR4ID1S4 with the ID value 1 retained in its own ID register circuit IDR. The memory device M0 next utilizes the read command RD contained in the request RqR4ID1S4, the bank address BK0 and column address COL32, the read data length RDL value byte address BTADD value 0, and the read data length value 4, to readout a 4 byte portion of data from the sense amplifier SenseAmp of memory bank MBank0 in the memory circuit Mem0, with the column address 32 as the start address.

A response RqR4ID1S4 attached with a common response section CMNRESF comprised of a response start flag ResStFlag value 1, identification number ID value 1, a 4 byte data read command RD4, a master number MID value 3, a read data length RDL value 4, a response number ResN value 4 (value equivalent to request number ReqN value 4) is generated in the 4 byte portion of data that was read out. The response RsR4ID1S4 is subsequently transferred to the response queue of the response queue number 0 within the response queue RsQo specified by the response queue number QUN value 0, and then inputs it by way of the response signal RsMux0 to the response input circuit RSIN of the memory control circuit DCMC. The latency of the response RsR4ID1S4 in this case becomes a latency m0Lat value of 12 clock cycles.

The memory device M0 accepts the request RqR4ID2S5, and compares the ID value 2 contained in this request RqR4ID2S5 with the ID value 1 retained in its own ID register circuit IDR. These two values do not match so the memory device M0 sends the request RqR4ID2S5 to the memory device M1.

The memory device M1 accepts the request Rq4ID2S5 and checks that the request is for itself by the match between ID value 2 contained in this request RqR4ID2S5, and the ID value 2 retained in its own ID register circuit IDR.

The memory device M1 next utilizes the read command RD contained in the request RqR4ID2S5, as well as the bank address BK0 and column address COL32, the read data length RDL value byte address BTADD value 0, and the read data length RDL value 4, to read out a 4 byte portion of data from the data buffer DataLat in the memory bank NV1Bk of the memory circuit Mem1, with the column address 32 as the start address.

A response RsR4ID2S5 attached with a common response section CMNRESF comprised of a response start flag ResStFlag value 1, an identification number ID value 2, a 4 byte data read command RD4, a master number MID value 3, a read data length RDL value 4, a response number ResN value 5 (value equivalent to request number ReqN value 5) is generated in the 4 byte portion of data that was read out. The response RsR4ID2S5 is subsequently transferred to a response queue in the response queue number 0 within the response queue RsQo specified by the response queue number QUN value 0, and then sent by way of the response signal RsMux1 to the memory device M0.

This response RsR4ID2S5 is stored in the response queue circuit RsQp of the memory device M0, and the response signal RsMux0 inputs it to the response input circuit RSIN of the memory control circuit DCMC. The latency of the response RqR4ID1S4 at this time becomes a latency m1Lat value of 24 clock cycles.

The memory device M0 accepts the request RsR4ID1S6, and checks that this request RsR4ID1S6 is directed towards itself (memory device M0) by a match between the ID value 1 contained in this request RsR4ID1S6, and the ID value 1 retained in its own ID register circuit IDR. Next, the memory device M0 utilizes the read command RD contained in the request RsR4ID1S6 of the memory device M0, along with the bank address BK0 and the column address COL64, the read data length RDL value byte address BTADD value 0, and the read data length RDL value 4, to readout a 4 byte portion of data from the sense amplifier SenseAmp of the memory bank MBank0 in the memory circuit Mem0, with the column address 64 as the start address.

A response RsR4ID1S6 attached with a common response section CMNRESF comprised of a response start flag ResStFlag value 1, identification number ID value 1, a 4 byte data read command RD4, a master number MID value 3, a read data length RDL value 4, a response number ResN value 6 (value equivalent to request number ReqN value 6) is generated in the 4 byte portion of data that was readout. The response RsR4ID1S6 is subsequently transferred to the response queue of the response queue number 0 within the response queue RsQo specified by the response queue number QUN value 0, and then inputs by way of the response signal RsMux0 to the response input circuit RSIN of the memory control circuit DCMC. The latency of the response RsR4ID1S6 in this case becomes a latency m0Lat value of 12 clock cycles.

The read-out of data in the memory device M0 and the M1 was described above. Needless to say however, the same operation can also be implemented in the other memory device M2.

By setting the DOVLP within the latency control register LCREG to 0 in this way, the memory control circuit DCMC can improve the data transfer rate while maintaining the response of the memory device M0, M1 and M2 at a minimum latency.

Figure 26:
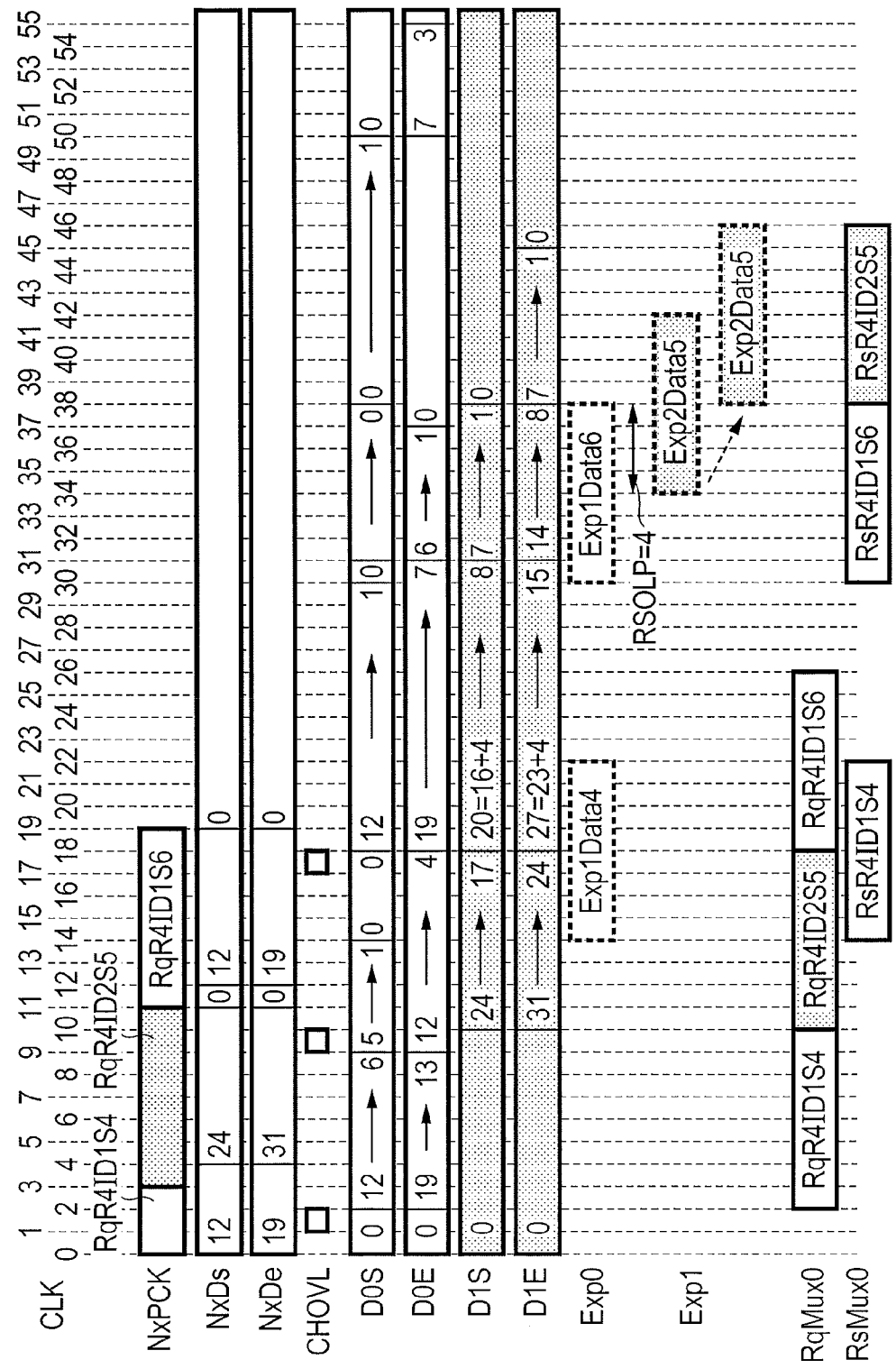
FIG. 26 is a timing diagram showing one example of the operation waveform in the information processing system of this invention.

FIG. 26 is a drawing shown an example of the operation waveform in the read-out operation for reading out data from the memory device M0 and memory device M1 in the memory control circuit DCMC (variable latency mode), when a 1 was set in the latency control flag LCFLG of the latency control register LCREG, and a 4 was set in the response overlap tolerance time DOVLP.

When the response overlap tolerance time width DOVLP is 4, the memory control circuit DCMC outputs a request to the request signal RqMux0 in order to attain a high data transfer rate and to reduce the latency of each response to as small as small a value as possible, in the range within 4 clock cycles in the overlapping area of the time zone of response B made to the request B to the next issuing memory device, from the start time position of the response A for the request A already issued to the request signal RqMux0 to any of the memory devices (any of memory devices M0, M1, M2).

The requests RqR4ID1S4, RqR4ID2S5 and RqR4ID1S6 are retained in the request queue REQQ2. The request output circuit RQOUT processes the requests retained in the request queue REQQ2 in sequence.

The requests RqR4ID1S4 and request RqR4ID1S6 are read requests made to the memory device M0. The request RqR4ID2S5 is a read request to the memory device M1. These requests are the same as the requests shown in FIG. 24.

The basic operation of the request output circuit RQOUT is the same as in FIG. 24. The basic operation of the register NxDs and the register NxDe, and the counters D0S, D0E, D1S, D1E, D2S and D2E is also the same as in FIG. 24. Setting the DOVLP value to 4, allows speeding up the output timing of the request RqR4ID1S6 from the request output circuit RQOUT and improving data transfer performance compared to FIG. 25.

The operation of the request output circuit RQOUT when outputting the request RqR4ID1S4 to the memory device M0 is described next.

The request output circuit RQOUT inputs the request RqR4ID1S4 already in the memory device M0, to the request retainer circuit NxPCK, and if the decoded result is that the request RqR4IS1S4 is a read request (process in Step 0 of FIG. 23), then at the next CLK time position 0, the request output circuit RQOUT calculates the start time position RTLAT and the final end time position RBLAT of the response RsR4ID1S4 corresponding to the request RqR4ID1S4, and sets the start time position RTLAT value of 12 into the register NxDs, and sets the final end time position RBLAT value of 19 into the register NxDe (process in Step 1 in FIG. 23).

To output this request RqR4ID1S4, at CLK time position 1, the request output circuit RQOUT checks that the value of the counter C0TRCD has become 0 (process in Step 2 of FIG. 23). The request output circuit RQOUT further compares the register NxDs value 12, the register NxDe value 19, the counter D0S value 0, the counter D0E value 0, the counter D1S value 0, the counter D1E value 0, with the counter D2S value 0, the counter D2E value 0, and the response overlap tolerance time width DOVLP value 0; and checks that there are no other responses overlapping time-wise in the response RsR4ID1S4 for the request RqR4ID1S4 (process in Steps 3, 4, 5 of FIG. 23).

Then, at the CLK time position 2, the request signal Mux0 outputs the request RqR4ID1S4, and sets the register NxDs value 12 and the register NxDe value 19 into the counters D0S and D0E (process in Step 6 of FIG. 23).

Next, subsequent to the request RqR4ID1S4, the operation for the request output circuit RQOUT to send a request RqR4ID2S5 containing a read command to the memory device 1 is described.

At the CLK time position 3, the request output circuit RQOUT is input with the request RqR4ID2S5 retained in the request queue REQQ2, and if the decoding result is that the request RqR4ID2S5 is a read request (process in Step 0 of FIG. 23), then at the next CLK time position 4, the request output circuit RQOUT calculates the start time position RTLAT and the final end time position RBLAT of the response RsR4ID2S5 corresponding to the request RqR4ID2S5, and sets the start time position RTLAT value of 24 into the register NxDs, and sets the final end time position RBLAT value of 31 into the register NxDe (process in Step 1 in FIG. 23).

Next, in order to output the request RqR4ID2S5, at CLK time position 9, the request output circuit RQOUT checks that the value of the counter C1TRCD has become 0 (process in Step 2 of FIG. 23). The request output circuit RQOUT further compares the register NxDs value 24, the register NxDe value 31, the counter D0S value 5, the counter D0E value 12, the counter D1S value 0, the counter D1E value 0, with the counter D2S value 0, the counter D2E value 0, and the response overlap tolerance time width DOVLP value 4; and checks there are no other responses overlapping time-wise in response RsR4ID2S5 for the request RqR4ID1S5 (process in Steps 3, 4, 5 of FIG. 23).

Then at the CLK time position 10, the request signal RqMux0 outputs the request RqR4ID2S5, and sets the register NxDs value 24 and the register NxDe value 31 into the counters D1S and D1E (process in Step 6 of FIG. 23).

Following the request RqR4ID2S5, the operation for the request output circuit RQOUT to output a request RqR4ID1S6 containing a read command to the memory device 0 is described next.

At the CLK time position 11, the request output circuit RQOUT is input with the request RqR4ID1S6 retained in the request queue REQQ2, and if the decoding result is that the request RqR4ID1S6 is a read request (process in Step 0 of FIG. 23), then at the next CLK time position 12, the request output circuit RQOUT calculates the start time position RTLAT and the final end time position RBLAT of the response RsR4ID1S6 corresponding to the request RqR4ID1S6, and sets the start time position RTLAT value of 12 into the register NxDs, and sets the final end time position RBLAT value of 19 into the register NxDe (process in Step 1 in FIG. 23).

Next, in order to output the request RqR4ID1S6, at CLK time position 17 the request output circuit RQOUT checks that the value of the counter C0TRCD has become 0 (process in Step 2 of FIG. 23). The request output circuit RQOUT further compares the register NxDs value 12, the register NxDe value 19, the counter D0S value 0, the counter D0E value 4, the counter D1S value 17, the counter D1E value 24, with the counter D2S value 0, the counter D2E value 0, and the response overlap tolerance time width DOVLP 4; and finds that the response RsR4ID1S6 for the request RqR4ID1S6 is overlapping time-wise with the other response RsR4ID2S5 time zone (process in Steps 3, 4 of FIG. 23). This overlap time width RSOLP becomes 4{=(register NxDe value 19+1)−(D1S value 17−1)}, and confirms that the value is below the response overlap tolerance time DOVLP value 4 (process in Step 5 of FIG. 23).

At the next CLK time position 18, the request signal RqMux0 outputs a request RqR4ID1S6, and the register NxDs value 12 and the register NxDe value 19 are set in the counters D0S and D0E. Moreover the counter D1S is updated from the current value of 16 to a value of 20 by adding the overlap time width RSOLP value of 4. The counter D1E is updated from the current value of 23 to a value of 27 by adding the overlap time width RSOLP value of 4 (process in Step 6 in FIG. 23).

Next, the response operation is described. The memory device M0 accepts the request RqR4ID1S4, and checks by way of the match between the ID value 1 contained in this request RqR4ID1S4, and the ID value 1 retained in its own ID register IDR that this is a request for itself. The memory device M0 then outputs the response RsR4IDS4 from the response signal RsMux0. The operation of the memory device M0 is in this case the same as the operation in FIG. 25. The latency of the response RsR4ID1S4 becomes the latency m0Lat value of 12 clock cycles.

The memory device M0 accepts the request RqR4ID2S5, and compares the ID value 2 contained in the this request RqR4ID2S5, with the ID value 1 retained in its own ID register circuit IDR. The two ID values do not match, so the memory device M0 sends the request RqR4ID2S5 to the memory device M1.

The memory device M1 accepts the request RqR4ID2S5, and checks by way of the match between the ID value 2 contained in this request RqR4ID2S5, and the ID value 2 retained in its own ID register IDR that this is a request for itself, and outputs a response RsR4ID2S5 from the response signal RsMux1 to the memory device M0. The memory device M0 inputs the response RsR4ID2S5 by way of the response signal RsMux0 to the response input circuit RSIN of the memory control circuit DCMC.

In this case, the memory device M0 outputs the response RsR4ID2S5 after first outputting the response RsR4ID1S6 for the request RqR4ID1S6 and therefore the latency of the response RsR4ID2S5 becomes 28 clock cycles.

The memory device M0 accepts the request RqR4ID1S6, and checks by way of the match between the ID value 1 contained in this request RqR4ID1S6, and the ID value 1 retained in its own ID register IDR that this is a request for itself, and outputs a response RsR4ID2S6 from the response signal RsMux0. The response RsR4ID1S6 is output prior to the response RsR4ID2S5 for the request RqR4ID2S5, and the latency of the response RsR4ID1S6 becomes the latency m0Lat value of 12 clock cycles.

Setting the response overlap tolerance time DOVLP within the latency control register LCREG to 4 as shown in FIG. 26, increases value 4 in the latency of the request RqR4ID2S5, and the time used up in the data transfer is T46−T2=44 clock cycles, and also signifies that the time becomes 4 clock cycles shorter than in the case where the response overlap tolerance time DOVLP was set 0 as shown in FIG. 25.

The read out of data in the memory device M0 and M1 was described above but needless to say however, the same operation can also be implemented on the other memory device M2.

By setting the response overlap tolerance time DOVLP within the latency control register LCREG to 4, and by setting to variable latency mode, the response time zone in the memory device attains a range that overlaps within 4 clock cycles, and the respective latency of the response can be reduced as small as possible. Moreover, requests are output to the request signal RqMux0 so as to attain a high data transfer rate. So in other words, by changing the response time zone from each memory device to a time zone width (response overlap tolerance time DOVLP) where overlapping is tolerable, the data transfer rate and latency demanded by the information processing system can be flexibly provided as needed.

Figure 27:
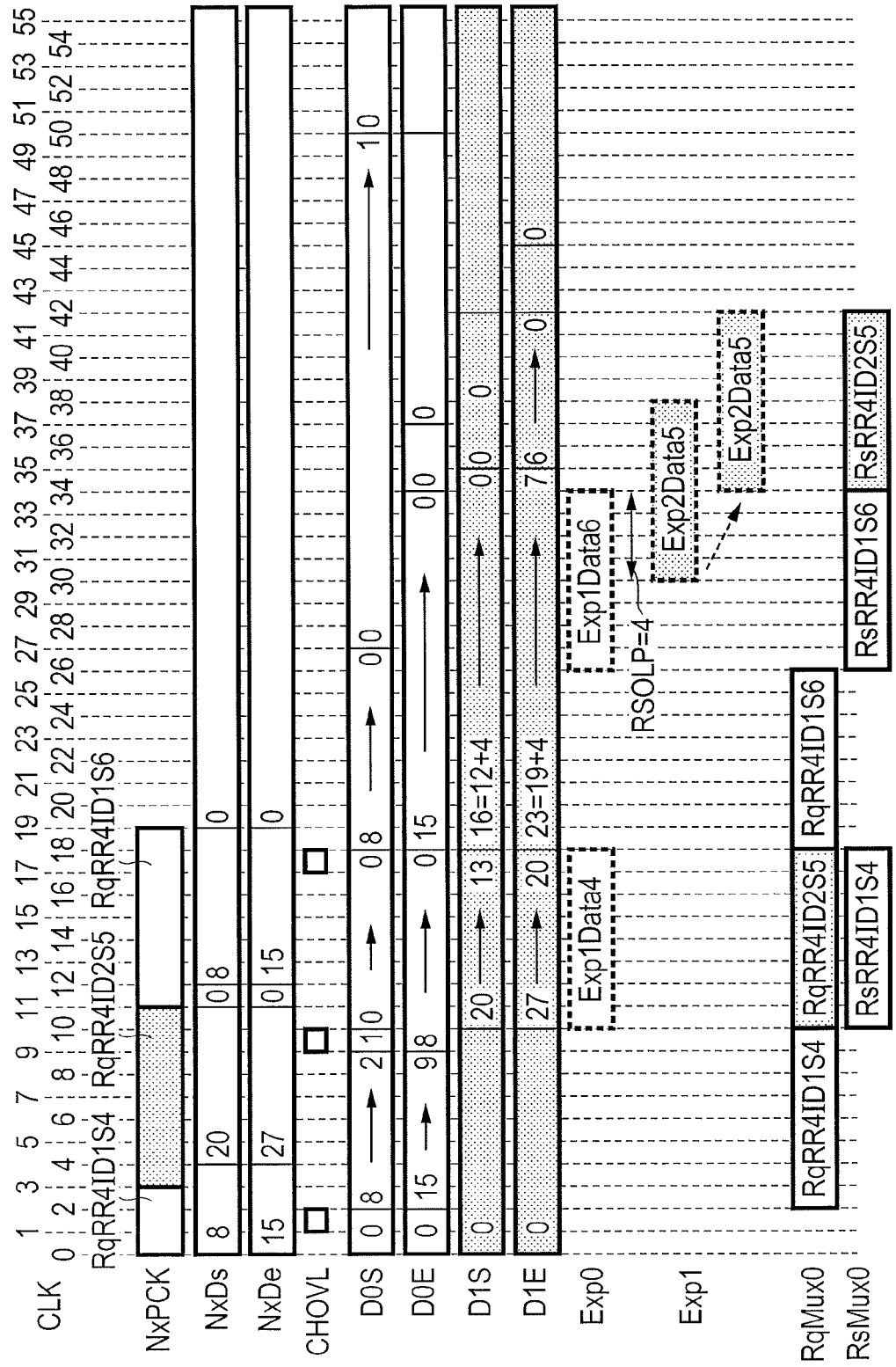
FIG. 27 is a timing diagram showing one example of the operation waveform in the information processing system of this invention.

FIG. 27 is a drawing shown an example of the operation waveform in the operation for directly reading out data from the response queue in the memory devices M0 and M1, when (in fixed latency mode) a 1 was set in the latency control flag LCFLG of the latency control register LCREG, and the response overlap tolerance time DOVLP was set to 4 in the of the latency control register LCREG.

The requests RqRR4ID1S4, RqRR4ID2S5, and RqRR4ID1S6 are retained in the request queue REQQ2. The request output circuit RQOUT processes the requests retained in the request queue REQQ2 in sequence.

The requests RqRR4ID1S4 and RqRR4ID1S6 are read requests to the memory device M0. The request RqRR4ID2S5 is a read request to the memory device M1.

The request RqRR4ID1S4 is comprised of a request start flag RqStFL value 1, an identification number ID value 1, a response queue read command RRD, a master number MID value 3, a variable request length VREQL value 4, a request number ReqN value 4, a response queue number RQN value 0, a byte address BTADD value 0, and a read data length value 4.

The request RqRR4ID2S5 is comprised of a request start flag RqStFL value 1, an identification number ID value 2, a response queue read command RRD, a master number MID value 3, a variable request length VREQL value 4, a request number ReqN value 5, a response queue number RQN value 0, a byte address BTADD value 0, and a read data length value 4.

The request RqRR4ID1S6 is comprised of a request start flag RqStFL value 1, an identification number ID value 1, a response queue read command RRD, a master number MID value 3, a variable request length VREQL value 4, a request number ReqN value 4, a response queue number RQN value 1, a byte address BTADD value 0, and a read data length value 4.

The basic operation of the request output circuit RQOUT is the same as the operation in FIG. 25. The basic operation of the register NxDs and the register NxDe, and the counters D0S, D0E, D1S, D1E, D2S and D2E are also the same as in FIG. 25. The requests RqRR4ID1S4, RqRR4ID2S5, and RqRR4ID1S6 are read commands for direct read-out of data from the response queue of the memory device and so the latency of the response becomes shorter than that of FIG. 26 and further improves the data transfer performance.

The operation when the request output circuit RQOUT is outputting the request RqRR4ID1S4 to the memory device M0 is described next.

When the decoded result from the request RqRR4ID1S4 for the memory device M0 that was previously input to the request retainer circuit NxPCK is a read request (process in Step 0 of FIG. 23), then at the next CLK time position 0, the request output circuit RQOUT calculates the start time position RTLAT and the final end time position RBLAT of the response RsRR4ID1S4 corresponding to the request RqRR4ID1S4, and sets the start time position RTLAT value of 8 into the register NxDs, and sets the final end time position RBLAT value of 15 into the register NxDe (process in Step 1 in FIG. 23).

Next, in order to output the request RqRR4ID1S4 at the CLK time position 1, the request output circuit RQOUT checks that the value of the counter C0TRCD has become 0 (process in Step 1 in FIG. 23). The request output circuit RQOUT further compares the register NxDs value 8, the register NxDe value 15, the counter D0S value 0, the counter D0E value 0, the counter D1S value 0, the counter D1E value 0, with the counter D2S value 0, the counter D2E value 0, and the response overlap tolerance time width DOVLP value 4, and checks that there are no other responses overlapping time-wise in the response RsRR4ID1S4 for the request RqRR4ID2S4 (process in Steps 3, 4, 5 of FIG. 23).

At the CLK time position 2, the request signal RqMux0 then outputs a request RqRR4ID1S4, and sets the register NxDs value 8 and the register NxDe value 15 into the counters D02 and D0E (process in Step 6 of FIG. 23).

Next, subsequent to the request RqRR4ID1S4, the operation when the request output circuit RQOUT outputs a request RqRR4ID2S5 containing a read command to the memory device 1 is described.

The request output circuit RQOUT inputs the request RqRR4ID2S5 retained in the request queue REQQ2, at the CLK time position 3, and if the decoded result is that the request RqRR4ID2S5 is a read request (process in Step 0 in FIG. 23), then at the next CLK time position 4, the request output circuit RQOUT calculates the start time position RTLAT and the final end time position RBLAT of the response RsRR4ID2S5 corresponding to the request RqRR4ID2S5, and sets the start time position RTLAT value 20 into the register NxDs, and sets the final end time position RBLAT value 27 into the register NxDe (process in Step 1 in FIG. 23).

In order to output the request RqRR4ID1S5, at the CLK time position 9, the request output circuit RQOUT checks that the value of the counter C1TRCD has become 0 (process in Step 2 in FIG. 23). The request output circuit RQOUT further compares the register NxDs value 24, the register NxDe value 31, the counter D0S value 1, the counter D0E value 8, the counter D1S value 0, the counter D1E value 0, with the counter D2S value 0, the counter D2E value 0, and the response overlap tolerance time width DOVLP value 4, and checks that there are no other responses overlapping time-wise in the response RsRR4ID2S5 for the request RqRR4ID2S5 (process in Steps 3, 4, 5 of FIG. 23).

Then, at the next CLK time position 10, the request signal RqMux0 outputs a request RqRR4ID2S5, and sets the register NxDs value 20 and the register NxDe value 27 into the counters D1S and D1E (process in Step 6 of FIG. 23).

Next, the operation when following the request RqRR4ID2S5, the request output circuit RQOUT outputs the request RqRR4ID1S6 containing the read command, to the memory device M0 is described next.

At the CLK time position 11, the request output circuit RQOUT inputs the request RqRR4ID1S6 retained in the request queue REQQ2, and if the decoded result is that the request RqRR4ID1S6 is a read request (process in Step 0 in FIG. 23), then at the next CLK time position 12, the request output circuit RQOUT calculates the start time position RTLAT and the final end time position RBLAT of the response RsRR4ID1S6 corresponding to the request RqRR4ID1S6, and sets the start time position RTLAT value of 18 into the register NxDs, and the final end time position RBLAT value of 15 into the register NxDe (process in Step 1 of FIG. 23).

In order to output the request RqRR4ID1S6, the request output circuit RQOUT checks at the CLK time position 17, that the value of the counter C0TRCD has become 0 (process in Step 2 in FIG. 23). The request output circuit RQOUT further compares the register NxDs value 8, the register NxDe value 15, the counter D0S value 0, the counter D0E value 0, the counter D1S value 13, the counter D1E value 20, with the counter D2S value 0, the counter D2E value 0, and the response overlap tolerance time width DOVLP value 4; and finds that the response RsRR4ID1S6 for the request RqRR4ID1S6 is overlapping time-wise with the other response RsRR4ID2S5 time zone (process in Steps 3, 4 of FIG. 23). This overlap time width RSOLP becomes 4{=(register NxDe value 15+1)−(D1S value 13−1)}, and confirms that the value is within the response overlap tolerance time DOVLP value 4 (process in Step 5 of FIG. 23).

At the next CLK time position 18, the request signal RqMux0 outputs the request RqRR4ID1S6, and sets the register NxDs value 8, and the register NxDe value 15 into the counters D0S and D0E. The current value of 12 on the counter D1S is further updated to attain a value 16 by adding the overlap time width RSOLP of 4. The current value of 19 on the counter D1E is updated to a value of 23 by adding the overlap time width RSOLP of 4 (process in Step 6 of FIG. 23).

The response operation is described next. The memory device M0 accepts the request RqRR4ID1S4, and checks that the request RqRR4ID1S4 is directed towards itself, by way of the match between the ID value 1 contained in this request RqRR4ID1S4 with the ID value 1 retained in its own ID register circuit IDR. The memory device M0 next utilizes the response queue read command RRD, the response queue number RQN value 0, the byte address BTADD value 0, and the read data length RDL value 4 contained in the request RqRR4ID1S4, to read out a 4 byte portion of data with the byte address BTADD value 0 as the start address; from the response queue for the response queue number 0 specified by the response queue number QUN value 0 within the response queue RsQo of the memory device M0. The data is read out directly from the response queue RsQo at this time, so the latency of the response RsRR4ID1S4 is set to 8 clock cycles.

The memory device M0 accepts the request RqRR4ID2S5, and compares the ID value 2 contained in this request RqRR4ID2S5, with the ID value 1 retained in its own ID register circuit IDR. The two values are not a match, so the memory device M0 sends the request RqRR4ID2S5 to the memory device M1. The memory device M1 accepts the request RqRR4ID2S5, and checks that the request RqRR4ID2S5 is directed towards itself, by way of the match between the ID value 2 contained in this request RqRR4ID2S5, and the ID value 2 retained in its own ID register circuit IDR. The memory device M1 next utilizes the response queue read command RRD, the response queue number RQN value 0, the byte address BTADD value 0, and the read data length RDL value 4 contained in the request RqR4ID1S5, to read out a 4 byte portion of data with the byte address BTADD value 0 as the start address; from the response queue of response number 0 specified by the response queue number QUN value 0 within the response queue RsQo of the memory device M1, and the response signal RsMux1 outputs the response RsRR4ID2S5 to the memory device M0. The response RsRR4ID2S5 is then input from the memory device M0 by way of the response signal RsMux0 to the response input circuit RSIN of the memory control circuit DCMC.

After the response RsRR4ID1S4 for the request RqRR4ID1S4 is output, the response RsRR4ID2S5 is output from the memory device M0, so that the latency of the response RsRR4ID2S5 becomes 24 clock cycles.

The memory device M0 accepts the request RqRR4ID1S6, and checks that the request RqRR4ID1S6 is directed towards itself, by way of the match between the ID value 1 contained in this request RqRR4ID1S6 with the ID value 1 retained in its own ID register circuit IDR. The memory device M0 next utilizes the response queue read command RRD, the response queue number RQN value 0, the byte address BTADD value 1, and the read data length RDL value 4 contained in the request RqR4ID1S6, to read out a 4 byte portion of data with the byte address BTADD value 0 as the start address; from the response queue of the response queue number 1 specified by the response queue number QUN value 1 within the response queue RsQo of the memory device M0.

The data is read out directly from the response queue RsQo at this time, so the latency of the response RsRR4ID1S6, so the latency becomes 8 clock cycles.

As shown in FIG. 27, the time used up in the data transfer of data directly read out from the response queue of the memory device is T42−T2=40 clock cycles; and the time becomes 4 clock cycles shorter than that in the case of FIG. 26. The read-out of data from the memory devices M0 and M1 was described above, needless to say however the same operation can be implemented on the memory device M2.

By reading out data directly from the response queue of the memory device in this way, the latency of the response is shortened, and moreover a high data transfer rate can be achieved.

The latency control mode (namely, where the latency control flag LCFLG in the latency control register LCREG is set to 1) operation was described above. However, in latency non-controlled mode (namely where the latency control flag LCFLG is set to 0), the request output circuit RQOUT outputs a request when the conditions in step 2 were satisfied among the processing shown in FIG. 23. In this case, the request output circuit RQOUT consecutively outputs the request to several queues available in the request queue RqQI without taking into account the time zone of the response. Due to this state, the requests accepted by the memory devices from M0 through M2 cannot be immediately processed and are often retained for long periods within the request queue RqQI, so that the latency of the response becomes irregular. However this condition signifies that the next request is being received prior to processing of requests already accepted by the memory devices M0 through M2 and the requests retained in the request queue RqQI are processed at the shortest possible processing time within each memory device, so the transfer along the response path can be made at the maximum possible transfer rate as long as there are still responses present. The present embodiment therefore allows making flexible settings to match the demands of each system since there are three types of modes available; namely the latency non-control mode, the fixed latency mode, and the variable latency mode.

Operation of the Response Scheduler Circuit SCH

Figure 28:
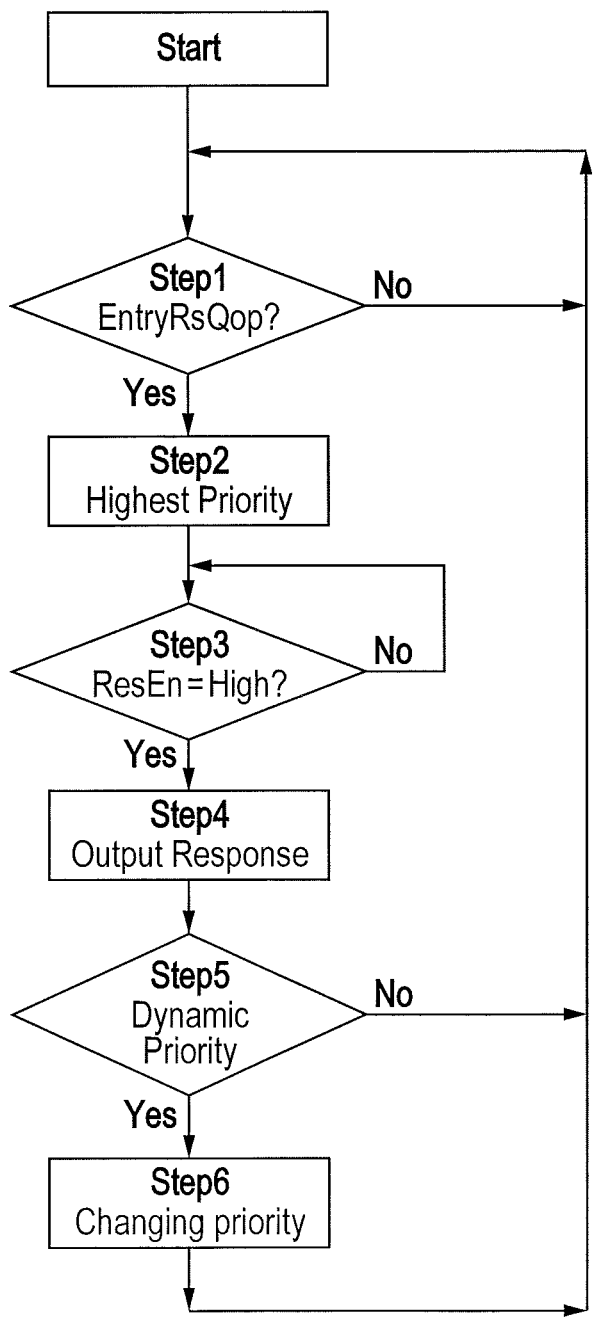
FIG. 28 is a flow chart showing one example of the operation of the response scheduler circuit SCH contained in each memory device.

The operation of the response scheduler circuit SCH is described next. FIG. 28 is a flow chart showing one example of the operation of the response scheduler circuit SCH contained in each memory device. The response scheduler circuit SCH checks first of all whether a response was entered into the response queue circuit RsQo and the response queue circuit RsQp (FIG. 28; Step 1). If there is no response entered in either of the response queue circuit RsQo and the response queue circuit RsQp then a check is once again made for entries in the response queue circuit RsQo and the response queue circuit RsQp.

If a response was entered in either of response queue circuit RsQo and the response queue circuit RsQp, then the response priority sequence is checked, and those responses possessing a high response priority sequence are setup for sending (FIG. 28: Step 2). Next, a check is made of the response enable signal RsEn0 (FIG. 28; Step 3) and if low, then no response is output, and latency scheduler circuit SCH waits for a response enable signal RsEn0 that is High. When the response enable signal RsEn0 is High, then the response possessing the highest priority is output (FIG. 28; Step 4). After the responses are output, a check is made of the control method for the output priority sequence relating to the response set in each memory device (FIG. 28; Step 5). If the control method for the output priority sequence relating to responses is the fixed sequence method, then no changes in the output priority sequence of the responses are made, and if the variable sequence method, then the output priority sequence for the responses is changed (FIG. 28; Step 5). The fixed sequence method allows setting responses within the response queue circuit RsQp to a higher priority than the responses within the responses within the response queue circuit RsQo; and setting responses within the response queue circuit RsQo to a higher priority than the responses within the response queue circuit RsQp among response queues contained in each memory device. The variable sequence method also allows changing the priority sequence of responses within the response queue circuit RsQo and responses within the response queue circuit RsQp by the round-robin method among response queues contained in each memory device.

Effect of the First Embodiment

The structure and the effect of the above described first embodiment are summarized as follows.
(1) Possessing a variable latency mode allows high speed operation regardless of the request input sequence since data that can be read out quickly is loaded immediately without waiting for data that reads out slowly. Data transfer can in other words proceed with high efficiency. Moreover, setting a maximum response overlap tolerance time width permits suppressing latency delays within a range allowable by the system even if the latency was changed in order to attain efficient data transfer.
(2) Possessing a fixed latency mode allows system operation where latency is an important, critical item.
(3) Possessing a latency control register allows programming the delay in the latency tolerance so settings can be flexibly made as needed.
(4) When the start time of a response for a request overlaps the time width of another response made for a request, then the delay from the unneeded latency can be prevented by delaying the issue of that (first) applicable request.
(5) In variable latency mode when a response is delayed due to a subsequently issued request, then the mode can update the counter values to match the current circumstances.
(6) Possessing a latency non-controlled mode allows implementing a maximum transfer rate in systems where the latency is not a critical item.

In the example of the above embodiment, the case where the memory module MEM contains one volatile memory, one NOR type flash memory, and one NAND type flash memory is described. Needless to say however, the present invention can also be implemented by a memory module MEM containing a plurality of volatile memories and a plurality of NOR type flash memories and NAND type flash memories.

Second Embodiment

Figure 29:
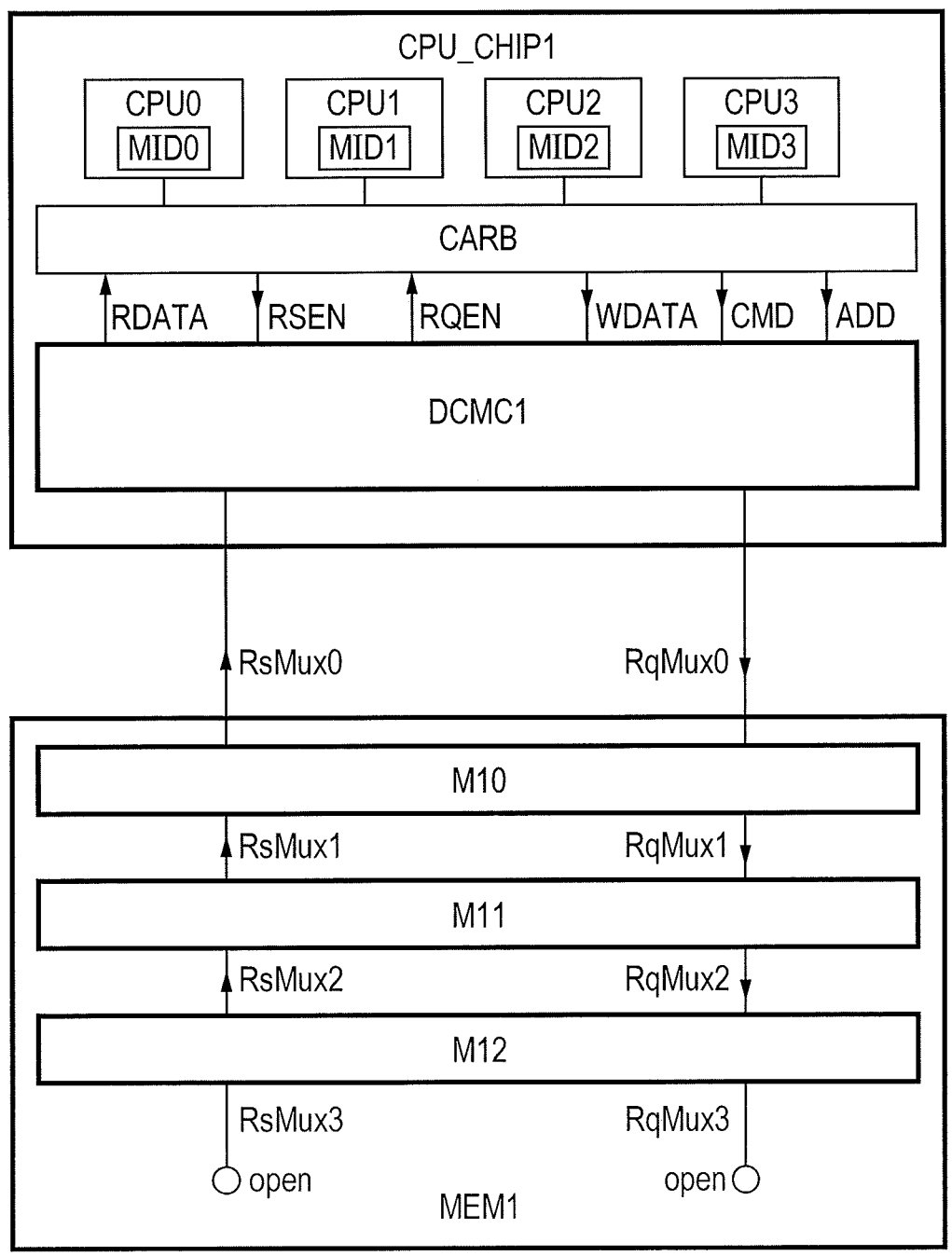
FIG. 29 is a structural diagram of the information processing system of the present invention.
Figure 30:
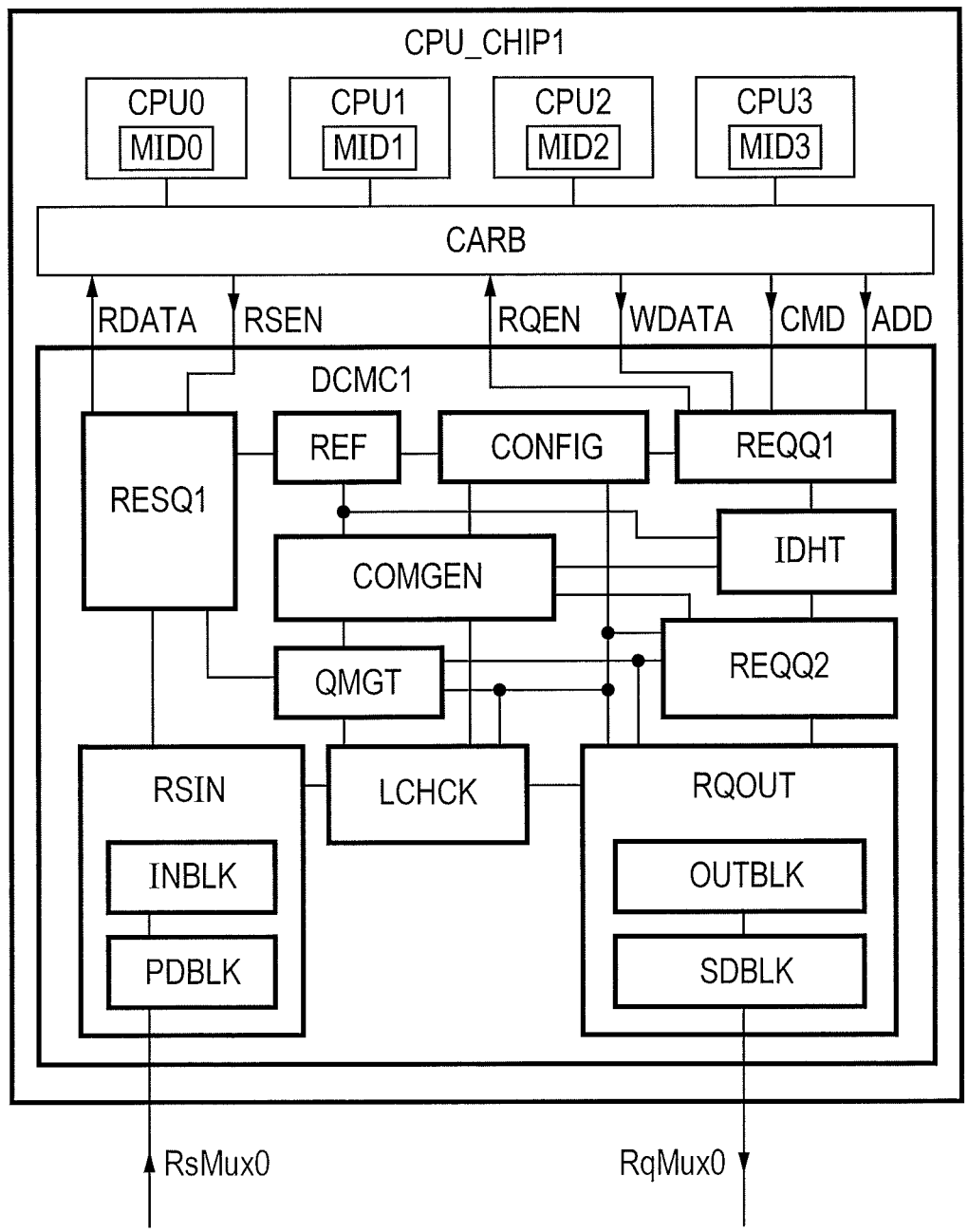
FIG. 30 is a block diagram showing one example of the structure of the information processing device containing the information processing system of the present invention.
Figure 31:
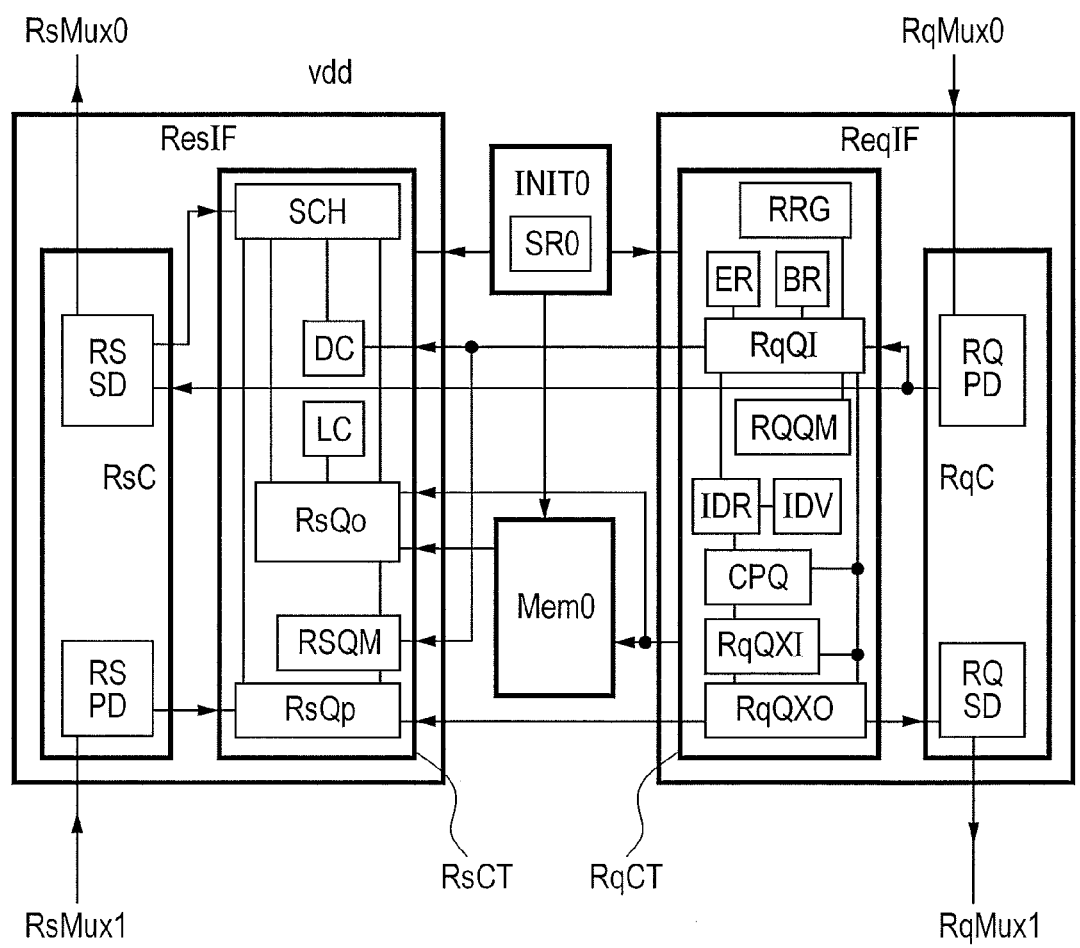
FIG. 31 is a block diagram showing one example of the structure of the memory device.
Figure 32:
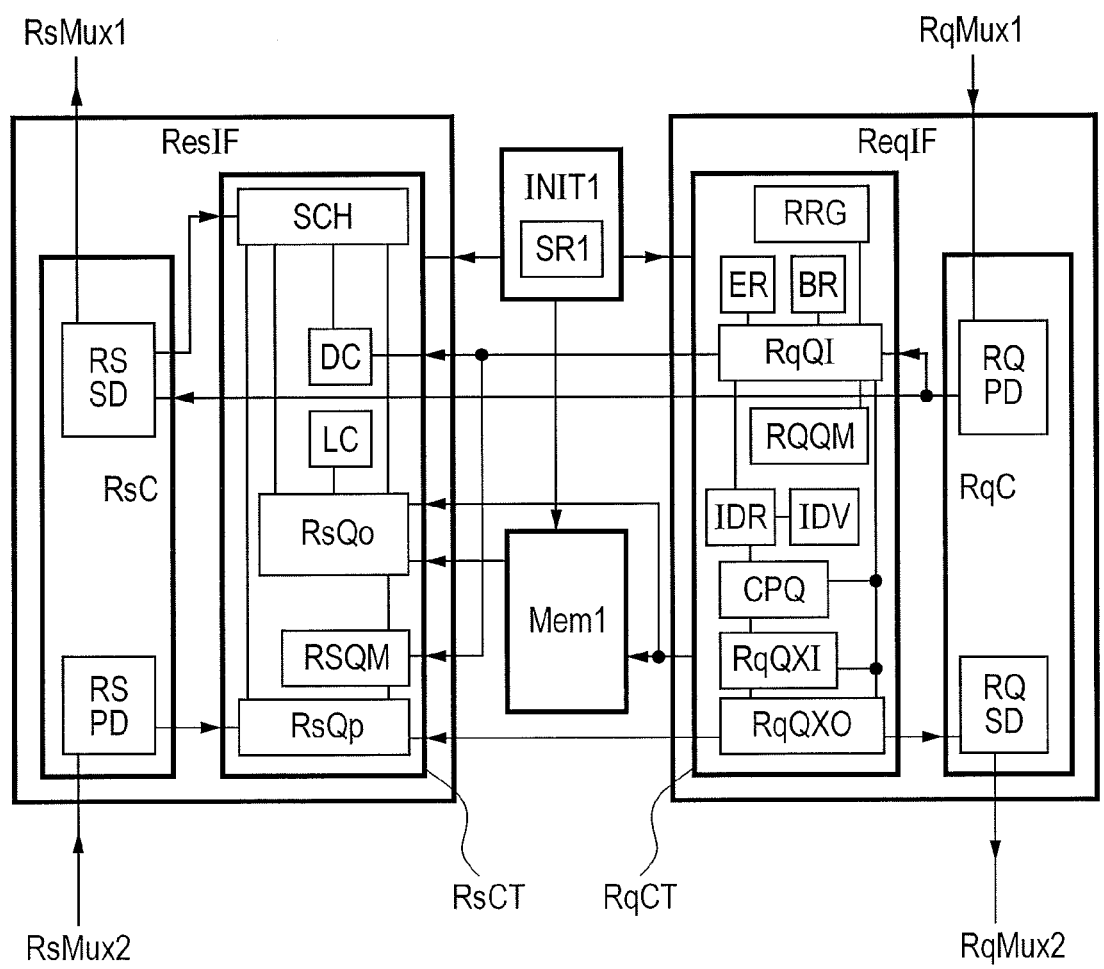
FIG. 32 is a block diagram showing one example of the structure of the memory device.
Figure 33:
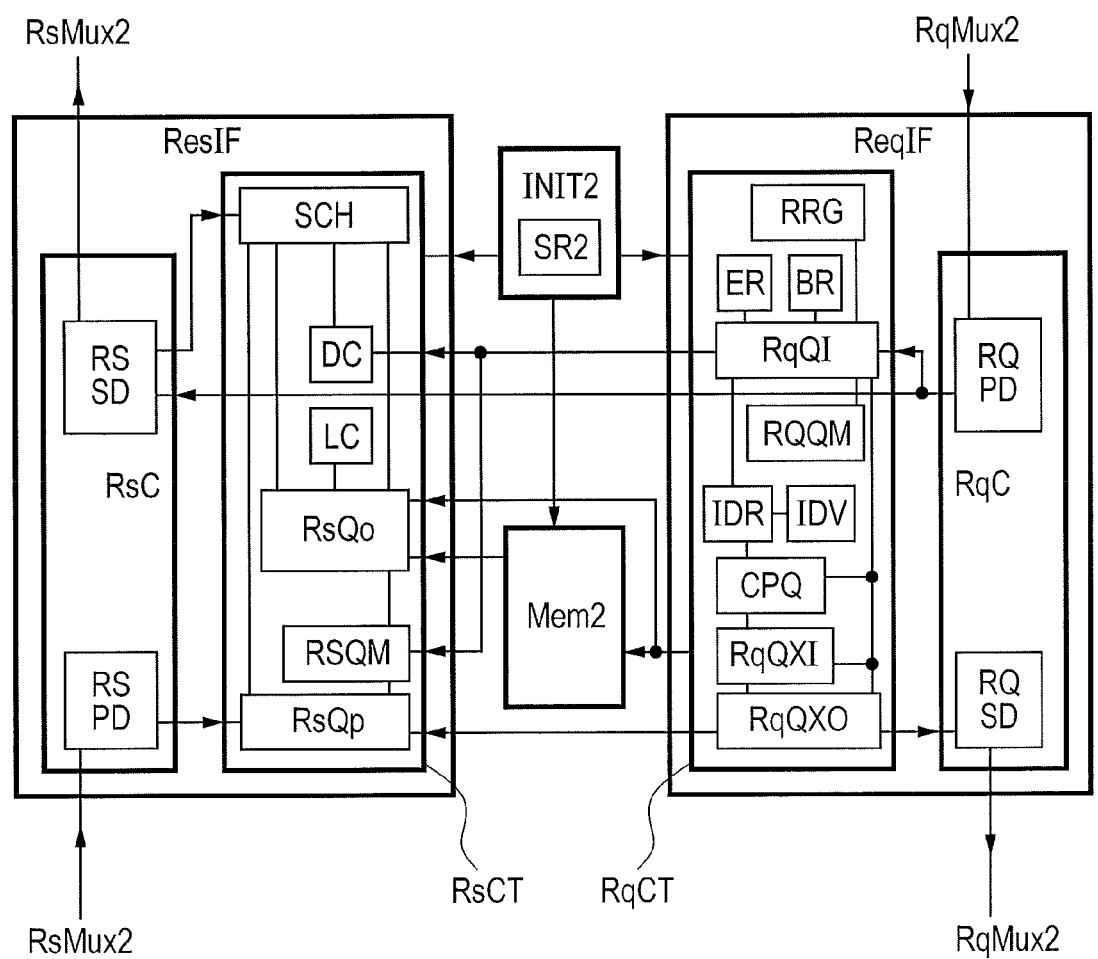
FIG. 33 is a block diagram showing one example of the structure of the memory device.

The information processing system of the second embodiment of the present invention is described next while referring to FIG. 29 through FIG. 33. FIG. 29 is a block diagram showing one example of the structural diagram of the information processing system comprised of a memory module MEM1 and an information processing device CPU_CHIP1 of the second embodiment of the present invention. FIG. 30 is a block diagram showing one example of the structure of the information processing device CPU_CHIP1. The memory module MEM1 is comprised from the memory devices M10, M11, and M12. The information processing device CPU_CHIP1 and the memory devices M10, M11, and M12 are coupled in series. FIG. 31 is a block diagram showing one example of the structure of the memory device M10. FIG. 32 is a block diagram showing one example of the structure of the memory device M11. FIG. 33 is a block diagram showing one example of the structure of the memory device M12.

Clock methods to operate the information processing device CPU_CHIP1 and the memory module MEM1 are the common clock method, source synchronous clock method, and the embedded clock method, etc. All of these clock methods can be utilized in this embodiment. The example of the operation described in the present embodiment utilizes the embedded clock method. Each of the above components is described next.

The information processing device CPU_CHIP1 is comprised of the information processing circuits CPU0, CPU1, CPU2, CPU3, and an arbiter circuit CARB and memory control circuit DCMC1. The memory module MEM1 is comprised of the memory devices M10, M11, and M12. The information processing device CPU_CHIP1 is serially coupled to the memory devices M10, M11, and M12. The information processing circuit CPU0 contains a master number register MID0, the information processing circuit CPU1 contains a master number register MID1, the information processing circuit CPU2 contains a master number register MID2, and the information processing circuit CPU3 contains a master number register MID3.

The information processing circuits CPU0, CPU1, CPU2, CPU3 are the same information processing circuits as in FIG. 1, and execute readout of data for processing by the OS, and the application program and application program from the memory module MEM by way of the arbiter circuit CARB and the memory control circuit DCMC1. Though there are no particular restrictions, the memory control circuit DCMC1 contains a configuration circuit CONFIG, a request queue REQQ1, a hit decision circuit IDHT, a request queue REQQ2, a command generator circuit COMGEN, a request output circuit RQOUT1, a refresh request circuit REF, a queue management circuit QMGT, a latency adjuster circuit LCHCK, a response input circuit RSIN1, and a response queue RESQ1. The configuration circuit CONFIG is comprised of the same registers as shown in FIG. 1 and possesses the same functions.

The request queue REQQ1, the hit decision circuit IDHT, the request queue REQQ2, the command generator circuit COMGEN, the refresh request circuit REF, the queue management circuit QMGT, the latency adjuster circuit LCHCK, and the response queue RESQ1 possess the same functions as in FIG. 1. The request output circuit RQOUT1 is comprised from an output circuit OUTBLK and a serial data circuit SDBLK. The output circuit OUTBLK possesses the same functions as the request output circuit RQOUT shown in FIG. 1, and is a circuit for transferring the request sent from the request queue circuit REQQ2, to the serial data circuit SDBLK.

The serial data circuit SDBLK is a circuit that embeds the clock information into the request sent from the output circuit OUTBLK, also converts to serial data, and issues it to the memory module MEM1 by way of the request signal RqMux0. The serial data circuit SDBLK also sends the reference clock RCK to the memory module MEM1. The response input circuit RSIN1 is comprised of the input circuit INBLK and the parallel data circuit PDBLK. The parallel data circuit PDBLK receives the response that was converted to serial data sent from the response signal RsMux0, utilizes the reference clock RCK to extract the clock information embedded in this response, converts the serial data of the response to parallel data, and sends the parallel data to the input circuit INBLK. The input circuit INBLK possesses the same functions and performs the same operation as the request input circuit RSIN shown in FIG. 4.

The memory device M10 is comprised of an initializing setter circuit INIT0, a memory circuit Mem0, a request interface circuit ReqIF, and a response interface circuit ResIF. The request interface circuit ReqIF is comprised of a request signal converter circuit RqC and a request queue control circuit RqCT. The request converter circuit RqC is comprised of a parallel data circuit RQPD and a serial data circuit RQSD.

The response interface circuit ResIF is comprised of a response queue control circuit RsCT and a response signal converter circuit RSC. The response signal converter circuit RsC is comprised from a parallel data circuit RSPD and a serial data circuit RSSD. The parallel data circuit RQPD in the request converter circuit RqC receives the serial data request that was input from the request signal RqMux0, and utilizes the reference clock RefCk to extract the clock information embedded in this request, and converts the serial data request to parallel data, and sends this parallel data to the request queue circuit RqQI of the request queue control circuit RqCT. The serial data circuit RQSD in the request converter circuit RqC is a circuit that embeds the clock information into the request sent from the request queue circuit RqQXO of the request queue control circuit RqCT, also converts it to serial data, and sends the serial data to the memory device M11 by way of the request signal RqMux1.

The parallel data circuit RSPD in the response signal converter circuit RsC receives the serial data response input from the response signal RqMux1, and utilizes the reference clock RefCk (However this reference clock RefCk is not shown in the drawings.) to extract the clock information embedded in this request, converts the serial data response to parallel data, and sends this parallel data to the response queue circuit RsQp of the response queue control circuit RsCT. The serial data circuit RSSD in the response signal converter circuit RsC embeds the clock information in the response sent from the response scheduler circuit SCH of the response queue control circuit RsCT, and also converts the serial data to parallel data, and sends this parallel data by way of the response signal RsMux0 to the response input circuit RSIN1.

The initializing setter circuit INIT0, the memory circuit Mem0, the request queue control circuit RqCT, and the response queue control circuit RsCT possess the same structure and the same functions as the memory device M0 shown in FIG. 4. Therefore, the duties and the functions of the memory device M10 are the same as the memory device M0 shown in FIG. 4.

The memory device M11 is comprised of the initializing setter circuit INIT1, the memory circuit Mem1, the request interface circuit ReqIF, and the response interface circuit ResIF. The request interface circuit ReqIF is comprised from the request signal converter circuit RqC and the request queue control circuit RqCT. The request converter circuit RqC is comprised from the parallel data circuit RQPD and the serial data circuit RQSD.

The response interface circuit ResIF is comprised of the response queue control circuit RsCT and the response signal converter circuit RsC. The response signal converter circuit RsC is comprised of the parallel data circuit RSPD and the serial data circuit RSSD. The parallel data circuit RQPD receives the serial data request input from the request signal RqMux1, and utilizes the reference clock RefCk to extract the clock information embedded in this request, converts the serial data request to parallel data, and sends this parallel data to the request queue circuit RqQI of the request queue control circuit RqCT.

The serial data circuit RQSD is a circuit that embeds clock information into the request sent from the request queue circuit RqQXO of the request queue control circuit RqCT, also converts it to serial data, and sends it to the memory device M12 by way of the request signal RqMux2. The parallel data circuit RSPD receives the serial data response that was input from the response signal RqMux2, and utilizes the reference clock RefCk to extract the clock information embedded in this response, and converts the serial data response to parallel data, and sends this parallel data to the response queue circuit RsQp of the response queue control circuit RsCT.

The serial data circuit RSSD is a circuit that embeds the clock information into the response sent from the response scheduler circuit SCH of the response queue control circuit RsCT, and also converts it to serial data, and sends it by way of the response signal RsMux1 to the memory device M10. The initializing setter circuit INIT1, the memory circuit Mem1, the request queue control circuit RqCT, and the response queue control circuit RsCT possess the same structure and the same functions as the memory device M1 shown in FIG. 4. The duties and the functions of the memory device M11 are the same as the memory device M1 shown in FIG. 5 and FIG. 6.

The memory device M12 is comprised of an initializing setter circuit INIT2, a memory circuit Mem2, a request interface circuit ReqIF, and a response interface circuit ResIF. The request interface circuit ReqIF is comprised of a request signal converter circuit RqC and a request queue control circuit RqCT. The request signal converter circuit RqC is comprised of a parallel data circuit RQPD and a serial data circuit RQSD. The response interface circuit ResIF is comprised of a response queue control circuit RsCT and a response signal converter circuit RsC. The response signal converter circuit RsC is comprised of a parallel data circuit RSPD and a serial data circuit RSSD.

The parallel data circuit RQPD receives the serial data request input from the request signal RqMux2, and utilizes the reference clock RefCk to extract the clock information embedded in this request, and converts the serial data request to parallel data, and sends this parallel data to the request queue circuit RqQI of the request queue control circuit RqCT. The memory device M2 is the end memory device and so the request signal RqMux3 is in a non-connected state, and the serial data circuit RQSD and parallel data circuit RSPD do not operate. The serial data circuit RSSD is a circuit that embeds the clock information sent from the response scheduler circuit SCH of the response queue control circuit RsCT, also converts it to serial data, and sends this serial data to the memory device M11 by way of the response signal RsMux2.

The initializing setter circuit INIT2, the memory circuit Mem1, the request queue control circuit RqCT, and the response queue control circuit RsCT possess the same functions as the memory device M1 shown in FIG. 4. The duties and the functions of the memory device M10 are therefore the same as the memory device M2 shown in FIG. 7 and FIG. 8.

In the above description, the embedded clock method of the present invention embedded clock information in the request and the response which are parallel data, by way of the serial data circuit SDBLK, RQSD and RSSD, and sent this after conversion to serial data. In addition to the effect rendered by the first embodiment, the present embodiment is capable of deleting the request transmit clock signal, and the response transmit clock signal, and further capable of low-power operation. The present embodiment is further capable of reducing the number of response and request signals by one bit each, and achieving an information processing system comprised of an information processing device CPU_CHIP1 and a memory module MEM1.

Third Embodiment

Figure 34:
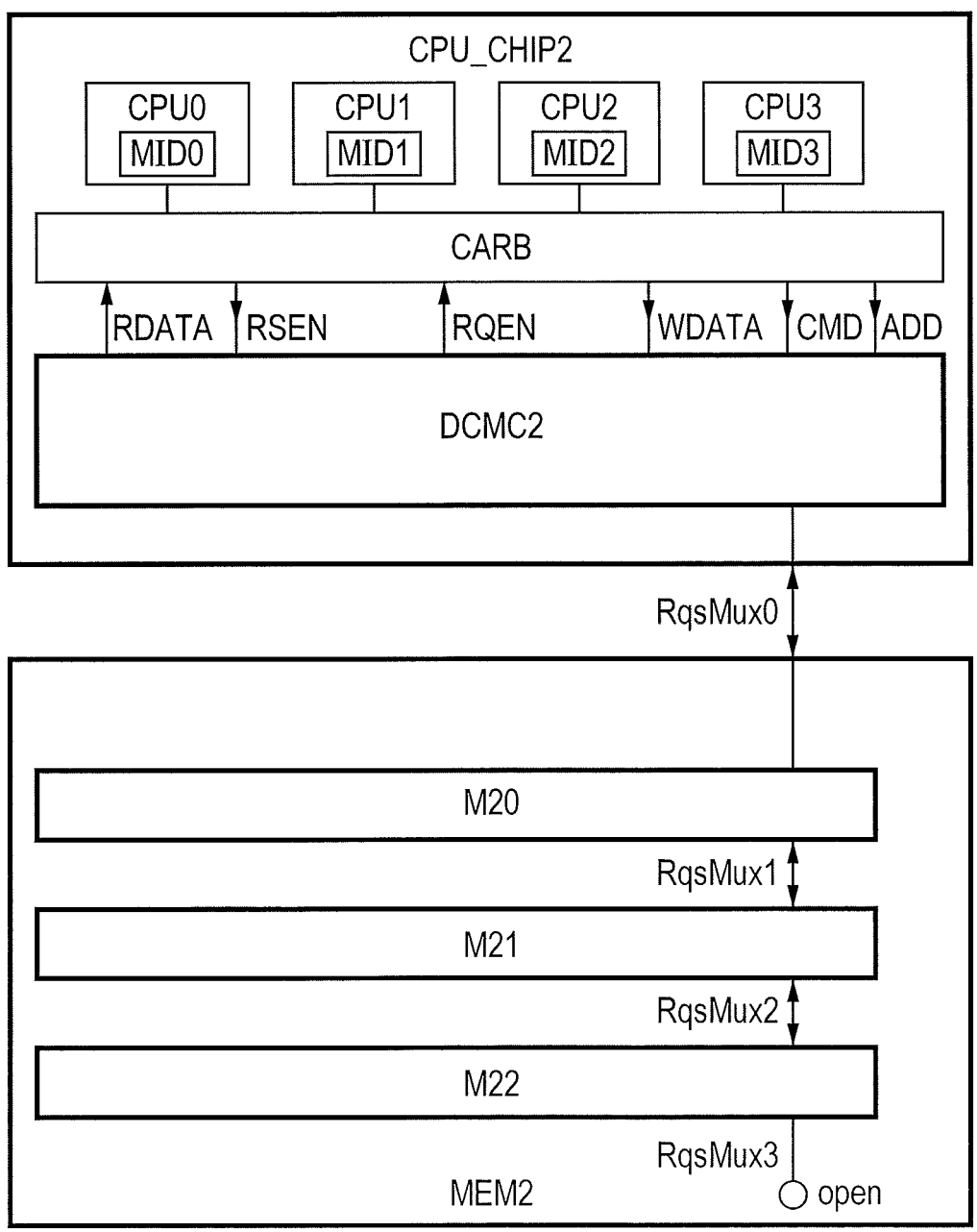
FIG. 34 is a structural diagram of the information processing system of the present invention.

FIG. 34 is a block diagram of the information processing system of the third embodiment. This figure shows the embodiment of an information processing system comprised of the information processing device CPU_CHIP2 and a memory module MEM2.

In the present embodiment, the information processing device CPU_CHIP2 is comprised of the information processing circuits CPU0, CPU1, CPU2, and CPU3, and the arbiter circuit CARB and memory control circuit DCMC2. The memory module MEM2 is comprised of the memory device M20, M21, and M22.

The clock method utilized to operate the information processing device CPU_CHIP2 and the memory module MEM2 is the embedded clock method. The information processing device CPU_CHIP2, and the memory device M20, the memory device M21, and the memory device M22 are coupled by the bidirectional signals RqsMux0, RqsMux1 and the RqsMux2, and the request and response are sent by way of these signals.

The information processing device CPU_CHIP2 possesses the same functions as the information processing device CPU_CHIP1. The memory device M20 possesses the same functions as the memory device M10. The memory device M21 possesses the same functions as the memory device M11. The memory device M22 possesses the same functions as the memory device M22.

In addition to the effects rendered by the second embodiment, the present embodiment is capable of jointly using the requests and responses, and deleting the number of signals to a minimum of one bit. The present embodiment is further capable of achieving an information system comprised of an information processing device CPU_CHIP2 and a memory module MEM2.

Fourth Embodiment

Figure 35:
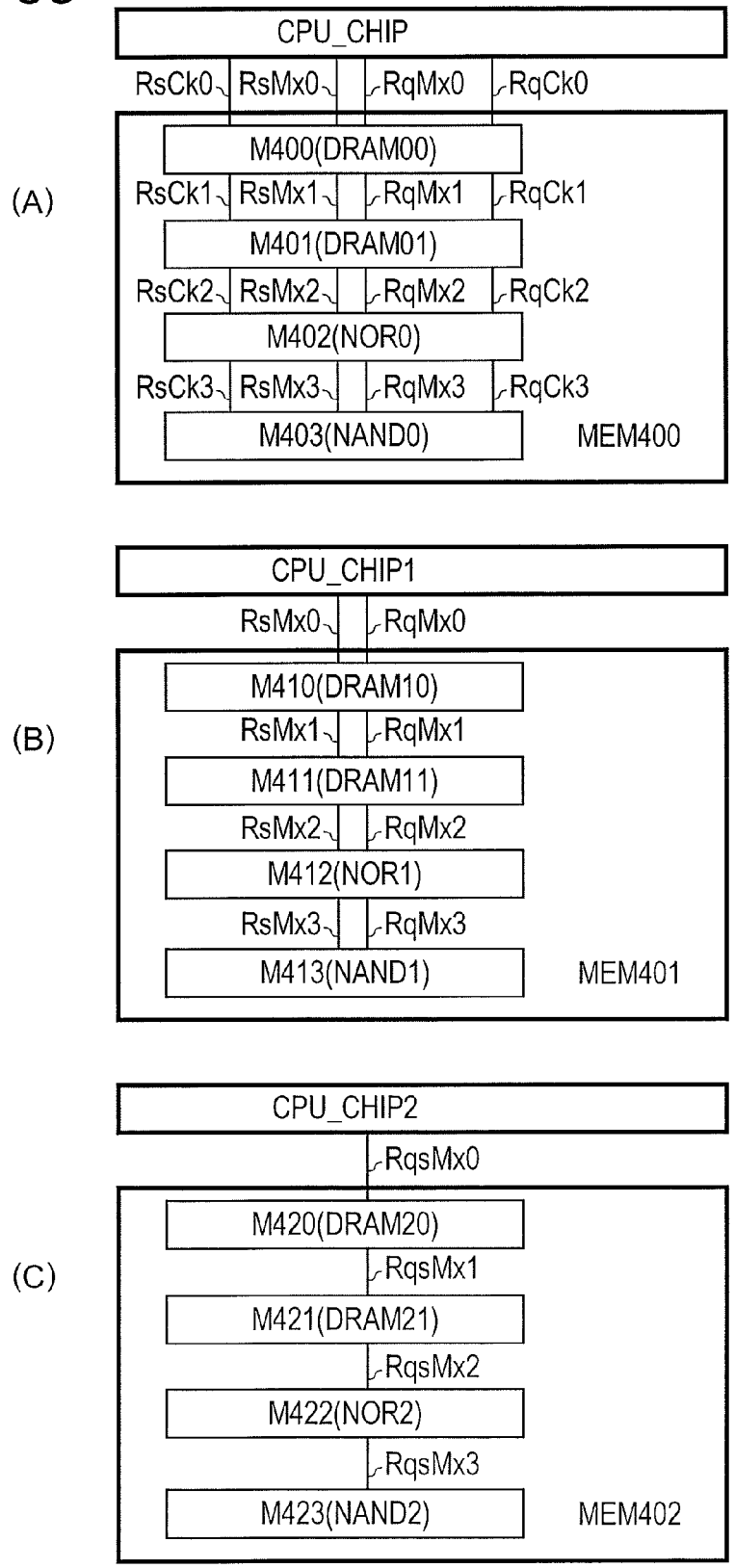
FIG. 35 is a structural diagram of the information processing system of the present invention.

FIG. 35 is a block diagram of the fourth embodiment of the present invention. FIG. 35A is a drawing showing the embodiment of the information processing system comprised of the information processing device CPU_CHIP and the memory module MEM400, and coupled by individual request signals and response signals and utilizing the source synchronous clock method. FIG. 35B is a drawing showing the embodiment of the information processing system comprised of the information processing device CPU_CHIP1 and the memory module MEM401, and coupled by individual request signals and response signals and utilizing the embedded clock method. FIG. 35C is a drawing showing the embodiment of the information processing system comprised of the information processing device CPU_CHIP2 and the memory module MEM402, and coupled by joint use of request and response signals and utilizing the embedded clock method.

The RqMux0, RqMux1, RqMux2 and RqMux3 are request signals. The RsMux0, RsMux1, RsMux2 and RsMux3 are response signals. The RqsMux0, RqsMux1, the RqsMux2 and the RqsMux3 are signals for joint request and response usage. The information processing device CPU_CHIP is the same as the information processing device CPU_CHIP shown in FIG. 1 and FIG. 2. The information processing device CPU_CHIP1 is the same as shown in FIG. 29 and FIG. 30. The information processing device CPU_CHIP2 is the same as shown in FIG. 34.

The memory module 400 is comprised from a dynamic random access memory DRAM00 and DRAM01, a NOR type flash memory NOR0 and a NAND type flash memory NAND0.

The memory module 401 is comprised from a dynamic random access memory DRAM10 and DRAM11, the NOR type flash memory NOR1 and the NAND type flash memory NAND1.

The memory module 402 is comprised from a dynamic random access memory DRAM20 and DRAM21, the NOR type flash memory NOR2 and the NAND type flash memory NAND2.

The dynamic random access memory DRAM00 and DRAM01, the NOR type flash memory NOR0 and the NAND type flash memory NAND0 are the same as the memories shown in FIG. 1.

The dynamic random access memory DRAM10 and DRAM11, the NOR type flash memory NOR1 and the NAND type flash memory NAND1 are the same as the memories shown in FIG. 29.

The dynamic random access memory DRAM20 and DRAM21, the NOR type flash memory NOR2 and the NAND type flash memory NAND2 are the same as the memories shown in FIG. 34.

In the present invention, a plurality of dynamic random access memory DRAM can be easily coupled to expand the available work area and copy area required by the information processing device CPU_CHIP. Utilizing the dynamic random access memory DRAM to expand the work area and the copy area, allows increasing the programs and data size stored in the dynamic random access memory DRAM, and data accessing of the dynamic random access memory DRAM nearest the information processing occurs more frequently to allow high speed processing.

The coupling of a plurality of dynamic random access memory DRAM was described in the present embodiment, however a plurality of NOR type flash memory NOR, or NAND type flash memory NAND can be coupled as needed, to allow easily expanding the program area or data area, and flexibly match the system structure of portable equipment.

Fifth Embodiment

Figure 36:
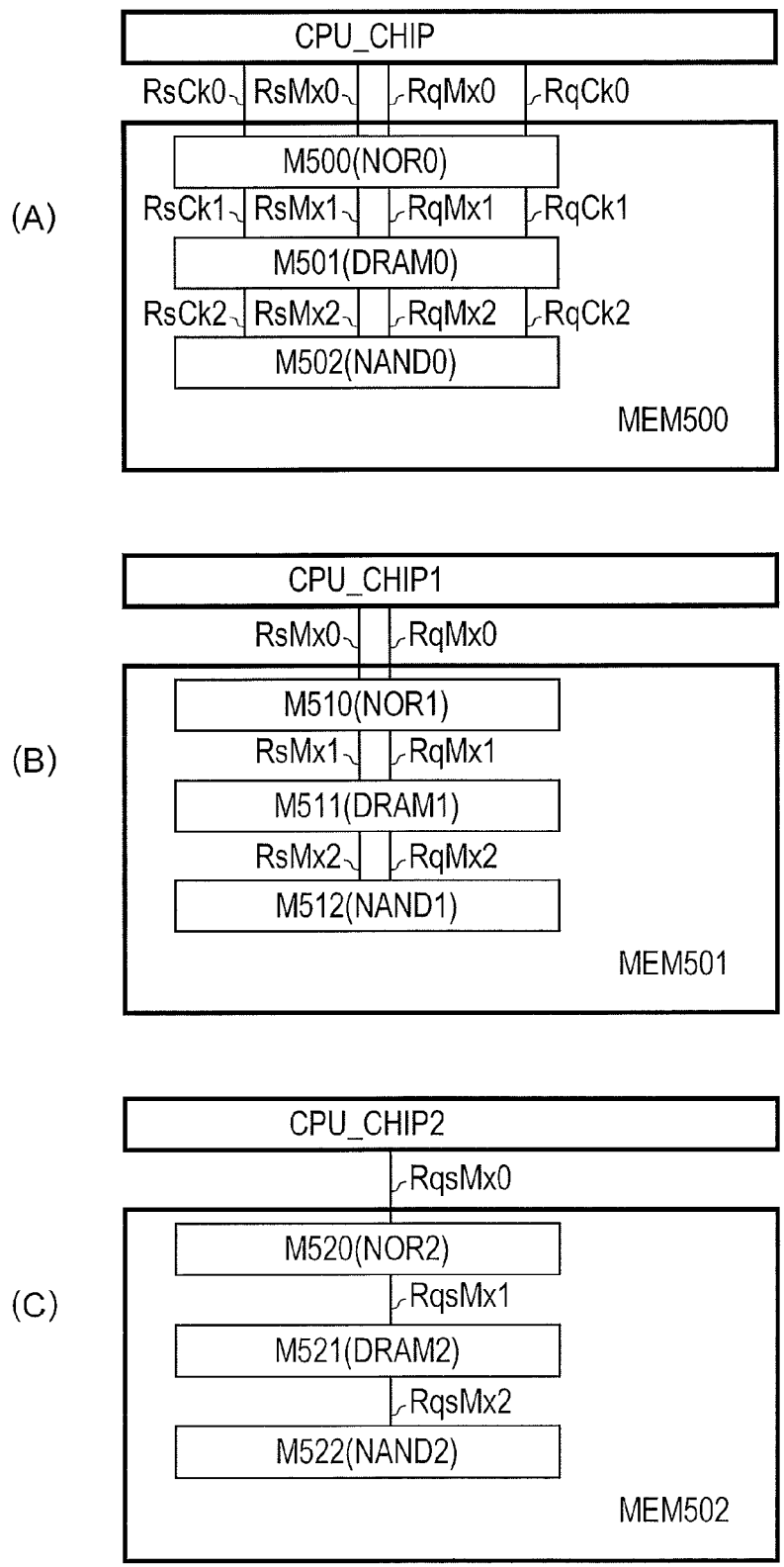
FIG. 36 is a structural diagram of the information processing system of the present invention.

FIG. 36 is a block diagram of the fifth embodiment of the present invention. FIG. 36A is a drawing showing the embodiment of the information processing system comprised of the information processing device CPU_CHIP and the memory module MEM500, and coupled by individual request signals and response signals and utilizing the source synchronous clock method. FIG. 36B is a drawing showing the embodiment of the information processing system comprised of the information processing device CPU_CHIP1 and the memory module MEM501, and coupled by individual request signals and response signals and utilizing the embedded clock method. FIG. 36C is a drawing showing the embodiment of the information processing system comprised of the information processing device CPU_CHIP2 and the memory module MEM502, and coupled by jointly used request and response signals and utilizing the embedded clock method.

The RqMux0, RqMux1, and RqMux2 are request signals. The RsMux0, RsMux1, and RsMux2 are response signals. The RqsMux0, RqsMux1, and the RqsMux2 are signals jointly used request and response usage.

The information processing device CPU_CHIP is the same as the information processing device CPU_CHIP shown in FIG. 1 and FIG. 2. The information processing device CPU_CHIP1 is the same as shown in FIG. 29 and FIG. 30. The information processing device CPU_CHIP2 is also the same as shown in FIG. 34.

The memory module MEM500 is comprised from a NOR type flash memory NOR0, a dynamic random access memory DRAM0 and a NAND type flash memory NAND0.

The memory module MEM501 is comprised from a NOR type flash memory NOR1, a dynamic random access memory DRAM1 and a NAND type flash memory NAND1.

The memory module MEM502 is comprised from a NOR type flash memory NOR2, a dynamic random access memory DRAM2 and a NAND type flash memory NAND2.

The dynamic random access memory DRAM0, the NOR type flash memory NOR0 and the NAND type flash memory NAND0 are the same as the memories shown in FIG. 1.

The dynamic random access memory DRAM1, the NOR type flash memory NOR1 and the NAND type flash memory NAND1 are the same as the memories shown in FIG. 29.

The dynamic random access memory DRAM2, the NOR type flash memory NOR2 and a NAND type flash memory NAND2 are the same as the memories shown in FIG. 34.

The memories within the memory modules MEM500, MEM501, and MEM02 are coupled in the order of proximity from the information processing device CPU_CHIP, CPU_CHIP1, and CPU_CHIP2; as the NOR type flash memory NOR using NOR type flash memory cells, the dynamic random access DRAM utilizing dynamic memory cells, and the NAND type flash memory utilizing NAND type flash memory cells. In cellular telephones, the time spent waiting for telephone calls and mail is dominated by intermittent accessing of the NOR type flash memory NOR that stores the OS and communication program, etc. Therefore, in the present embodiment where the NOR type flash memory NOR serving as the nonvolatile memory is coupled to the nearest information processing device CPU_CHIP, CPU_CHIP1, and CPU_CHIP2, and that sets the dynamic random access memory DRAM to the self-refresh state, just the NOR type flash memory NOR is operated, so that power consumption can be reduced when awaiting a telephone call or mail.

Sixth Embodiment

Figure 37:
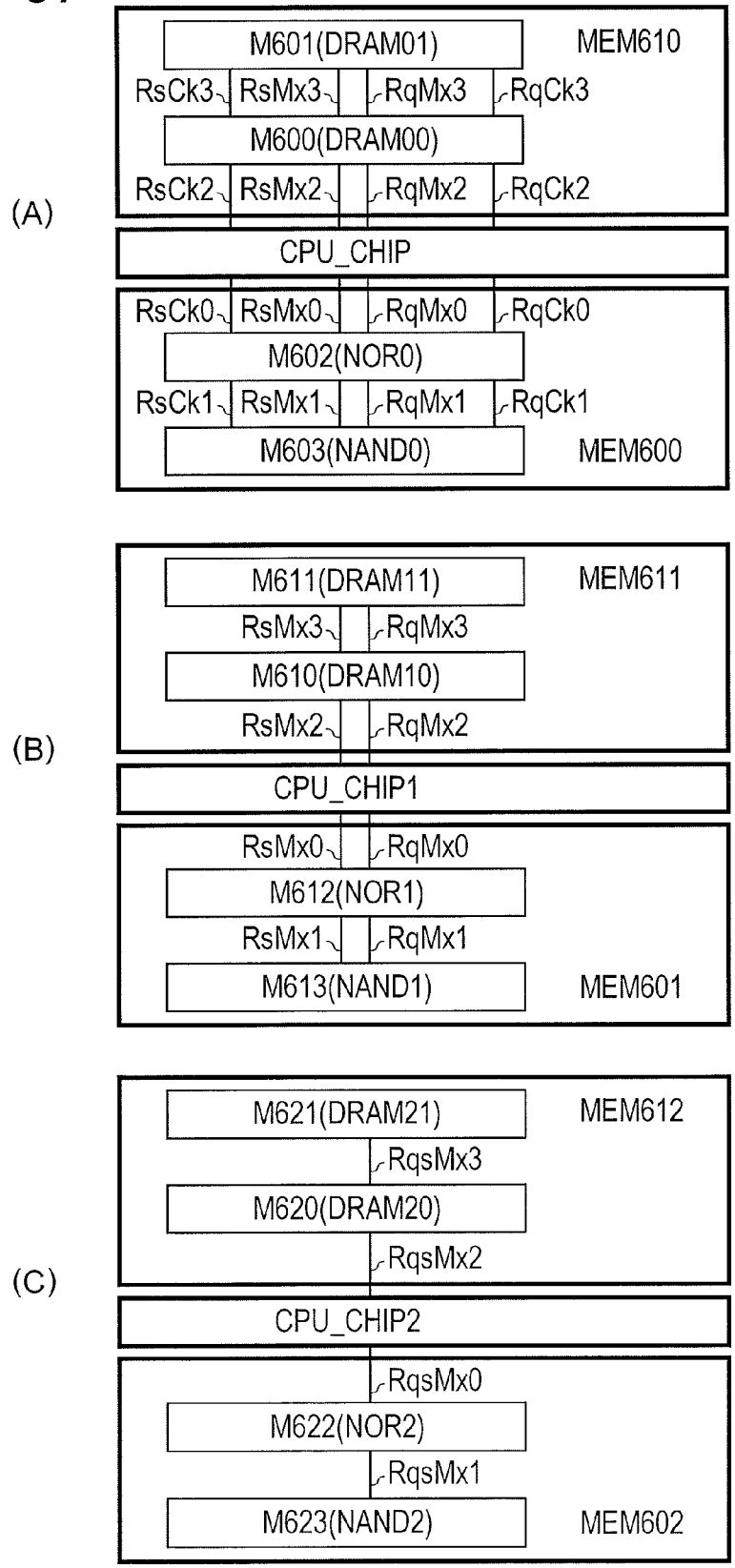
FIG. 37 is a structural diagram of the information processing system of the present invention.

FIG. 37 is a block diagram of the sixth embodiment of the present invention. FIG. 37A is a drawing showing the embodiment of the information processing system comprised of the information processing device CPU_CHIP and the memory modules MEM600 and MEM601, coupled by individual request signals and response signals, and utilizing the source synchronous clock method. FIG. 37B is a drawing showing the embodiment of the information processing system comprised of the information processing device CPU_CHIP1 and the memory modules MEM601 and MEM611, coupled by individual request signals and response signals, and utilizing the embedded clock method. FIG. 37C is a drawing showing the embodiment of the information processing system comprised of the information processing device CPU_CHIP2 and the memory modules MEM602 and MEM612, coupled by individual request and response signals, and utilizing the embedded clock method.

The RqMux0, RqMux1, RqMux2 and RqMux3 are request signals. The RsMux0, RsMux1, RsMux2 and RsMux3 are response signals. The RqsMux0, RqsMux1, the RqsMux2 and the RqsMux3 are signals jointly used for request and responses.

The information processing device CPU_CHIP is the same as the information processing device CPU_CHIP shown in FIG. 1 and FIG. 2. The information processing device CPU_CHIP1 is the same as shown in FIG. 29 and FIG. 30. The information processing device CPU_CHIP2 is also the same as shown in FIG. 34.

The memory module MEM600 is comprised from a NOR type flash memory NOR0, and a NAND type flash memory NAND0.

The memory module MEM610 is comprised from a dynamic random access memory DRAM00 and DRAM01.

The memory module MEM601 is comprised from a NOR type flash memory NOR1, and a NAND type flash memory NAND1.

The memory module MEM611 is comprised from a dynamic random access memory DRAM10 and a DRAM11.

The memory module MEM602 is comprised from a NOR type flash memory NOR2 and a NAND type flash memory NAND2.

The memory module MEM612 is comprised from a dynamic random access memory DRAM20 and DRAM21.

The dynamic random access memories DRAM00, and DRAM01, the NOR type flash memory NOR0 and the NAND type flash memory NAND0 are the same as the memories shown in FIG. 1.

The dynamic random access memories DRAM10, and DRAM11, the NOR type flash memory NOR1 and the NAND type flash memory NAND1 are the same as the memories shown in FIG. 29.

The dynamic random access memories DRAM20, and DRAM21, the NOR type flash memory NOR2 and the NAND type flash memory NAND2 are the same as the memories shown in FIG. 34.

In the present invention, the memory modules comprised of dynamic random access memories, and the memory modules comprised from nonvolatile memories are coupled to separate information processing devices. In cellular telephones, the time spent waiting for telephone calls and mail is dominated by intermittent accessing of the NOR type flash memory NOR that store the OS and communication program, etc. Therefore, in the present embodiment the NOR type flash memory NOR serving as the nonvolatile memory is coupled to the nearest information processing device CPU_CHIP, the dynamic random access memory is set to the self-refresh state, and further the request clocks RqCk2 and RqCk3, or the response clocks RsCk2, RsCk3 are stopped so that the embodiment can therefore operate just the NOR type flash memory NOR, to allow reducing the power consumption when awaiting a telephone call or mail.

Seventh Embodiment

Figure 38:
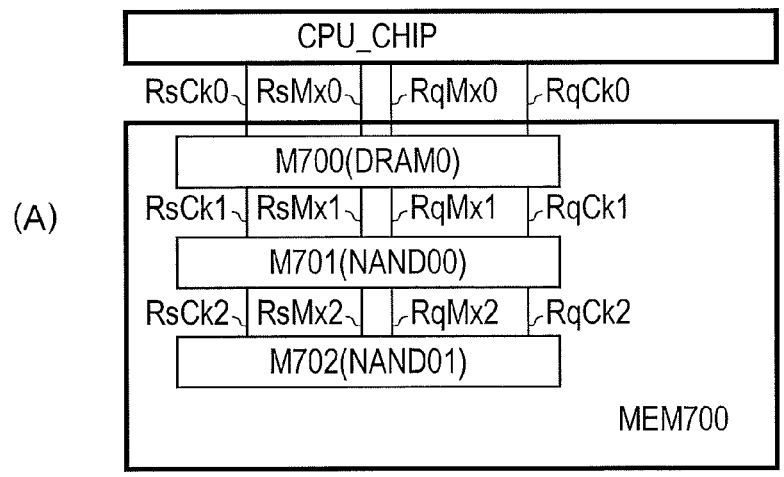
FIG. 38 is a structural diagram of the information processing system of the present invention.
Figure 38:
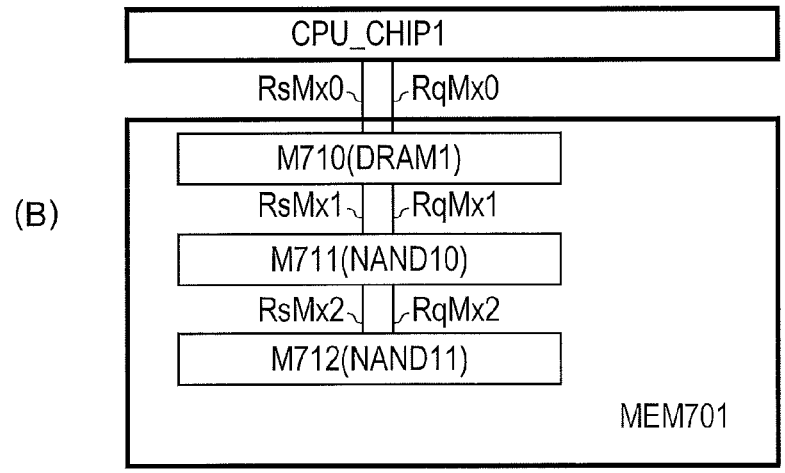
Figure 38:
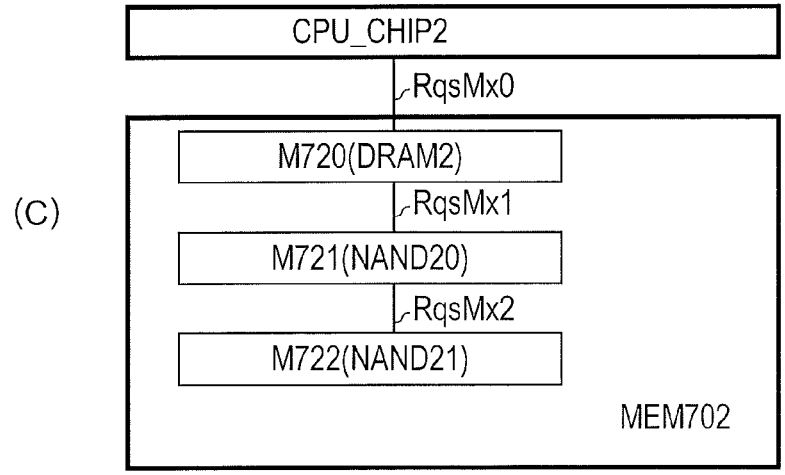

FIG. 38 is a block diagram of the seventh embodiment of the present invention. FIG. 38A is a drawing showing the embodiment of the information processing system comprised of the information processing device CPU_CHIP and the memory modules MEM700, coupled by individual request signals and response signals, and utilizing the source synchronous clock method. FIG. 38B is a drawing showing the embodiment of the information processing system comprised of the information processing device CPU_CHIP1 and the memory modules MEM701, coupled by individual request signals and response signals, and utilizing the embedded clock method. FIG. 38C is a drawing showing the embodiment of the information processing system comprised of the information processing device CPU_CHIP2 and the memory modules MEM702, coupled by jointly used request and response signals by the embedded clock method.

The RqMux0, RqMux1, and the RqMux2 are request signals. The RsMux0, RsMux1, and the RsMux2 are response signals. The RqsMux0, RqsMux1, and the RqsMux2 are signals jointly used for requests and responses.

The information processing device CPU_CHIP is the same as the information processing device CPU_CHIP shown in FIG. 1 and FIG. 2. The information processing device CPU_CHIP1 is the same as shown in FIG. 29 and FIG. 30. The information processing device CPU_CHIP2 is the same as the information processing device CPU_CHIP2 shown in FIG. 34.

The memory module MEM700 is comprised from a dynamic random access memory DRAM0, and the NAND type flash memories NAND00 and NAND01.

The memory module MEM701 is comprised from a dynamic random access memory DRAM1, and the NAND type flash memories NAND10 and NAND11.

The memory module MEM702 is comprised from a dynamic random access memory DRAM2, and the NAND type flash memories NAND20 and NAND21.

The dynamic random access memory DRAM0, and the NAND type flash memories NAND00 and the NAND01 are the same as the memories shown in FIG. 1.

The dynamic random access memory DRAM1, and the NAND type flash memories NAND10 and NAND11 are the same as the memories shown in FIG. 29.

The dynamic random access memory DRAM2, and the NAND type flash memories NAND20 and NAND21 are the same as the memories shown in FIG. 34.

NAND type flash memories are memories having a larger capacity than NOR type flash memories and that can also be made at a lower cost. Utilizing NAND type flash memories instead of NOR type flash memories, allows storing the OS and application programs in the NAND type flash memory NAND0, as well as achieving an information processing system possessing both a large capacity and a low cost. The OS and application program stored in the NAND type flash memory NAND0 can be transferred to the dynamic random access memory in advance so that a high performance information processing system is achieved.

Eighth Embodiment

Figure 39:
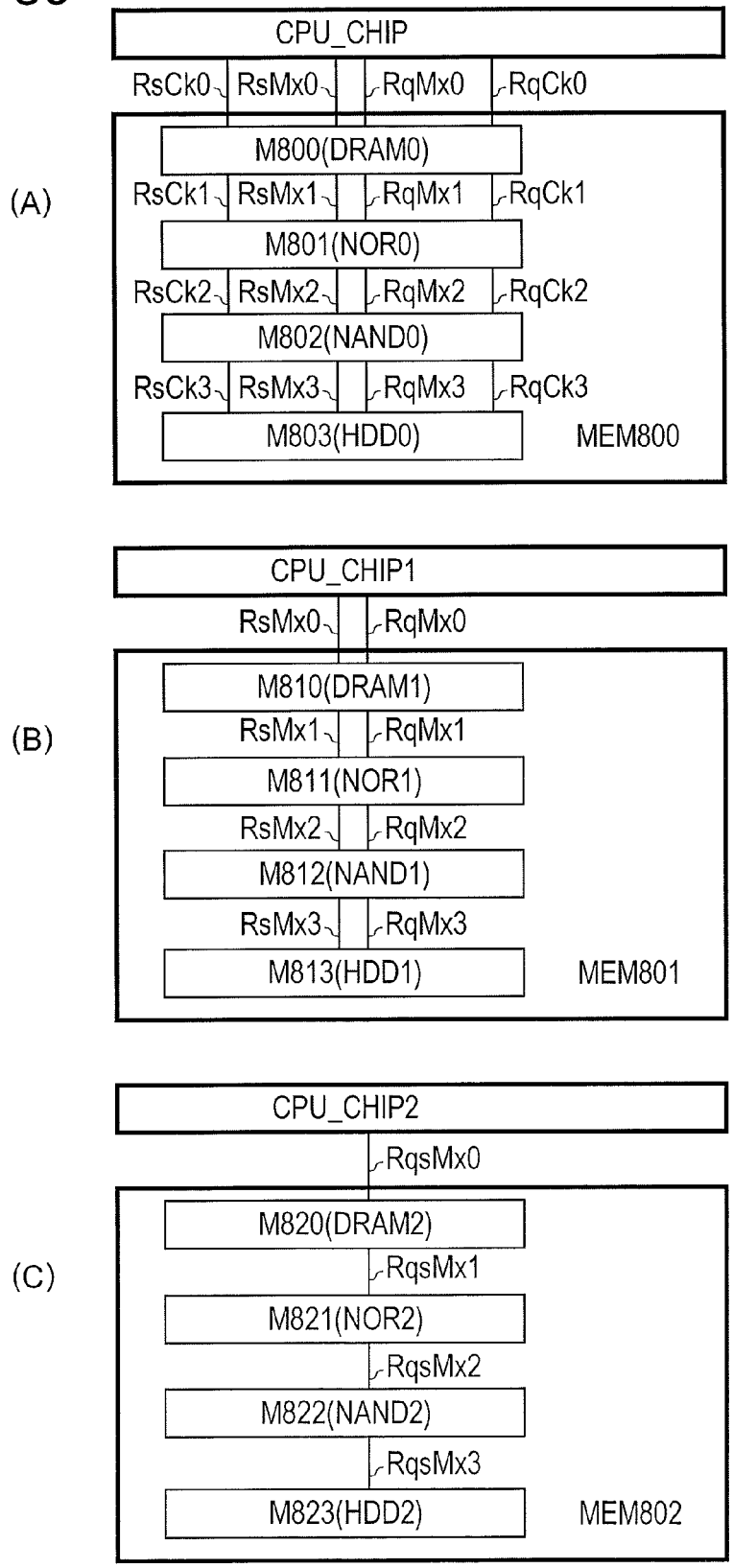
FIG. 39 is a structural diagram of the information processing system of the present invention.

FIG. 39 is a block diagram of the eighth embodiment of the present invention. FIG. 39A is a drawing showing the embodiment of the information processing system comprised of the information processing device CPU_CHIP and the memory module MEM800, coupled by individual request signals and response signals, and utilizing the source synchronous clock method. FIG. 39B is a drawing showing the embodiment of the information processing system comprised of the information processing device CPU_CHIP1 and the memory modules MEM801, coupled by individual request signals and response signals, and utilizing the embedded clock method. FIG. 39C is a drawing showing the embodiment of the information processing system comprised of the information processing device CPU_CHIP2 and the memory modules MEM802, coupled by jointly used request and response signals by the embedded clock method.

The RqMux0, RqMux1, RqMux2 and the RqMux3 are request signals. The RsMux0, RsMux1, RsMux2, and the RsMux3 are response signals. The RqsMux0, the RqsMux1, the RqsMux2, and the RqsMux3 are signals jointly used for requests and responses.

The information processing device CPU_CHIP is the same as the information processing device CPU_CHIP shown in FIG. 1 and FIG. 2. The information processing device CPU_CHIP1 is the same as the information processing device CPU_CHIP1 shown in FIG. 29 and FIG. 30. The information processing device CPU_CHIP2 is the same as the information processing device CPU_CHIP2 shown in FIG. 34.

The memory module MEM800 is comprised of the dynamic random access memory DRAM0, the NOR type flash memory NOR0, the NAND type flash memory NAND0 and the hard disk drive HDD0.

The memory module MEM801 is comprised of the dynamic random access memory DRAM1, the NOR type flash memory NOR1, the NAND type flash memory NAND1 and the hard disk drive HDD1.

The memory module MEM802 is comprised of the dynamic random access memory DRAM2, the NOR type flash memory NOR2, the NAND type flash memory NAND2, and the hard disk drive HDD1.

The dynamic random access memory DRAM0, NOR type flash memory NOR0, and NAND0 type flash memory NAND0 are identical to the memories shown in FIG. 1

The dynamic random access memory DRAM1, the NOR type flash memory NOR1, and the NAND type flash memory NAND1 are identical to the memories shown in FIG. 29.

The dynamic random access memory DRAM2, the NOR type flash memory NOR2, and the NAND type flash memory NAND2 are identical to the memories shown in FIG. 34.

The hard disk HDD is a memory possessing higher capacity than NAND type flash memory NAND and also a low cost. In regards to data readout units, address management methods, and error detection/correction methods, the flash memory was passed (inherited) along the data readout units, address management methods, and error detection/correction methods that were originally achieved by hard disk HDD and

Ninth Embodiment

Figure 40:
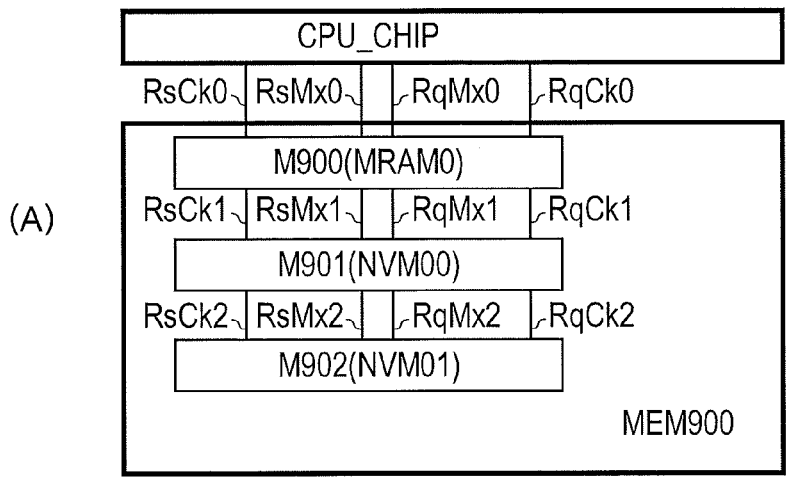
FIG. 40 is a structural diagram of the information processing system of the present invention.
Figure 40:
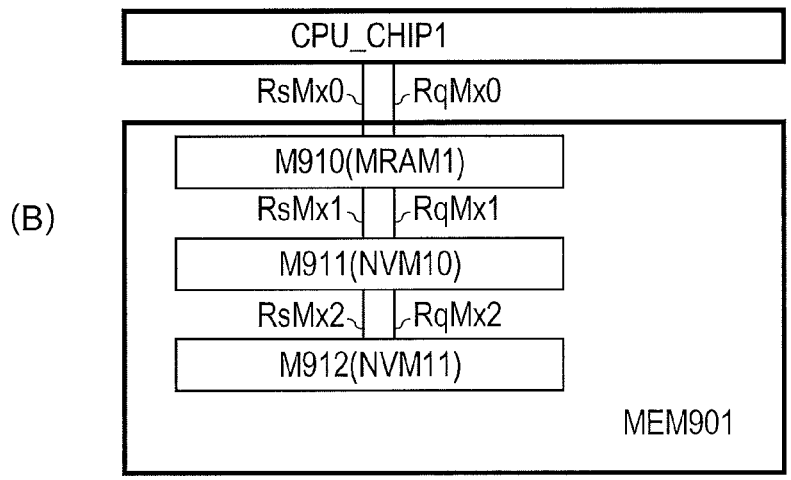
Figure 40:
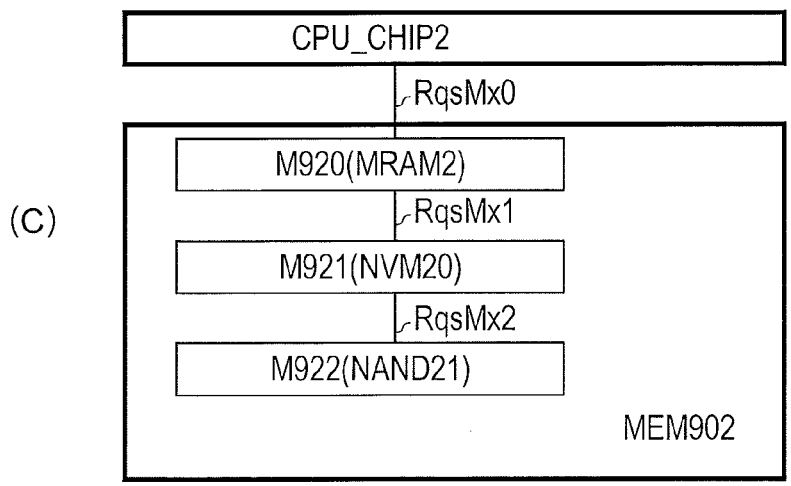

FIG. 40 is a block diagram of the ninth embodiment of the present invention. FIG. 40A is a drawing showing the embodiment of the information processing system comprised of the information processing device CPU_CHIP and the memory module MEM900, coupled by individual request signals and response signals, and utilizing the source synchronous clock method. FIG. 40B is a drawing showing the embodiment of the information processing system comprised of the information processing device CPU_CHIP1 and the memory modules MEM901, coupled by individual request signals and response signals, and utilizing the embedded clock method.

FIG. 40C is a drawing showing the embodiment of the information processing system comprised of the information processing device CPU_CHIP2 and the memory modules MEM902 coupled by jointly used request and response signals by the embedded clock method.

The RqMux0, RqMux1, and the RqMux2 are request signals. The RsMux0, RsMux1, and the RsMux2 are response signals. The RqsMux0, RqsMux1, and the RqsMux2 are signals jointly used for requests and responses.

The information processing device CPU_CHIP is the same as the information processing device CPU_CHIP shown in FIG. 1 and FIG. 2. The information processing device CPU_CHIP1 is the same as shown in FIG. 29 and FIG. 30. The information processing device CPU_CHIP2 is the same as the information processing device CPU_CHIP2 shown in FIG. 34.

The memory module MEM900 is comprised from a first nonvolatile memory MRAM0, a second nonvolatile memory NVM00, and a third nonvolatile memory NVM01.

The memory module MEM901 is comprised from a first nonvolatile memory MRAM1, a second nonvolatile memory NVM10, and a third nonvolatile memory NVM11.

The memory module MEM902 is comprised from a first nonvolatile memory MRAM2, a second nonvolatile memory NVM20, and a third nonvolatile memory NVM21.

The first nonvolatile memory MRAM0 may also be a magnetic random access memory MRAM where the memory circuit Mem0 of the memory device M0 is comprised of nonvolatile magnetic memory cells.

The second nonvolatile memory NVM00 may also include phase change memory PCM in which that the memory device M1 shown in FIG. 5 or the memory circuit Mem1 of the memory device M1 shown in FIG. 5 are comprised of nonvolatile phase change memory cells.

The memory device M2 shown in FIG. 7 can be utilized in the third nonvolatile memory NVM01.

The first nonvolatile memory MRAM1 may include magnetic random access memory MRAM in which the memory circuit Mem0 of the memory device M10 shown in FIG. 31 is comprised of nonvolatile magnetic memory cells.

The second nonvolatile memory NVM10 may also include a phase change memory PCM in which the memory device M11 shown in FIG. 32 or the memory circuit Mem1 of the memory device M11 shown in FIG. 32 are comprised of nonvolatile phase change memory cells.

The memory device M12 shown in FIG. 33 can be utilized in the third nonvolatile memory device M12.

The first nonvolatile memory MRAM2 may also be comprised of a memory device where the magnetic random access memory MRAM is substituted for the dynamic random access memory DRAM of the memory device M30 shown in FIG. 34.

In the second nonvolatile NVM20, the phase change memory PCM may be substituted for the NOR type flash memories of the memory device M31 shown in FIG. 34, or the memory device M31 shown in FIG. 34.

The memory device M32 shown in FIG. 34 can be utilized in third nonvolatile memory NVM21.

Utilizing a nonvolatile magnetic random access memory MRAM instead of the volatile dynamic random access memory DRAM, allows low-power operation since there is no need to periodically retain (refresh) the data within the memory circuit.

One feature of the phase change memory PCM is data writing is performed at higher speeds than the NOR type flash memory NOR. Utilizing a phase change memory PCM instead of the NOR type flash memory NOR attains a high performance information processing system.

Tenth Embodiment

Figure 41:
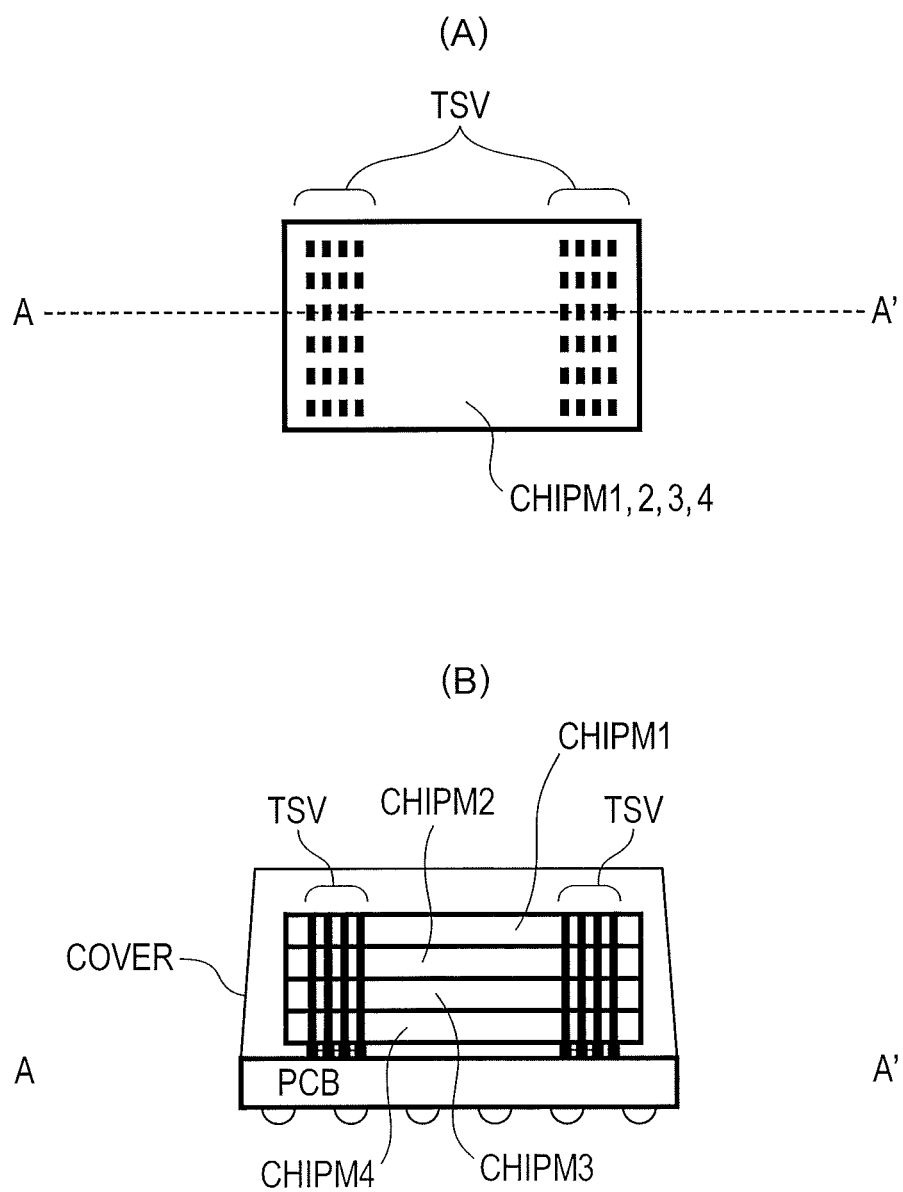
FIG. 41 is drawings showing one example of the mounted state of the memory information processing system of the present invention.

FIG. 41 is a block diagram of the tenth embodiment of the present invention. FIG. 41A is a drawing showing an upper view; and FIG. 41B is a drawing showing a cross section taken along lines A-A' shown in the upper view in FIG. 41A. In the memory module of the present embodiment, a CHIPM1, CHIPM2, CHIPM3, CHIPM4 are mounted over a substrate (a printed circuit board made for example from a glass epoxy substrate) by way of a BGA (ball grid array). Though there are no particular restrictions, the CHIPM1 and CHIPM2 are nonvolatile memories, and the CHIPI3 is a random access memory. The CHIPM4 is the information processing device CPU_CHIP. The CHIPM1, the CHIPM2, the CHIPM3 and the CHIPM4 are respectively coupled by TSV (Though-Silicon-Via) hole wiring made through each of the chips. The CHIPM1 and the substrate PCB are coupled by the TSV hole wiring; the CHIPM2 and the substrate PCB are coupled by the TSV hole wiring; the CHIPM3 and the substrate PCB are coupled by the TSV hole wiring; and the CHIPM4 and the substrate PCB are coupled by the TSV hole wiring; and also via the ball grid array (BGA).

The mounting method can be utilized in the information processing system shown in FIG. 1, the information processing system shown in FIG. 29, the information processing system shown in FIG. 34, the information processing system shown in FIG. 35, the information processing system shown in FIG. 36, the information processing system shown in FIG. 37, and the information processing system shown in FIG. 40 can be integrated into one sealed unit.

In the present embodiment, the bare chip can be laminated over the printed circuit board PCB, each chip can be wired by way of the chip hole wiring TSV, and no bonding wires are required, so that memory modules can be configured with a small mounting surface area. Moreover, utilizing the chip hole wiring TSV shortens the wiring length between the chips so that a multichip module can be attained that provides higher performance and higher reliability.

Eleventh Embodiment

Figure 42:
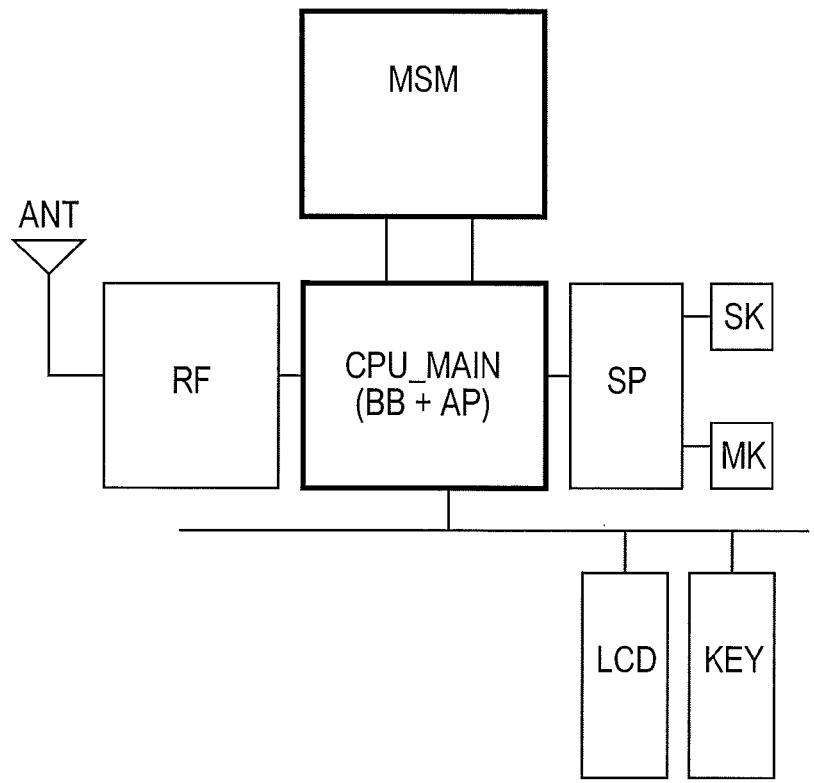
FIG. 42 is a block diagram showing a structural example of the cellular telephone utilizing the memory information processing system of the present invention.

FIG. 42 is a block diagram showing a structural example of the cellular telephone of the eleventh embodiment utilizing the memory information processing system of the present invention. The cellular telephone is comprised of an antenna ANT, a wireless (radio) block RF, an audio codec block SP, a speaker SK, a microphone MK, an information processing device CPU, a liquid crystal display section LCD, a keyboard KEY and a memory module MSM of the present invention. The information processing device CPU_MAIN contains a plurality of information processing circuits. One of these is the information processing circuit CPU0 that operates as a baseband processing circuit BB, and at least one other circuit is an information processing circuit CPU1 that operates as an application processor AP.

The operation during a telephone call is described next. The voice received by the antenna ANT is amplified by the wireless (radio) block RF and input to the information processing circuit CPU0. The information processing circuit CPU0 converts the voice analog signal to a digital signal, performs error correction and demodulating, and outputs this to the audio codec block SP. When the audio codec block converts the digital signal to an audio signal and outputs it to the speaker SK, the other party's voice can be heard from the speaker. The operation when performing the consecutive tasks of accessing a homepage on the Internet from the cellular telephone, downloading the music data, playing it and listening, and finally saving the downloaded music data is described.

The memory module MEM stores the OS, application programs (mail, Web browsers, music play programs, motion picture programs, and game programs, etc.), music data, still picture data, motion picture data, etc. When an entry made on the keyboard instructs the startup of a Web browser, the information processing circuit CPU1 reads out and executes the Web browser program stored in the NOR type flash memory within the memory module MSM, and displays the Web browser on the liquid crystal display LCD. Accessing the desired homepage and then commanding download of desired music data by a keyboard KEY instruction, causes the music data to be received by the antenna ANT, amplified by the wireless (radio) block RF, and input to the information processing circuit CPU0. In the information processing circuit CPU0 the music data as analog signal is converted to a digital signal, and error correction and demodulating performed. The music data that is now a digital signal is temporarily retained (buffered) within the dynamic random access memory DRAM inside the memory module MSM and is finally transferred to and stored in the NAND type flash memory within the memory module MEM.

Next, when entries from the keyboard KEY instruct the startup of the music play program, the music play program stored in the NOR type flash memory within the memory module MSM is read out and executed by the information processing circuit CPU1 and the music play program is displayed on the liquid crystal display LCD. When an instruction is made from the keyboard KEY to listen (play) the music data that was downloaded to the NAND type flash memory within the memory module, the information processing circuit CPU1 executes the music play program, processes the music data retained within the NAND type flash memory, and finally the music can be heard from the speaker SK. The NOR type flash memory within the memory module MSM of the present invention stores a plurality of programs such as the Web browser and music play program, or electronic mail program, etc. The information processing circuit CPU_MAIN possesses a plurality of information processing circuits from CPU0 to CPU3 and so can execute a plurality of programs at the same time. The information processing device CPU_MAIN can drastically reduce power consumption by operating the blocks within the memory module MSM at the minimum required frequency while awaiting telephone calls or electronic mail.

Utilizing the memory module of the present invention in this way, allows storing a vast quantity of mail, playing music, an executing the application program or music data, still image data, and motion picture data and so on, and moreover allows simultaneously executing a plurality of programs.

Twelfth Embodiment

Figure 43:
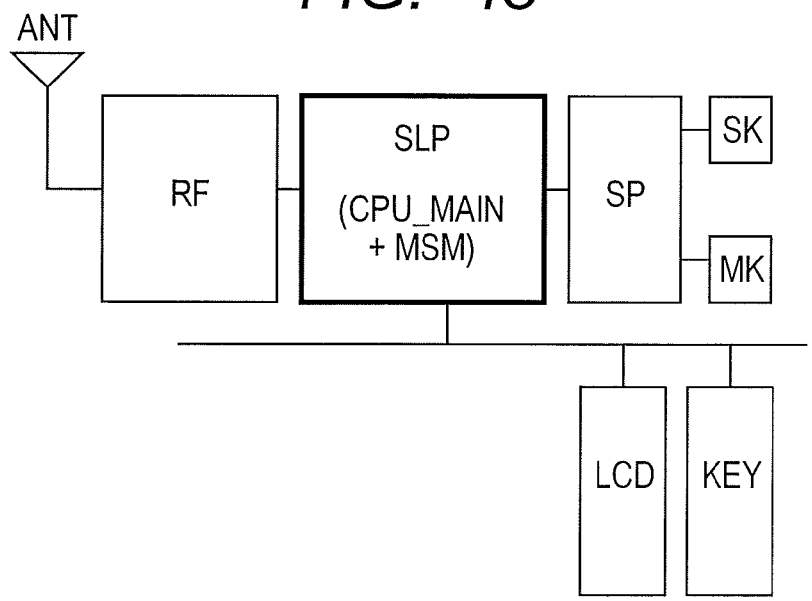
FIG. 43 is a block diagram showing a structural example of the cellular telephone utilizing the memory information processing system of the present invention.

FIG. 43 is a block diagram showing a structural example of the twelfth embodiment of the cellular telephone utilizing the memory system of the present invention. The cellular telephone is comprised of an antenna ANT, a wireless (radio) block RF, an audio codec block SP, a speaker SK, a microphone MK, a liquid crystal display section LCD, a keyboard KEY, and a memory module MSM and an information processing device CPU_MAIN integrated into one sealed unit as the information processing system SLP.

Utilizing the information processing system SLP of the present invention reduces the number of parts and so the reliability of the cellular telephone is enhanced, a low cost achieved, and the cellular telephone made in a smaller size since the mounting area for parts comprising the cellular telephone is reduced.

Thirteenth Embodiment

Figure 44:
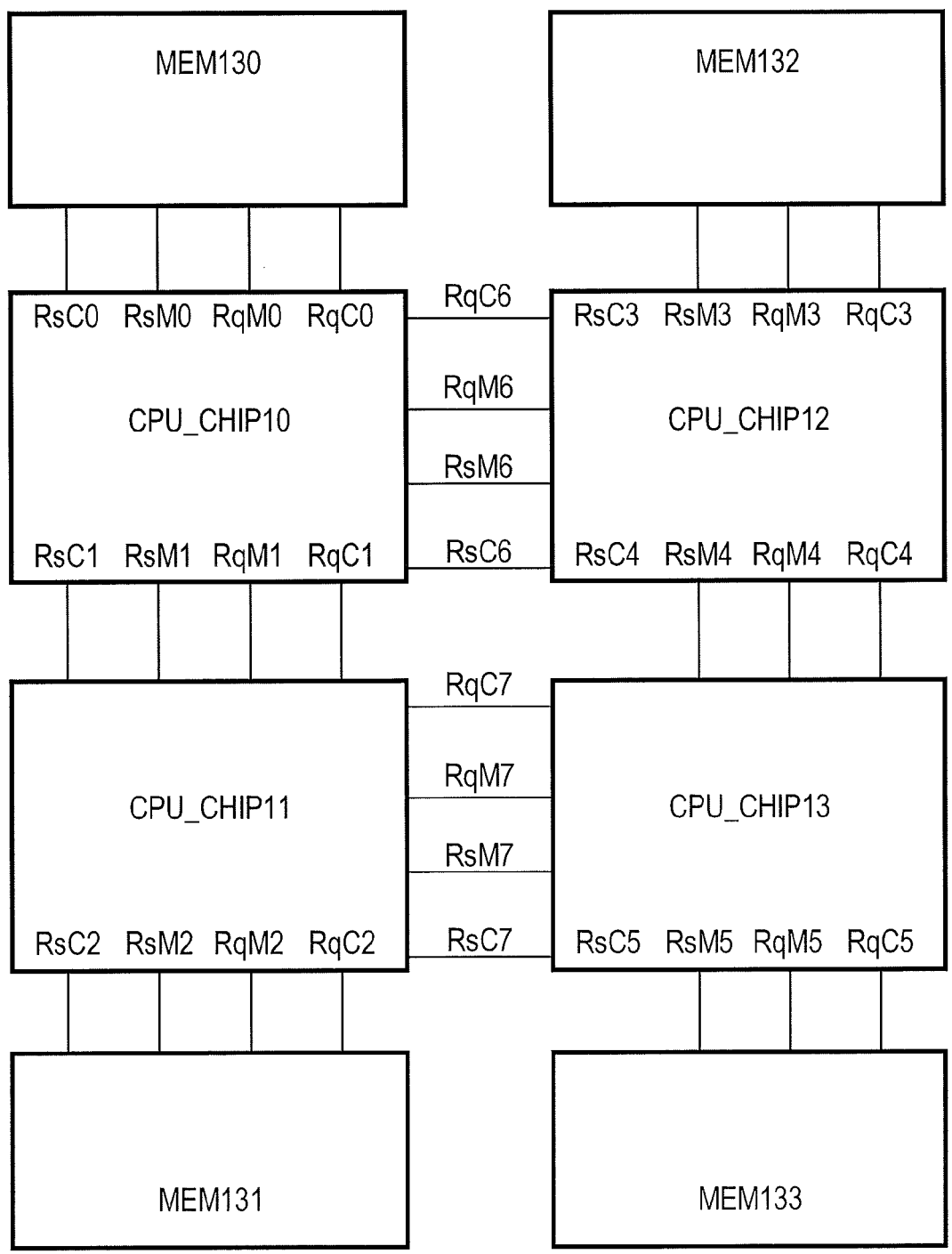
FIG. 44 is a structural diagram of the information processing system of the present invention.

FIG. 44 is a diagram showing the thirteenth embodiment of the present invention. The embodiment shows an information processing system comprised of the information processing devices CPU_CHIP10, CPU_CHIP11, CPU_CHIP12, and CPU_CHIP13, and the memory modules MEM130, MEM131, MEM132, and MEM133. The information processing devices CPU_CHIP10, CPU_CHIP11, CPU_CHIP12, and CPU_CHIP13 are identical to the information processing device CPU_CHIP shown in FIG. 1. The memory modules MEM130, MEM131, MEM132, and MEM133 are identical to the memory module MEM shown in FIG. 1. The RqC0 through the RqC7 are request clocks. The RsC0 through the RsC7 are response clocks. The RqM0 through RqM7 are request signals. The RsM0 through RsM1 are response signals. In the present embodiment, a plurality of information processing devices can be easily coupled so that high-speed performance can be attained. Moreover, information processing devices and memory modules can easily be coupled to allow flexibly matching the structure of the portable equipment system or the required performance.

Fourteenth Embodiment

Figure 45:
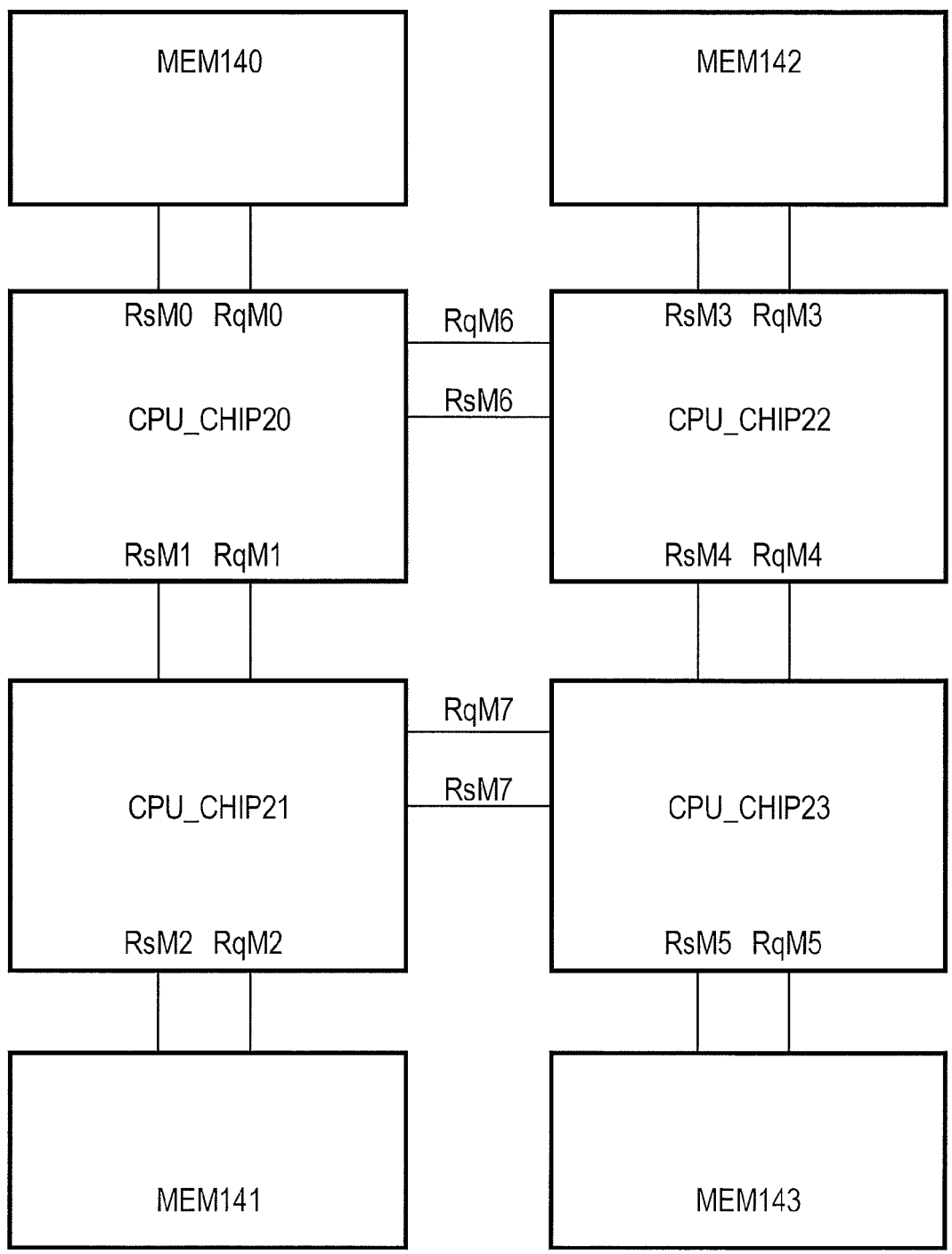
FIG. 45 is a structural diagram of the information processing system of the present invention.

FIG. 45 is a diagram showing the fourteenth embodiment of the present invention. The embodiment shows an information processing system comprised of the information processing devices CPU_CHIP20, CPU_CHIP21, CPU_CHIP22, and CPU_CHIP23, and the memory modules MEM140, MEM141, MEM142, and the MEM143. The information processing devices CPU_CHIP20, CPU_CHIP21, CPU_CHIP22 and the CPU_CHIP23 are identical to the information processing device CPU_CHIP1 shown in FIG. 29. The memory modules MEM140, MEM141, MEM142, and the MEM143 are identical to the memory module MEM1 shown in FIG. 29. The RqM0 through RqM7 are request signals. The RsM0 through RsM1 are response signals. The reference clock is not shown in the drawings. In the present embodiment, a plurality of information processing devices can be easily coupled so that high-speed performance can be attained. Moreover, information processing devices and memory modules can easily be coupled to allow flexibly matching the structure of the portable equipment system or the required performance.

Fifteenth Embodiment

Figure 46:
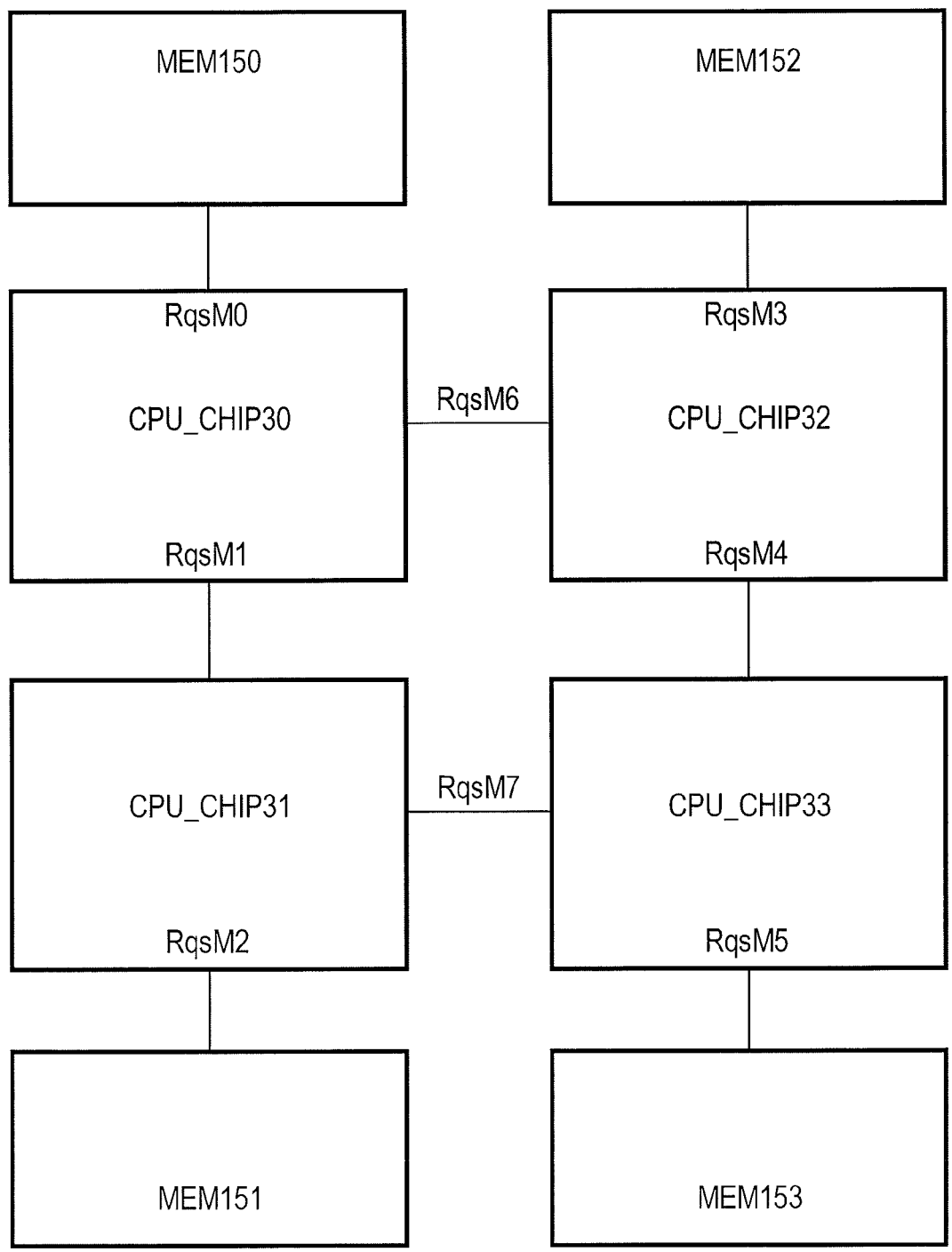
FIG. 46 is a structural diagram of the information processing system of the present invention.

FIG. 46 is a diagram showing the fifteenth embodiment of the present invention. The embodiment shows an information processing system comprised of the information processing devices CPU_CHIP30, CPU_CHIP31, CPU_CHIP32, and CPU_CHIP33, and the memory modules MEM150, MEM151, MEM152, and MEM153. The information processing devices CPU_CHIP30, CPU_CHIP31, CPU_CHIP32, and CPU_CHIP33 are identical to the information processing device CPU_CHIP3 shown in FIG. 34. The memory modules MEM150, MEM151, MEM152, and the MEM153 are identical to the memory module MEM3 shown in FIG. 34. The RqsM0 through RqsM7 are signals jointly used for requests and responses. The reference clock is not shown in the drawings. In the present invention, a plurality of information processing devices can easily be connected to achieve high-speed processing. Further, information processing devices and memory modules can easily be coupled to allow flexibly matching the structure of the portable equipment system or the required performance.

Sixteenth Embodiment

Figure 47:
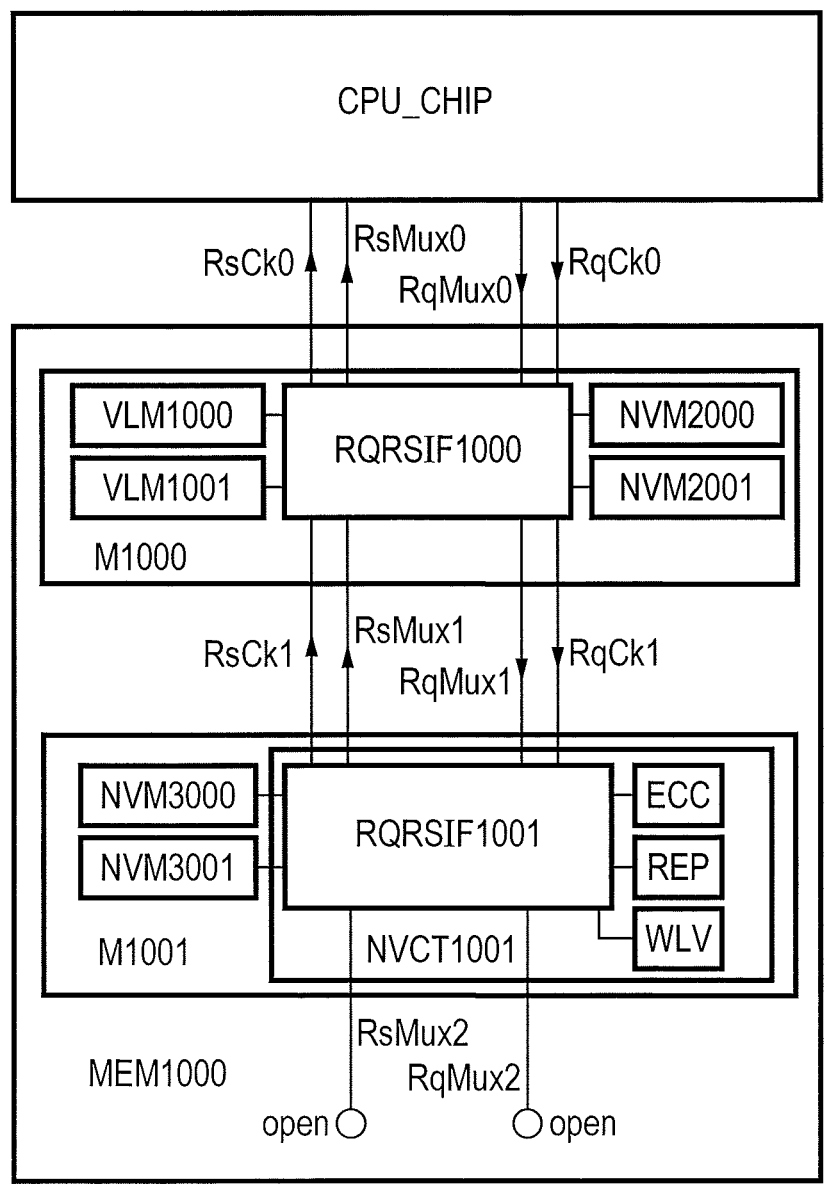
FIG. 47 is a structural diagram of the information processing system of the present invention.

FIG. 47 is a diagram showing the sixteenth embodiment of the present invention. The embodiment shows an information processing system comprised of the information processing device CPU_CHIP and the memory module MEM1000. The present embodiment shows one example of an information processing system utilizing the source synchronous clock method. The information processing device CPU_CHIP is identical to those shown in FIG. 1 and FIG. 2. The memory module MEM1000 is comprised of the memory device M1000, and the memory device M1001. The RqCk0 and RqCK1 are request clocks. The RsCk0, the RsCk1, and the RsCk2 are response clocks. The RqMux0 and the RqMux1 are request signals. The RsMux0 and the RsMux1 are response signals.

The memory device M1000 is comprised of the interface circuit chip RQRSIF1000, and a plurality of volatile memory chips VLM1000 and VLM1001, and a plurality of nonvolatile memory chips NVM1000 and NVM1001. Aside from the memory circuits Mem0 and Mem1 in the memory device described in FIG. 4 and FIG. 5, the interface circuit chip RQRSIF1000 is equipped with functions equivalent to all the other circuits.

A general-purpose dynamic random access memory chip DRAM or memory chip possessing functions equivalent to the memory circuit Mem0 can be utilized within the volatile memory chips VLM1000 and VLM1001. The plurality of nonvolatile memory chips NVM1000 and NVM1001 may also utilize general-purpose nonvolatile memory chips such as NOR type flash memory chips or phase change memory chips or memory chips possessing functions equivalent to the memory circuit Mem1 within the memory device described in FIG. 5.

The latency of the volatile memory chips VLM1000 and VLM1001 is different from the latency of the nonvolatile memory chips NVM1000 and NVM1001.

The memory device M1001 is comprised of a controller circuit chip NVCT1001, and a plurality of nonvolatile memory chips NVM3000 and NVM3001. The controller circuit chip NVCT1001 is comprised of the interface circuit RQRSIF1001 and the error correction circuit ECC and the substitute processing circuit REP, and the write count equalizing circuit WLV.

The interface circuit RQRSIF1001 is equipped with the same functions as all other circuits except for the memory circuit Mem2 within the memory devices described in FIG. 7. The nonvolatile memory chips NVM3000 and NVM3001 can also utilize general-purpose nonvolatile memory chips such as NAND type flash memories or memory chips possessing functions equivalent to the memory circuit Mem2 within the memory device described in FIG. 7.

A drop in reliability due to repetitive writing, the written data from the writing process being different from the data during readout, or data that was not written during update seldom occur in the nonvolatile memory chips NVM3000 and NVM3001. The error correction circuit ECC checks for errors within the data that the interface circuit RQRSIF1001 read out from the nonvolatile memory chips NVM3000 and NVM3001, and corrects errors if found. This error-corrected data is sent from the response signal RsMux1 by way of the interface circuit RQRSIF1001. The error correction circuit ECC in this way enhances the reliability of the memory device M1001.

The substitute processing circuit REP checks if the interface circuit RQRSIF1001 is writing data correctly into the nonvolatile memory chips NVM3000 and NVM3001. If the data writing is not being performed correctly, then it writes the data into a new substitute address prepared in advance in a nonvolatile memory NAND. The substitute processing circuit REP in this way enhances the reliability of the memory device M1001.

The write count equalizing circuit WLV equalizes (levels) the number of writes during writing of data from the interface circuit RQRSIF1001 onto the nonvolatile memory chips NVM3000 and NVM3001 to prevent concentrating the number of data writes (write count) in addresses in one section of the nonvolatile memory NAND. The write count equalizing circuit WLV in this way extends the product service life of the memory device M1001.

The information processing device CPU_CHIP assigns the device identification number ID value 1 to the volatile memory chips VLM1000 and VLM1001; assigns the device identification number ID value 2 to the nonvolatile memory chips NVM1000 and NVM1001; and assigns the device identification number ID value 3 to the memory device M1001.

In other words, when a request containing a device identification number ID value 1 from the request signal RqMux0 was input to the memory device M1000, then the memory device M1000 recognizes this as a request to the volatile memory chip VLM1000 and VLM1001, and executes that request. Also, when a request including a device identification number value 2 was input from the request signal RqMux0 to the memory device M1000, then the memory device M1000 recognizes this as a request to the nonvolatile memory chips NVM2000 and NV23001, executes that request, and sends a response corresponding to that request from the response signal RsMux0 to the information processing device CPU_CHIP.

When the request signal RqMux0 has input a request including a device identification number value 3 to the memory device M1000, the device identification number value 3 in the request does not match the identification number ID values 1 and 2 within the memory device M1000 itself, so the memory device M1000 sends a request including the device identification number value 3 from the request signal RqMux1 to the memory device M1001.

When the request signal RqMux1 has input a request including a device identification number value 3 to the memory device M1001, the memory device 1001 recognizes that as a request to itself and executes that request, and sends a response to that request from the response signal RsMux1 to the memory device M1000, and further sends it by way of the response signal RsMux0 to the information processing device CPU_CHIP.

In addition to the effects rendered by the first embodiment, the present invention utilizes a plurality of general-purpose memories that allow easily expanding the work area or copy area or program area or data area. Moreover, the present invention utilizes a plurality of memories having different latencies to easily contrive one memory device, and allow flexibly matching the system structure of the portable equipment.

Seventeenth Embodiment

Figure 48:
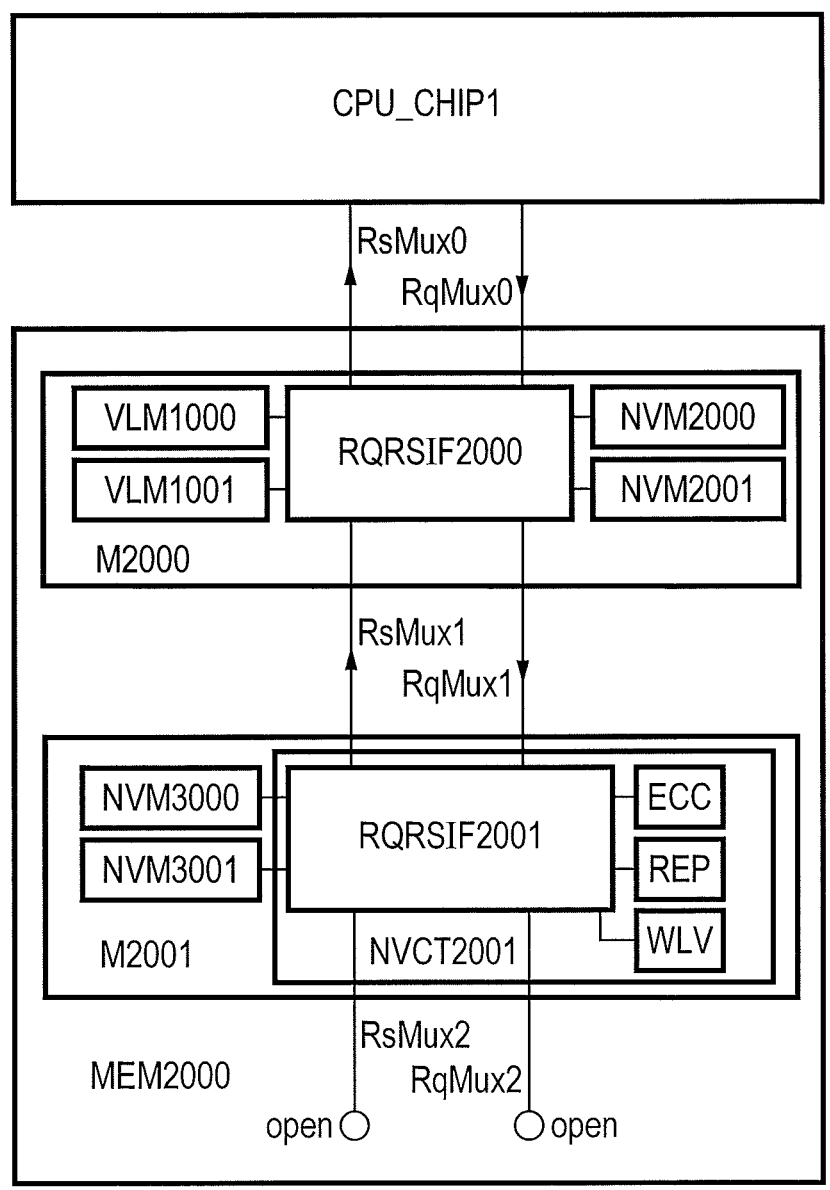
FIG. 48 is a structural diagram of the information processing system of the present invention.

FIG. 48 is a diagram showing the seventeenth embodiment of the present invention. The embodiment shows an information processing system comprised of the information processing device CPU_CHIP1 and the memory module MEM2000. The present embodiment shows one example of an information processing system utilizing the embedded clock method. The information processing device CPU_CHIP1 is equivalent to that shown in FIG. 29 and FIG. 30. The memory module MEM2000 is comprised of the memory device M2000, and the memory device M2001. The RRqMux0 and the RqMux1 are request signals. The RsMux0 and the RsMux1 are response signals.

The memory device M2000 is comprised of the interface circuit chip RQRSIF2000 and a plurality of volatile memory chips VLM1000 and VLM1001, a plurality of nonvolatile memory chips NVM1000 and NVM1001. Except for the memory circuits Mem0, Mem1 within the memory device described in FIG. 31 and FIG. 32, the interface circuit chip RQRSIF2000 possesses the same functions as all other circuits.

General-purpose dynamic random access memory chips DRAM and memory chips possessing the same functions as the memory circuit Mem0 within the memory devices described in FIG. 31 can be utilized in the volatile memory chips VLM1000 and VLM1001. Moreover, general-purpose nonvolatile memory chips such as phase change memory chips or NOR type flash memory chips or memory chips possessing the same functions as the memory circuit Mem1 within the memory devices described in FIG. 32 can be utilized in the plurality of nonvolatile memory chips NVM1000 and NVM1001.

The latency of the volatile memory chips VLM1000 and VLM1001 is different from the latency of the nonvolatile memory chips NVM1000 and NVM1001.

The memory device M2001 is comprised of a controller circuit chip NVCT2001 and a plurality of nonvolatile memory chips NVM3000 and NVM3001. The controller circuit chip NVCT2001 is comprised of an interface circuit RQRSIF2001 and an error correction circuit ECC, a substitute processing circuit REP, and a write count equalizing circuit WLV.

The interface circuit RQRSIF2001 is equipped with the same functions as all other circuits except for the memory circuit Mem2 within the memory device described in FIG. 33. The nonvolatile memory chips NVM3000 and NVM3001 may also utilize general-purpose nonvolatile memory chips such as NAND type flash memories or memory chips possessing functions equivalent to the memory circuit Mem2 within the memory device described in FIG. 33.

A drop in reliability due to repetitive writing, the written data from the writing process being different from the data during readout, or data that was not written during update seldom occur in the nonvolatile memory chips NVM3000 and NVM3001. The error correction circuit ECC checks for errors within the data that the interface circuit RQRSIF2001 read out from the nonvolatile memory chips NVM3000 and NVM3001, and corrects errors if found. This error-corrected data is sent from the response signal RsMux1 by way of the interface circuit RQRSIF2001. The error correction circuit ECC in this way enhances the reliability of the memory device M1001.

The substitute processing circuit REP checks if the interface circuit RQRSIF2001 is writing data correctly into the nonvolatile memory chips NVM3000 and NVM3001. If the data writing is not being performed correctly, then it writes the data into a new substitute address prepared in advance in a nonvolatile memory NAND. The substitute processing circuit REP in this way enhances the reliability of the memory device M2001.

The write count equalizing circuit WLV equalizes (levels) the number of writes during writing of data from the interface circuit RQRSIF2001 onto the nonvolatile memory chips NVM3000 and NVM3001 to prevent concentrating the number of data writes (write count) into addresses for one section of the nonvolatile memory NAND. The write count equalizing circuit WLV in this way extends the product service life of the memory device M2001.

The information processing device CPU_CHIP1 assigns the device identification number ID value 1 to the volatile memory chips VLM1000 and VLM1001; assigns the device identification number ID value 2 to the nonvolatile memory chips NVM1000 and NVM1001; and assigns the device identification number ID value 3 to the memory device M2001.

In other words, when a request including device identification number ID value 1 from the request signal RqMux0 was input to the memory device M2000, then the memory device M1000 recognizes this as a request to the volatile memory chip VLM1000 and VLM1001, and executes that request. Also, when a request including a device identification number value 2 was input from the request signal RqMux0 to the memory device M2000, then the memory device M2000 recognizes that as a request to the nonvolatile memory chips NVM3000 and NV3001, executes that request, and sends a response corresponding to that request from the response signal RsMux0 to the information processing device CPU_CHIP1.

When the request signal RqMux0 has input a request including a device identification number value 3 to the memory device M2000, the device identification number ID values 1 and 2 within the memory device M2000 itself do not match the device identification number value 3 in the request, so the memory device M2000 sends a request including the device identification number value 3 from the request signal RqMux1 to the memory device M2001.

When the request signal RqMux1 has input a request including a device identification number value 3 to the memory device M2001, the memory device 1001 recognizes that as a request to itself and executes that request, and sends a response for that request from the response signal RsMux1 to the memory device M2000, and further sends it by way of the response signal RsMux0 to the information processing device CPU_CHIP1.

In addition to the effects rendered by the first and the second embodiment, the present invention utilizes a plurality of general-purpose memories that allow easily expanding the work area or copy area or program area or data area. Moreover, the present invention utilizes a plurality of memories having different latencies to easily contrive one memory device, and allow flexibly matching the system structure of the portable equipment.

Eighteenth Embodiment

Figure 49:
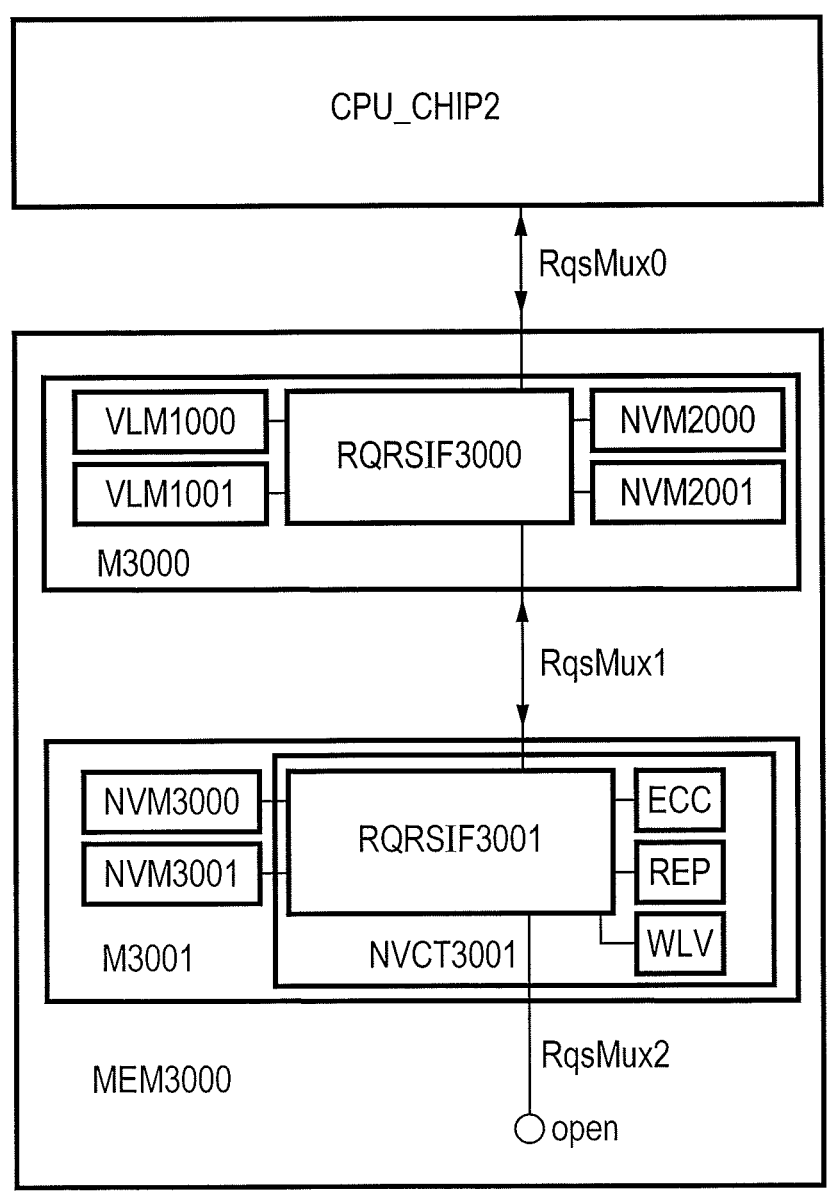
FIG. 49 is a structural diagram of the information processing system of the present invention.

FIG. 49 is a diagram showing the eighteenth embodiment of the present invention. The embodiment shows an information processing system comprised of the information processing device CPU_CHIP2 and the memory module MEM3000. The present embodiment shows one example of an information processing system utilizing the embedded clock method. The information processing device CPU_CHIP2 is equivalent that shown in FIG. 34. The memory module MEM3000 is comprised of the memory device M3000, and the memory device M3001. The RRqMux0 and the RqMux1 are request signals and the RsMux0 and the RsMux1 are response signals.

The information processing device CPU_CHIP2, and the memory device M3000, and the memory device M3001 are coupled by the bidirectional signals RqsMux0, RqsMux1 and the requests and responses are sent by way of these signals.

The memory device 3000 is comprised of the interface circuit chip RQRSIF3000 and a plurality of volatile memory chips VLM1000 and VLM1001, and a plurality of nonvolatile memory chips NVM1000 and NVM1001. Aside from the memory circuits Mem0 and Mem1 in the memory devices M20 and M21 described in FIG. 34 the interface circuit chip RQRSIF3000 is equipped with functions equivalent to all the other circuits.

A general-purpose dynamic random access memory chip DRAM or memory chip possessing functions equivalent to the memory circuit Mem0 within the memory device M20 described in FIG. 34 can be utilized within the volatile memory chips VLM1000 and VLM1001. The plurality of nonvolatile memory chips NVM1000 and NVM1001 may also utilize general-purpose nonvolatile memory chips such as NOR type flash memory chips or phase change memory chips or memory chips possessing functions that are equivalent to the memory circuit Mem1 within the memory device M21 described in FIG. 34.

The latency of the volatile memory chips VLM1000 and VLM1001 is different from the latency of the nonvolatile memory chips NVM1000 and NVM1001.

The memory device M3001 is comprised of a controller circuit chip NVCT3001, and a plurality of nonvolatile memory chips NVM3000 and NVM3001. The controller circuit chip NVCT3001 is comprised of the interface circuit RQRSIF3001, the error correction circuit ECC, the substitute processing circuit REP, and the write count equalizing circuit WLV.

The interface circuit chip RQRSIF3001 is equipped with the same functions as all other circuits except for the memory circuit Mem2 within the memory device M22 described in FIG. 34. The nonvolatile memory chips NVM3000 and NVM3001 can also utilize general-purpose nonvolatile memory chips such as NAND type flash memories or memory chips possessing functions equivalent to the memory circuit Mem2 within the memory device 22 described in FIG. 34.

A drop in reliability due to repetitive writing, the written data from the writing process being different from the data during readout, or data that was not written during update seldom occur in the nonvolatile memory chips NVM3000 and NVM3001. The error correction circuit ECC checks for errors within the data that the interface circuit RQRSIF3001 read out from the nonvolatile memory chips NVM3000 and NVM3001, and corrects errors if found. This error-corrected data is sent from the response signal RsMux1 by way of the interface circuit RQRSIF3001. The error correction circuit ECC in this way enhances the reliability of the memory device M3001.

The substitute processing circuit REP checks if the interface circuit RQRSIF3001 is writing data correctly into the nonvolatile memory chips NVM3000 and NVM3001. If the data writing is not being performed correctly, then it writes the data into a new substitute address prepared in advance in a nonvolatile memory NAND. The substitute processing circuit REP in this way enhances the reliability of the memory device M3001.

The write count equalizing circuit WLV equalizes (levels) the number of writes during writing of data from the interface circuit RQRSIF3001 onto the nonvolatile memory chips NVM3000 and NVM3001 to prevent concentrating the number of data writes (write count) into addresses for one section of the nonvolatile memory NAND. The write count equalizing circuit WLV in this way extends the product service life of the memory device 3001.

The information processing device CPU_CHIP2 assigns the device identification number ID value 1 to the volatile memory chips VLM1000 and VLM1001; assigns the device identification number ID value 2 to the nonvolatile memory chips NVM1000 and NVM1001; and assigns the device identification number ID value 3 to the memory device M3001.

In other words, when a request containing a device identification number ID value 1 from the bidirectional signal RqsMux0 was input to the memory device M3000, then the memory device M3000 recognizes this as a request to the volatile memory chips VLM1000 and VLM1001, and executes that request. Also, when a request including a device identification number value 2 was input from the request signal RqMux0 to the memory device M3000, then the memory device M3000 recognizes that as a request to the nonvolatile memory chips NVM3000 and NVM3001, executes that request, and sends a response corresponding to that request, from the bidirectional signal RqsMux0 to the information processing device CPU_CHIP2.

When the bidirectional signal RqsMux0 has input a request including a device identification number value 3 to the memory device M3000, the device identification number value 3 in the request does not match the identification number ID values 1 and 2 retained within the memory device M3000 itself, so the memory device M3000 sends a request including the device identification number value 3 from the bidirectional signal RqsMux1 to the memory device M3001.

When the bidirectional signal RqsMux1 has input a request including a device identification number value 3 to the memory device M3001, the memory device M3001 recognizes that as a request to itself and executes that request, and sends a response for that request from the bidirectional signal RqsMux1 to the memory device M3000, and further sends it by way of the bidirectional signal RqsMux0 to the information processing device CPU_CHIP2.

In addition to the effects rendered by the first, the second, and the third embodiments, the present invention utilizes a plurality of general-purpose memories that allow easily expanding the work area or copy area or program area or data area. Moreover, the present invention utilizes a plurality of memories having different latencies to easily contrive one memory device, and allow flexibly matching the system structure of the portable equipment.

INDUSTRIAL APPLICABILITY

The present invention relates to technology for semiconductor devices and is particularly effective in information processing systems including information processing devices and nonvolatile memories and in memory module control methods.

The invention claimed is:

1. A semiconductor device comprising:
   a request transmitter circuit to issue a read access request to an external section and to also manage a response time zone containing a response to the read access request; and
   a response receiver circuit to accept a response from an external section to the access request issued from the request transmitter circuit,
   wherein, when issuing a second read access request after issuing a first read access request, the request transmitter circuit issues the second read access request if a time width overlap in a time zone for a first response to the first read access request and a time zone for a second response to the second read access request are within a preset maximum allowable overlap time width.

2. The semiconductor device according to claim 1, comprising:
   a latency control register containing a maximum allowable overlap time width setting.

3. The semiconductor device according to claim 1,
   wherein the request transmitter circuit delays issuing the second access request when the time width that the first response time zone and the second response time zone overlap is larger than the maximum allowable overlap time width.

4. The semiconductor device according to claim 1,
   wherein the request transmitter circuit contains a decrementing first counter set with a start time for the response time zone, and a decrementing second counter set with an end time for the response time zone; and when the second read access request is issued, calculates the start time and end time of the second response time zone, and judges if the time zones overlap by comparing the first and second counter values with the start time and end time of the second response time zone.

5. The semiconductor device according to claim 4,
   wherein the request transmitter circuit does not output the second read access request when the start time of the second response time zone is between the first counter value and the second counter value.

6. The semiconductor device according to claim 4,
   wherein the request transmitter circuit updates the first counter value and the second counter value based on the time width that the first response time zone and the second response time zone overlap, when outputting the second read access request within the maximum allowable overlap time width regardless of whether the first response time zone and the second response time zone overlap.

7. The semiconductor device according to claim 1, further comprising:
   a latency register set with the minimum start time for a response to the read access request,
   wherein the request transmitter circuit calculates the start time of the first response time zone based on the minimum start time.

8. The semiconductor device according to claim 7,
   wherein the first and second read access requests each contains the requested data quantity, and wherein the request transmitter circuit calculates the respective end times for the first and second response time zones based on the request data quantity.

9. The semiconductor device according to claim 7,
   wherein, when the maximum allowable overlap time width was set to 0, the request transmitter circuit issues the read access request so as to maintain the minimum start time that was set in the latency register.

10. The semiconductor device according to claim 1,
    wherein the read access request is made to a memory module coupled to an external section, and
    wherein the memory module contains a serially connected first and second memory devices, and transfers a reply of the second memory device made by way of the first memory device, to the semiconductor device.

11. A semiconductor device serially coupled to the first and second memory devices of a memory module, that issues a request to the memory module, and receives a response from the memory module to the request, the semiconductor device comprising:
    a request transmitter circuit to output a request to the memory module;
    a response receiver circuit to receive the response to the request from the memory module;
    a latency register that is set with a first latency for a request to the first memory device, and a second latency for a request to the second memory device; and
    a latency control register that is preset with the maximum allowable overlap time width to allow issue of a second request when the first response time zone for the first request and the second response time zone for the second request issued after the first request, have the preset maximum allowable overlap time width.

12. The semiconductor device according to claim 11,
    wherein the request transmitter circuit contains a variable latency mode for comparing the overlap time width of the first response time zone and the second response time zone with the maximum allowable overlap time width when the second request is issued, and issuing the second request if the overlap time width is smaller.

13. The semiconductor device according to claim 12, comprising:
    a fixed latency mode to maintain the first latency without issuing the second request, when the first response time zone and the second response time zone have overlapping time widths.

14. The semiconductor device according to claim 13,
    wherein the semiconductor device activates the fixed latency mode by setting the maximum allowable overlap response time width to 0, and activates the variable latency mode by setting the maximum allowable overlap response time width to a positive integer.

15. The semiconductor device according to claim 11, wherein
    the latency control register contains a latency control flag, and
    when issuing the second request and the latency control flag is set, the semiconductor device sets a latency control mode to issue a second request taking the first response time zone and the second response time zone in account; and when the latency control flag is not set, the semiconductor device sets a latency non-controlled mode that issues the second request without considering the first response time zone.

* * * * *